United States Patent
Park

(10) Patent No.: US 9,064,731 B2
(45) Date of Patent: Jun. 23, 2015

(54) SEMICONDUCTOR DEVICE HAVING LANDING PADS

(71) Applicant: Samsung Electronics Co., Ltd., Suwon-si, Gyeonggi-do (KR)

(72) Inventor: Je-Min Park, Suwon-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/255,365

(22) Filed: Apr. 17, 2014

(65) Prior Publication Data

US 2014/0327063 A1    Nov. 6, 2014

(30) Foreign Application Priority Data

May 6, 2013 (KR) .................. 10-2013-0050808

(51) Int. Cl.
*H01L 27/108* (2006.01)
*H01L 21/768* (2006.01)

(52) U.S. Cl.
CPC .... *H01L 27/10855* (2013.01); *H01L 27/10888* (2013.01); *H01L 21/76897* (2013.01); *H01L 27/10814* (2013.01)

(58) Field of Classification Search
CPC .......... H01L 27/10855; H01L 27/10888; H01L 21/76897; H01L 27/10814
See application file for complete search history.

(56) References Cited

U.S. PATENT DOCUMENTS

| 5,622,883 | A | 4/1997 | Kim |
| 8,247,324 | B2 | 8/2012 | Shin et al. |
| 2011/0147889 | A1 | 6/2011 | Tsuchiya |
| 2012/0132971 | A1 | 5/2012 | Mikasa |
| 2012/0248519 | A1 | 10/2012 | Shinhara |
| 2012/0273859 | A1 | 11/2012 | Oyu et al. |

FOREIGN PATENT DOCUMENTS

| KR | 10-2012-0012222 A | 2/2012 |
| KR | 10-2012-0066772 A | 6/2012 |

*Primary Examiner* — Long Pham
(74) *Attorney, Agent, or Firm* — Lee & Morse, P.C.

(57) ABSTRACT

A semiconductor device including a substrate, the substrate including active regions; a pair of conductive lines spaced apart from the substrate such that an insulating layer is between the substrate and the pair of conductive lines; insulating spacers covering side walls of each of the pair of conductive lines such that contact holes having first widths in a first direction are defined between the pair of conductive lines; upper insulating patterns on the pair of conductive lines, the upper insulating patterns defining landing pad holes connected to the contact holes such that the landing pad holes have second widths in the first direction that are greater than the first widths; contact structures including contact plugs connected to the active regions by passing through the insulating layer, and first landing pads connected to the contact plugs, the first landing pads being in the landing pads holes such that the first landing pads vertically overlap with one of the pair of conductive lines; and capacitor lower electrodes connected to the contact structures.

20 Claims, 50 Drawing Sheets

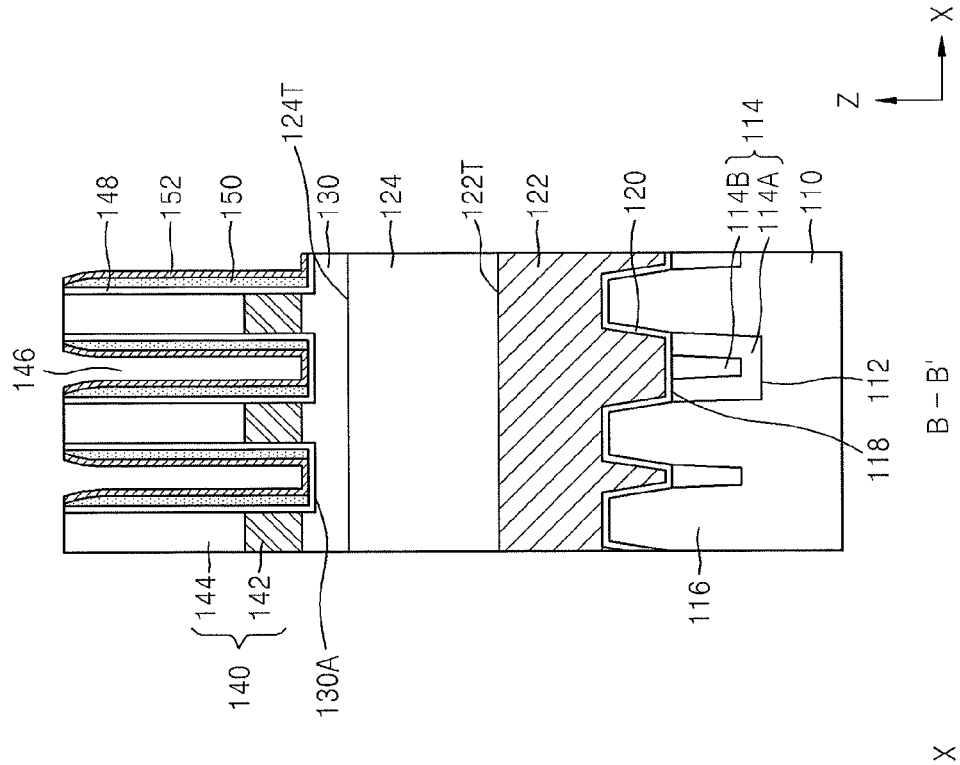
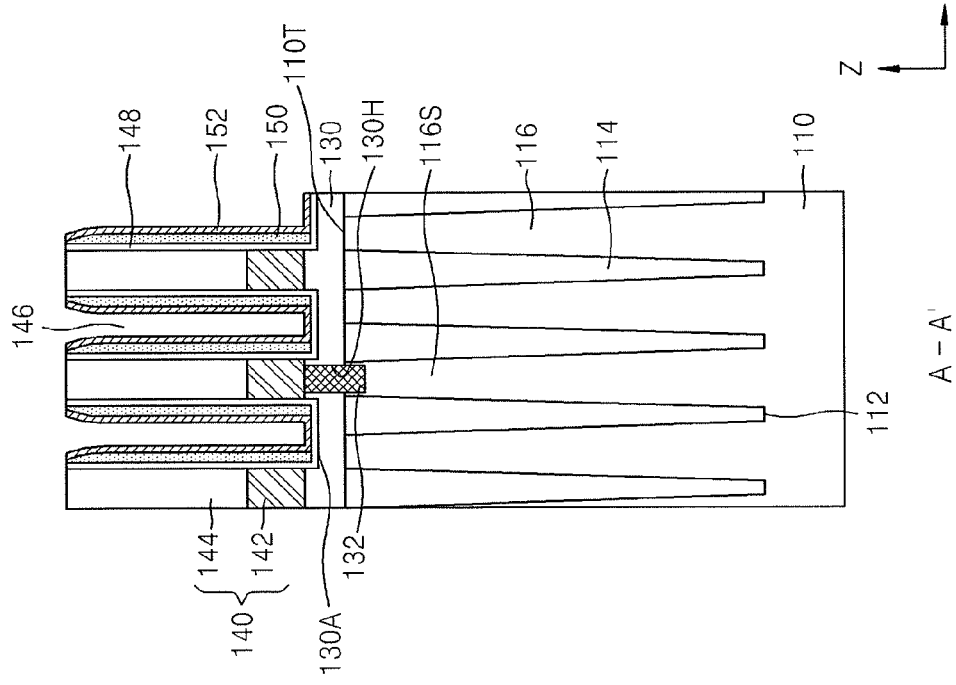

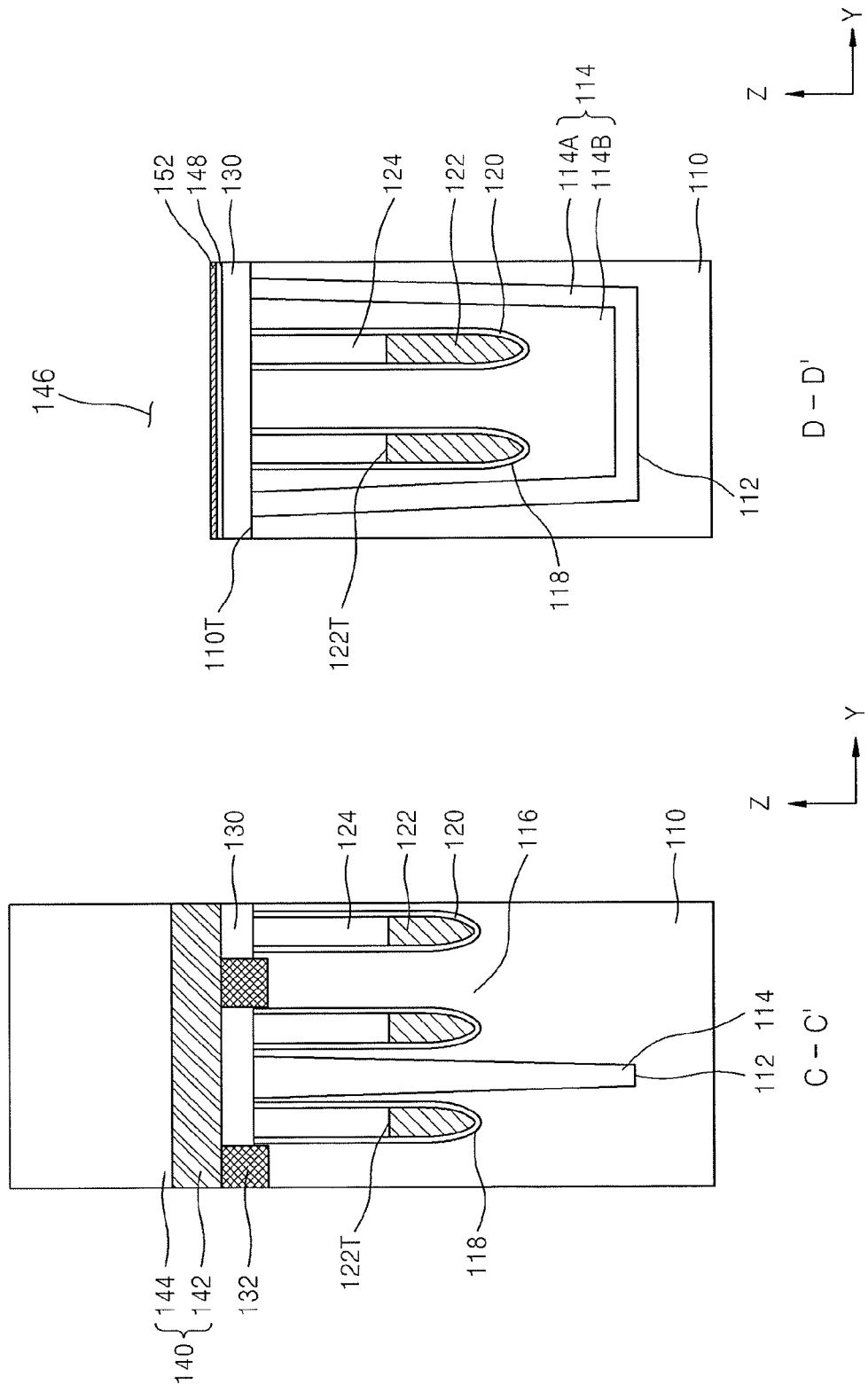

CORE/PERI

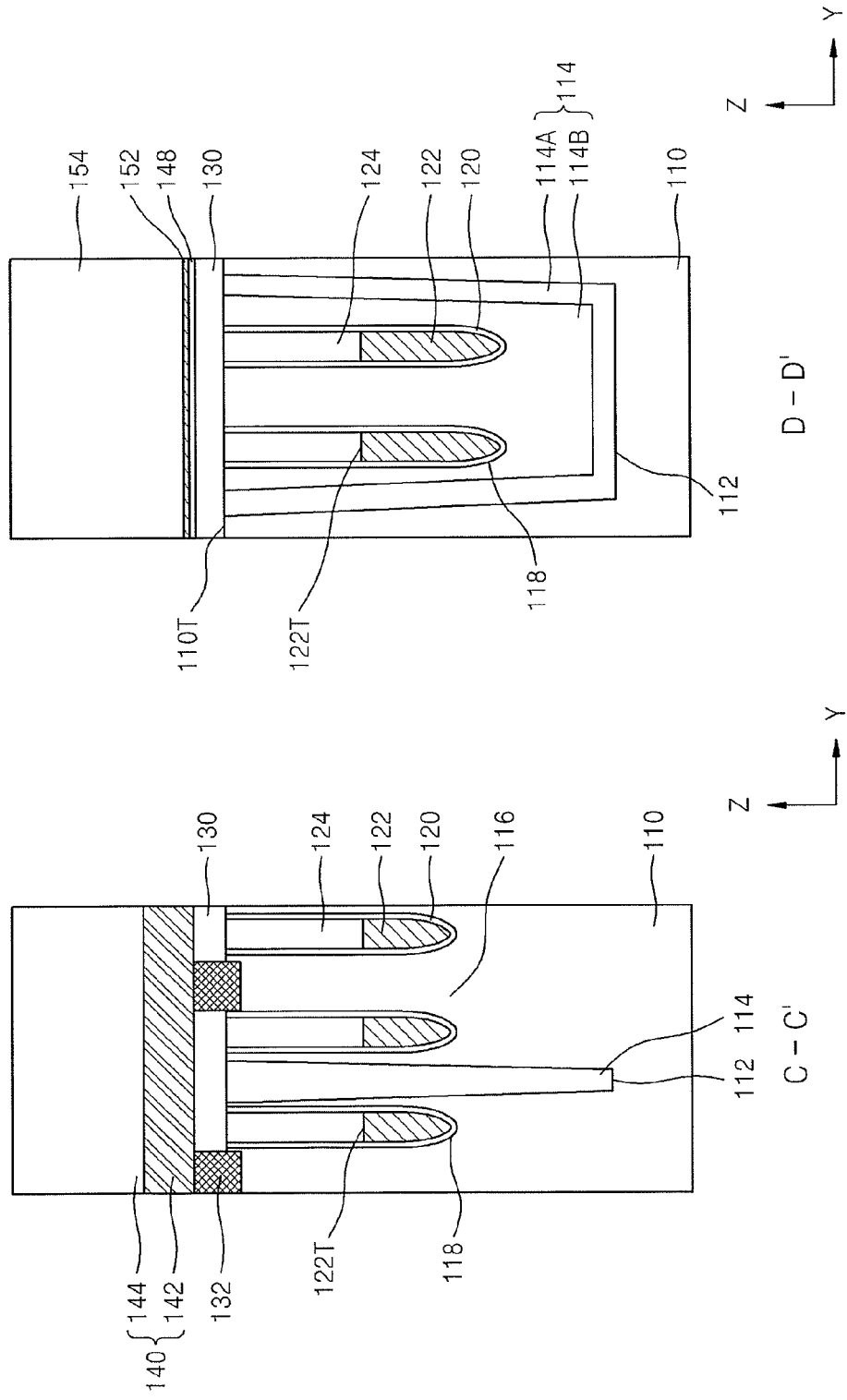

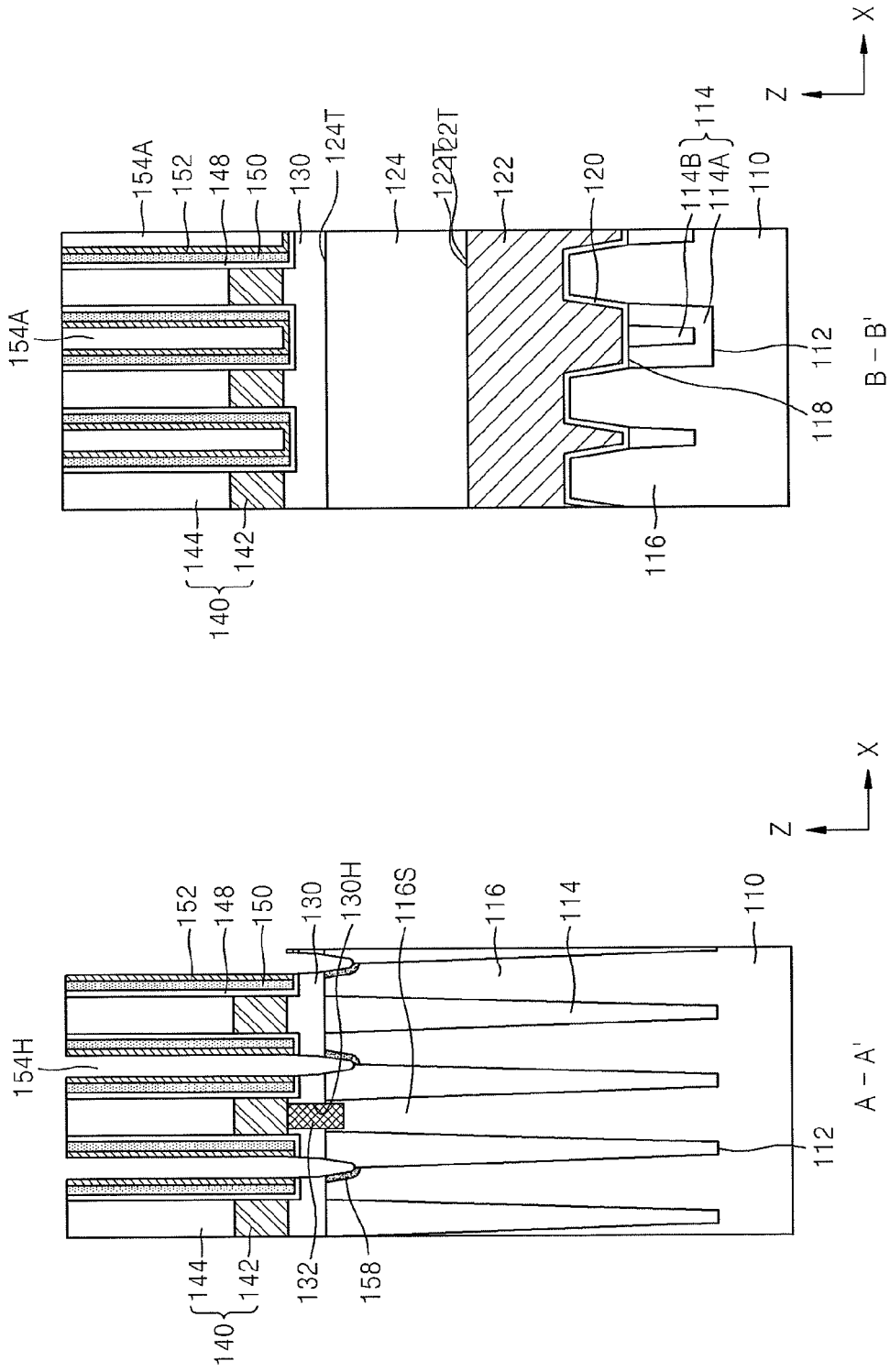

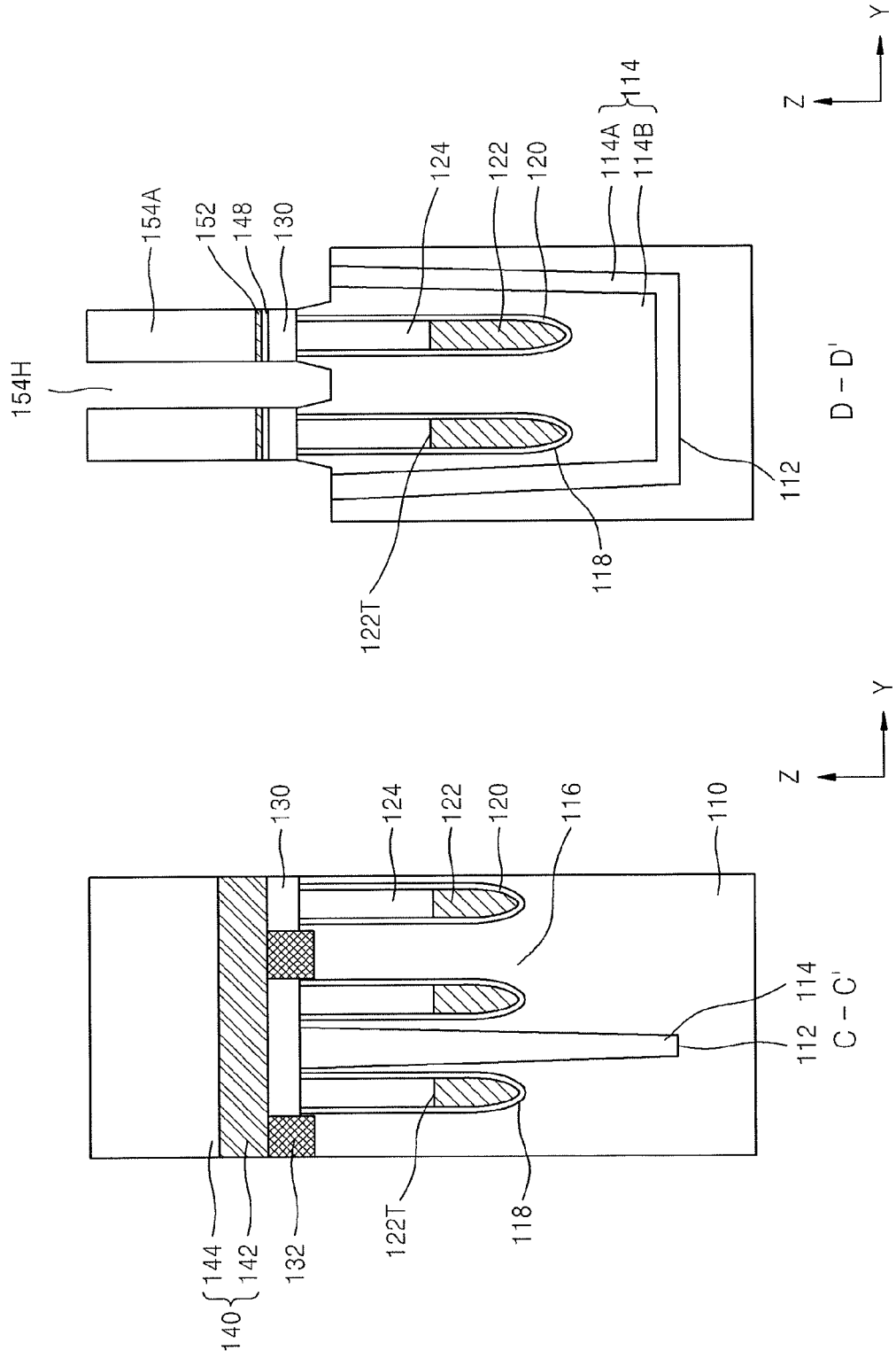

CORE/PERI

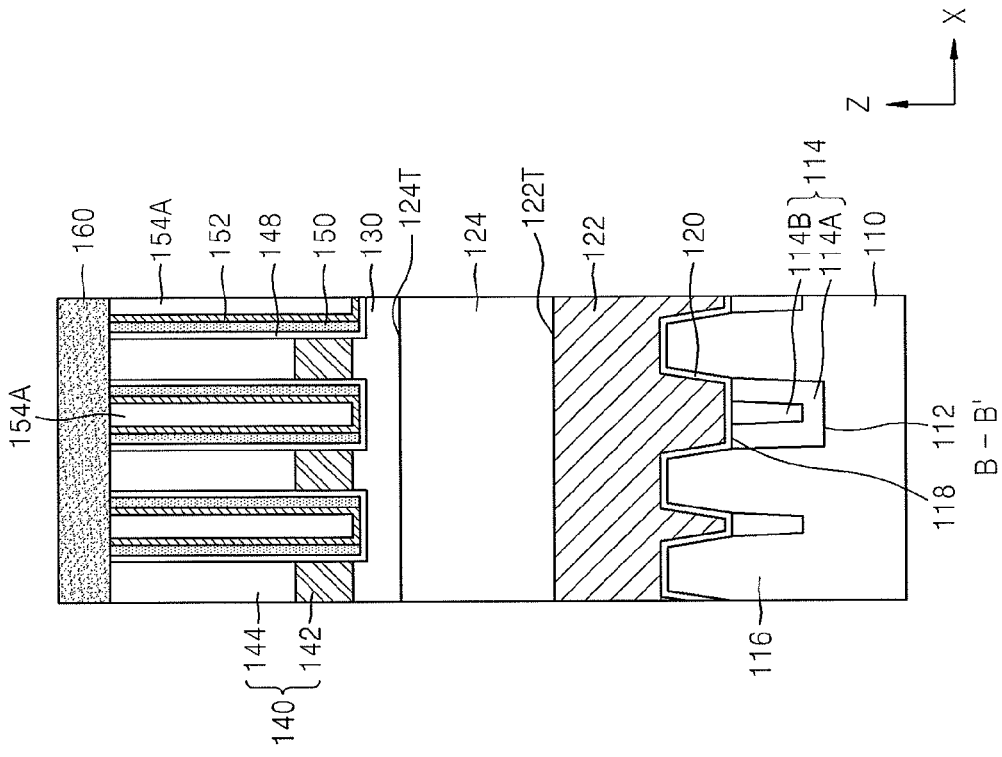
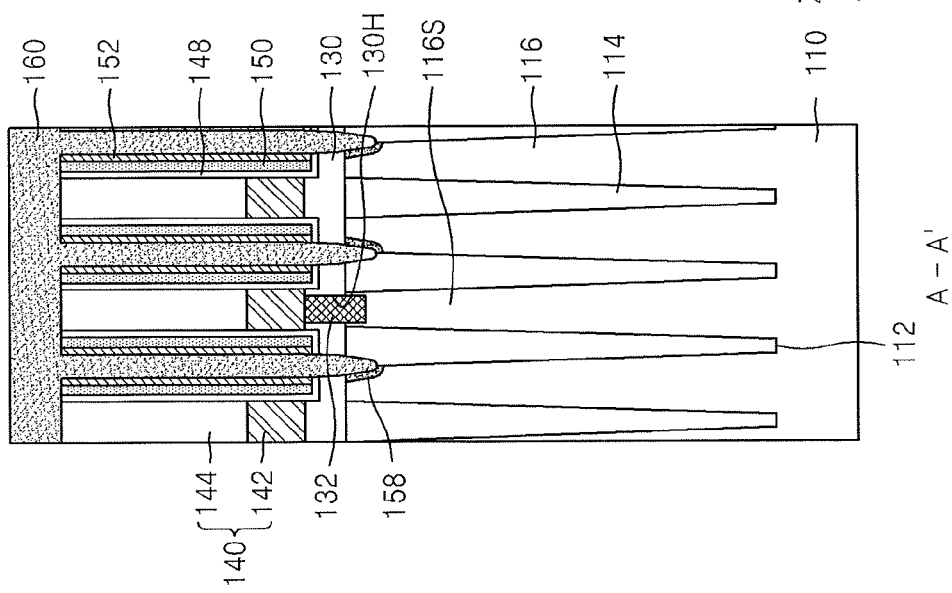

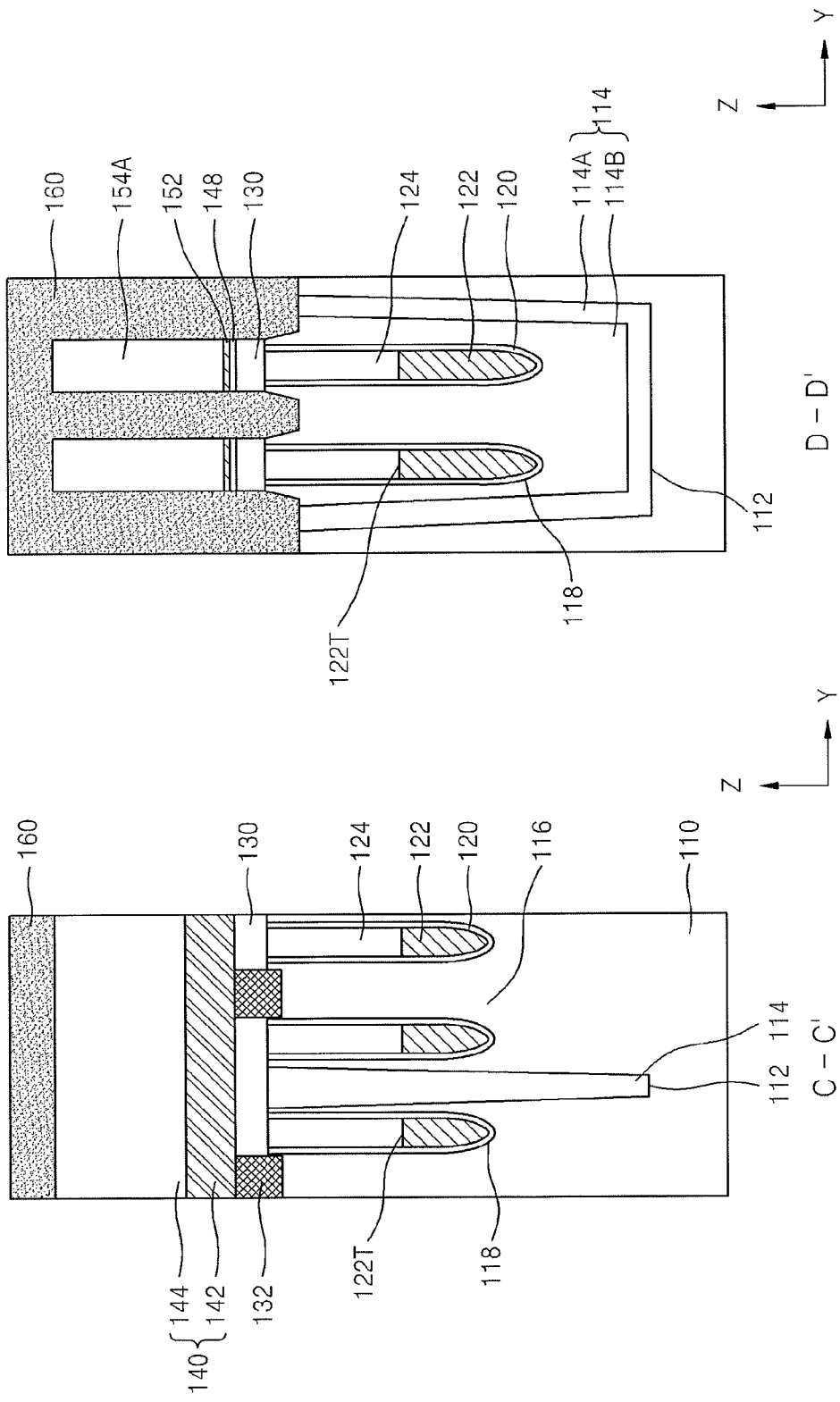

CORE/PERI

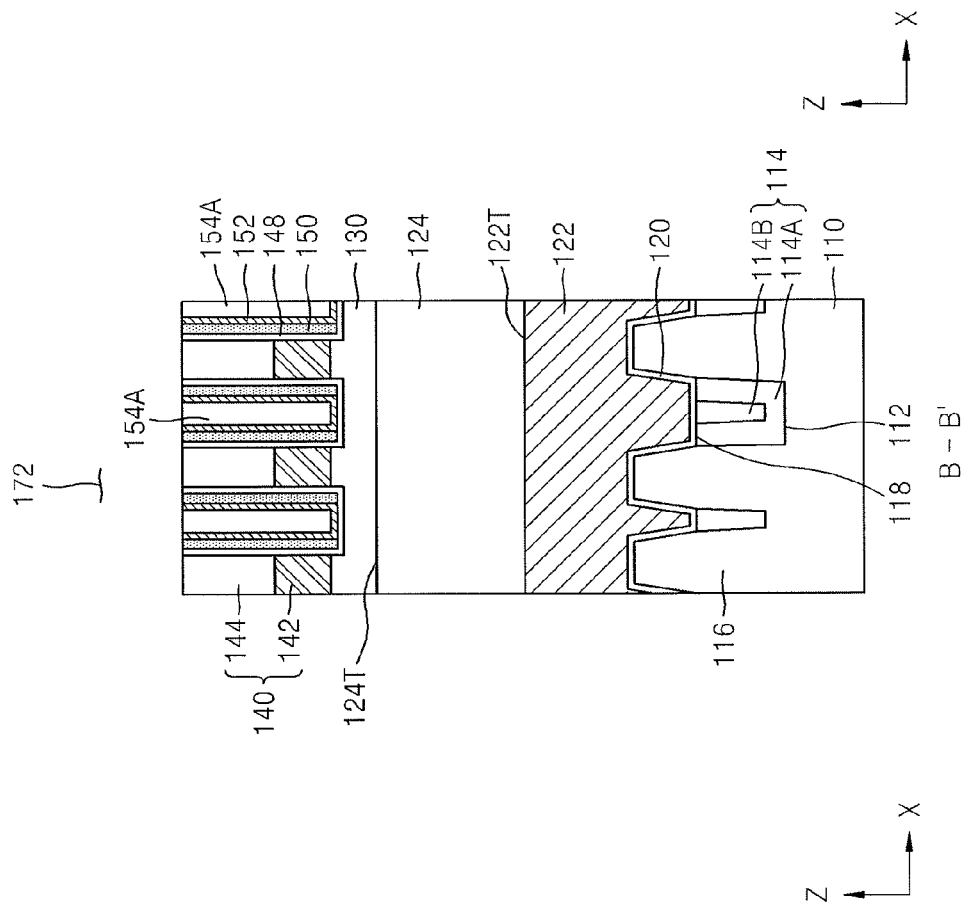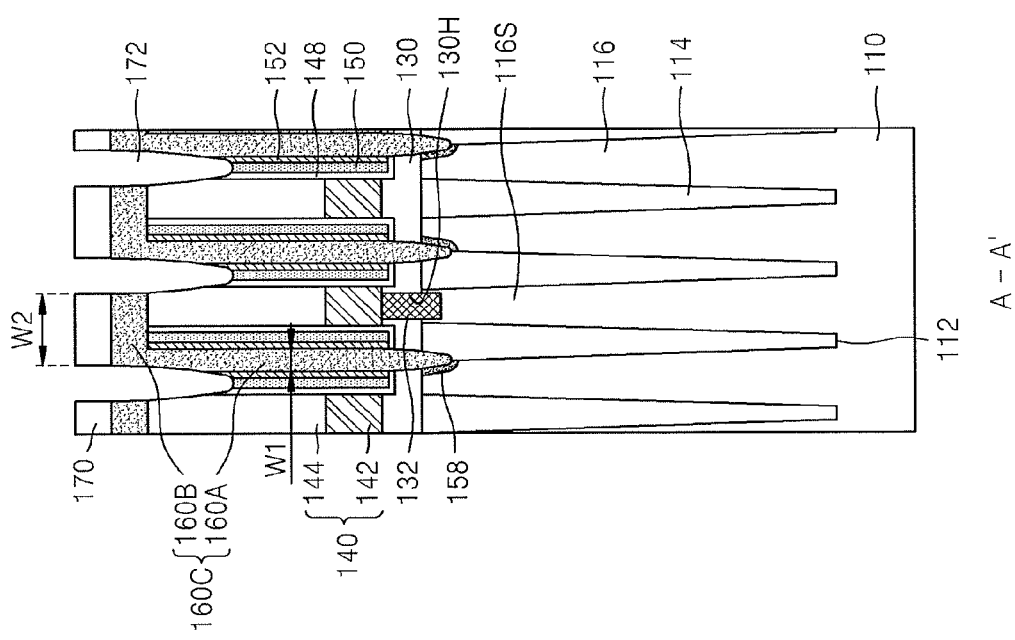

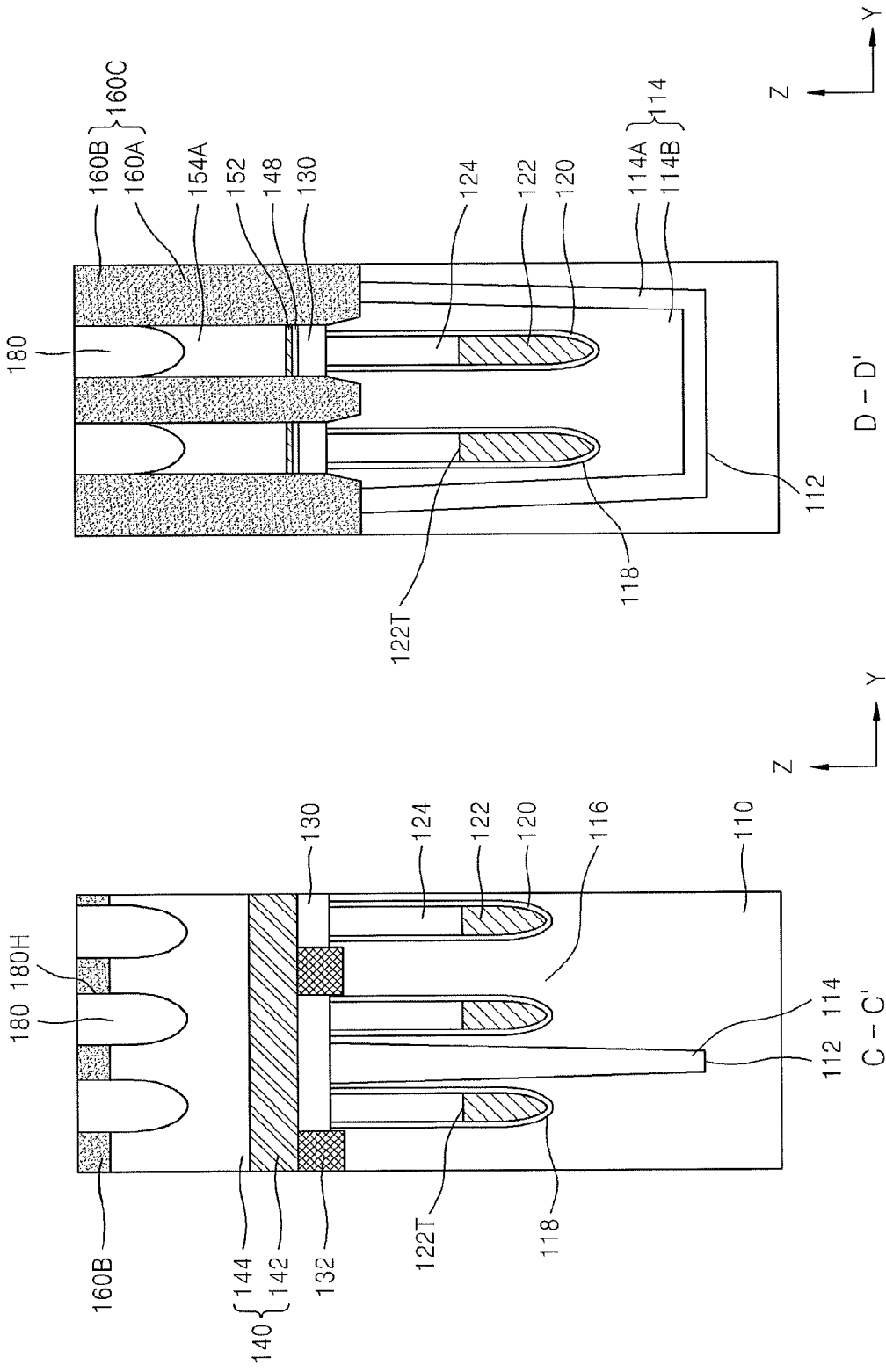

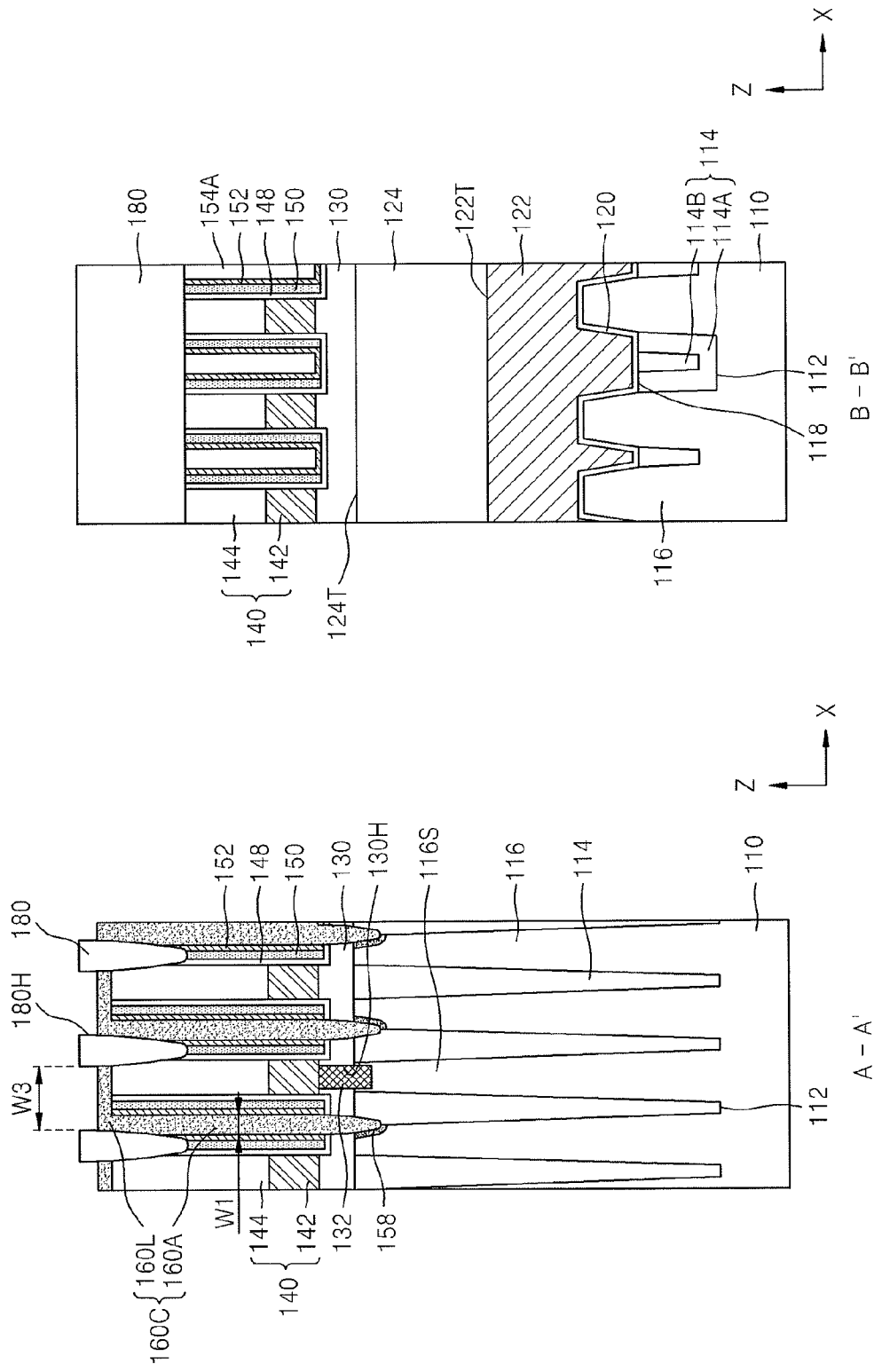

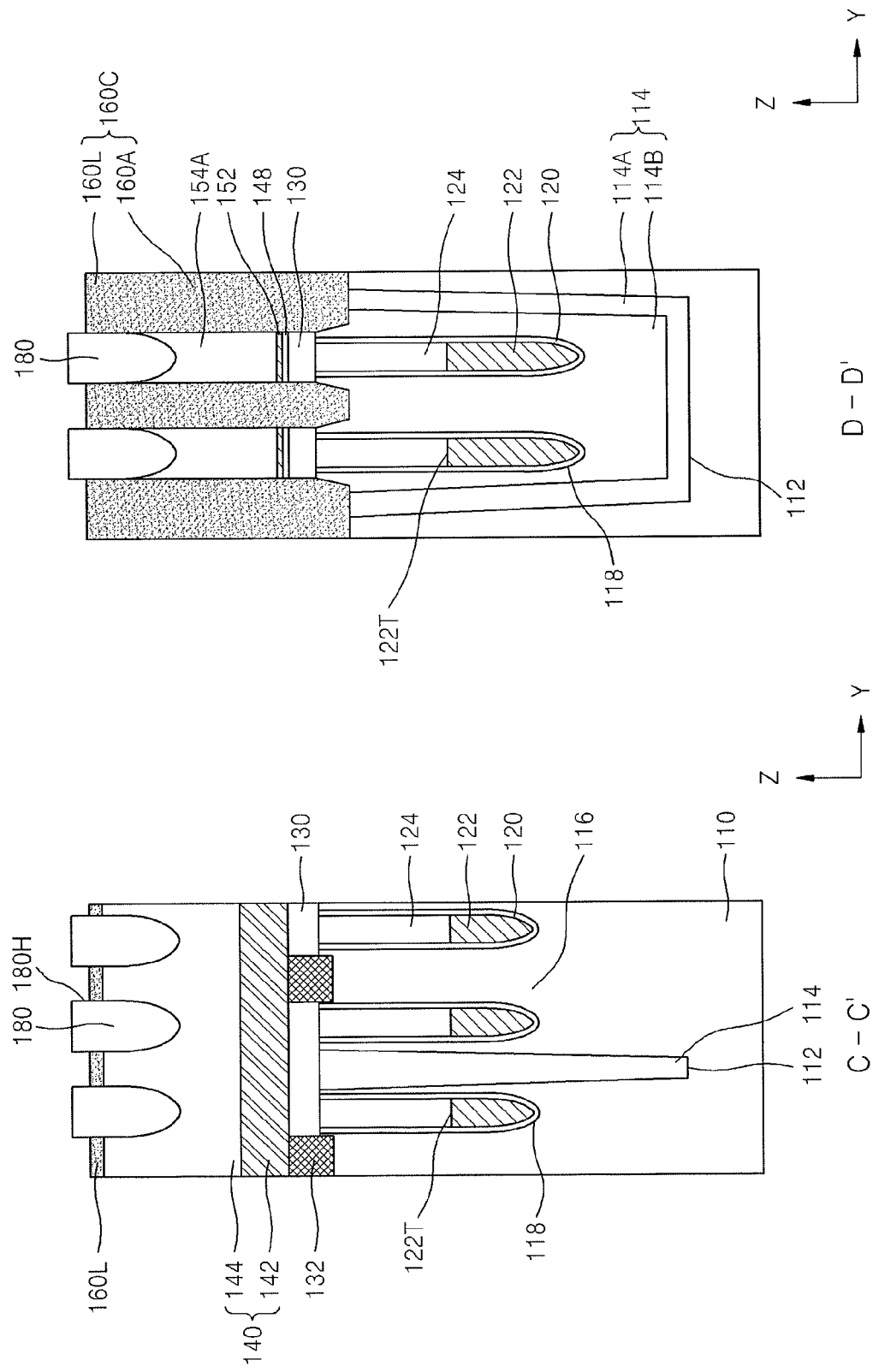

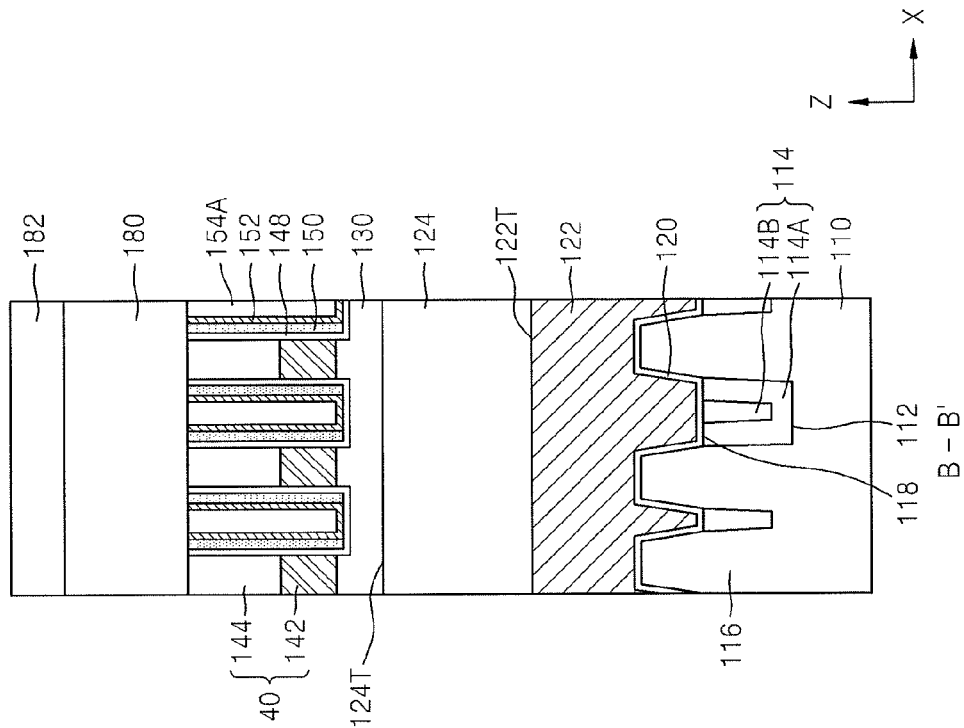
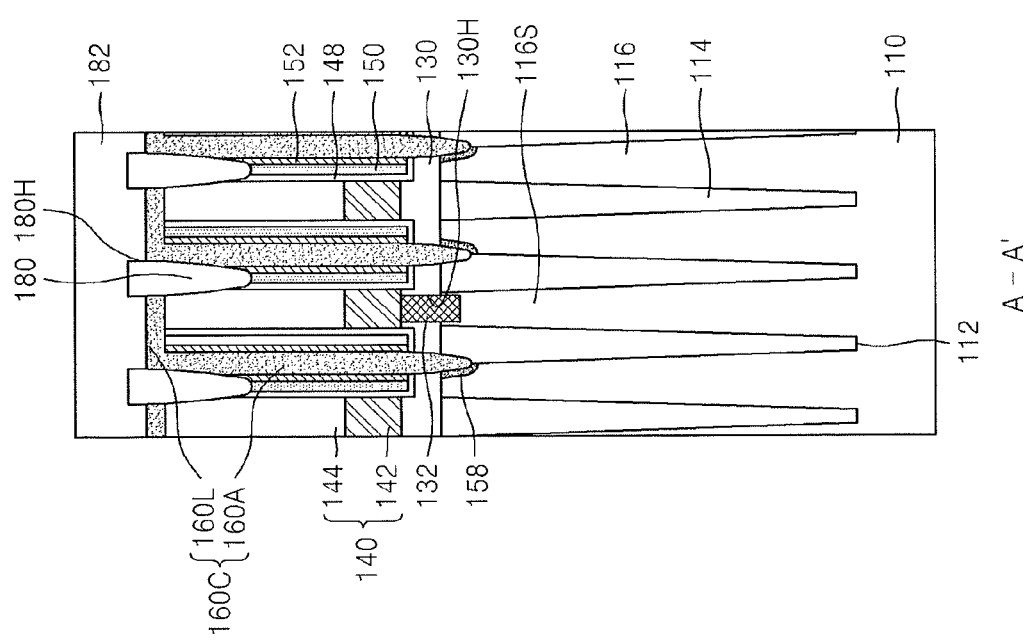

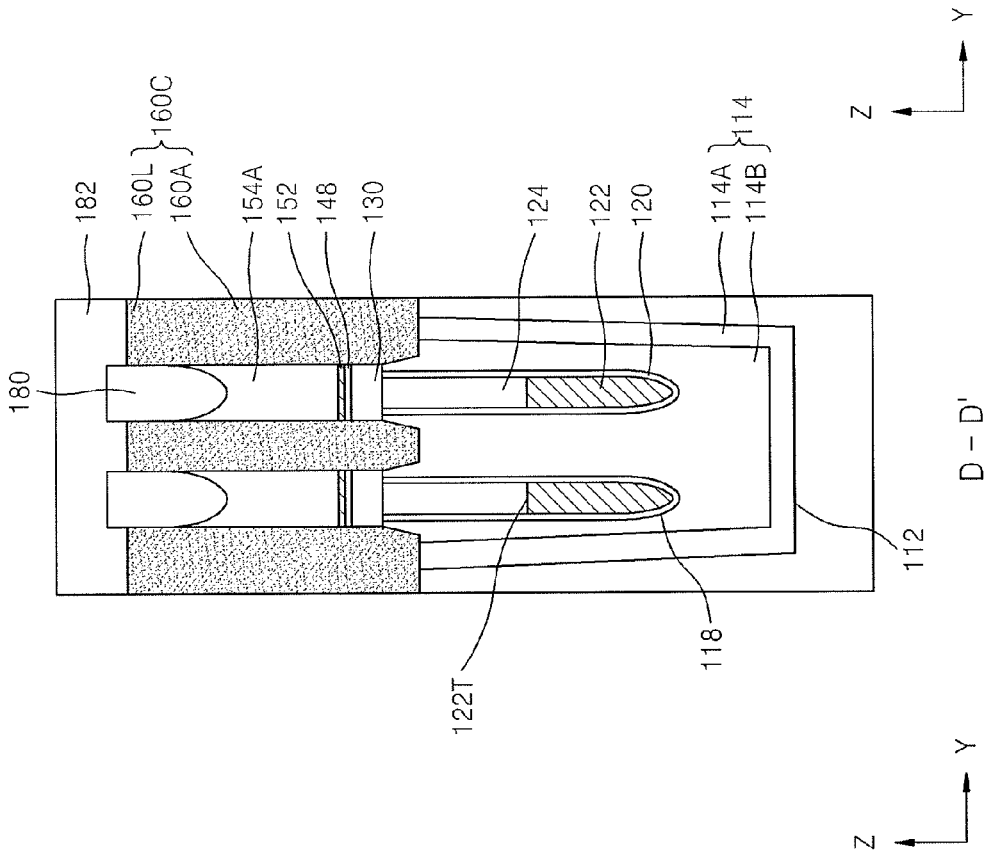
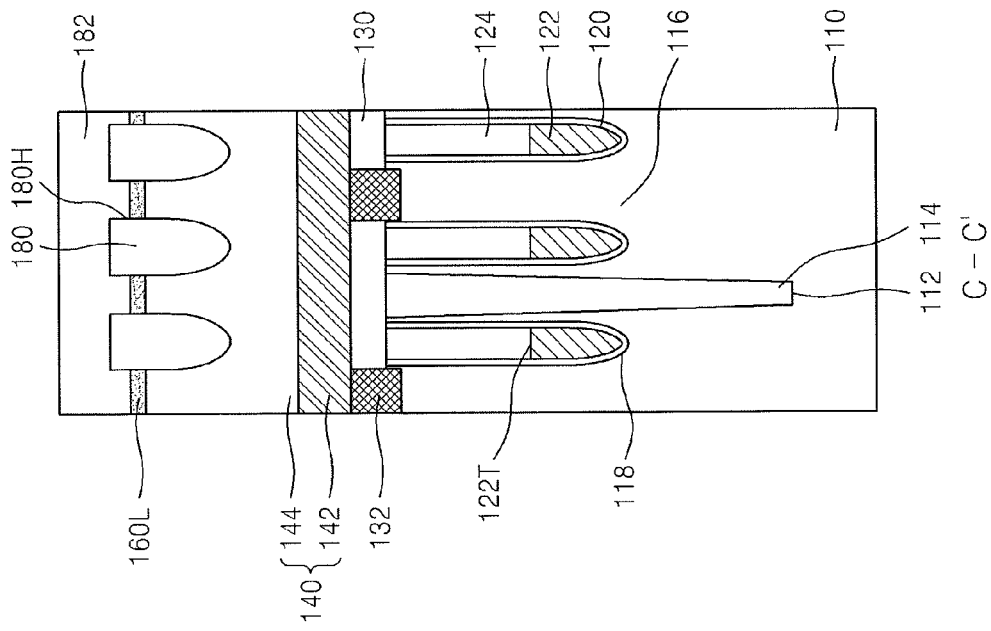
FIG. 11C
FIG. 11D

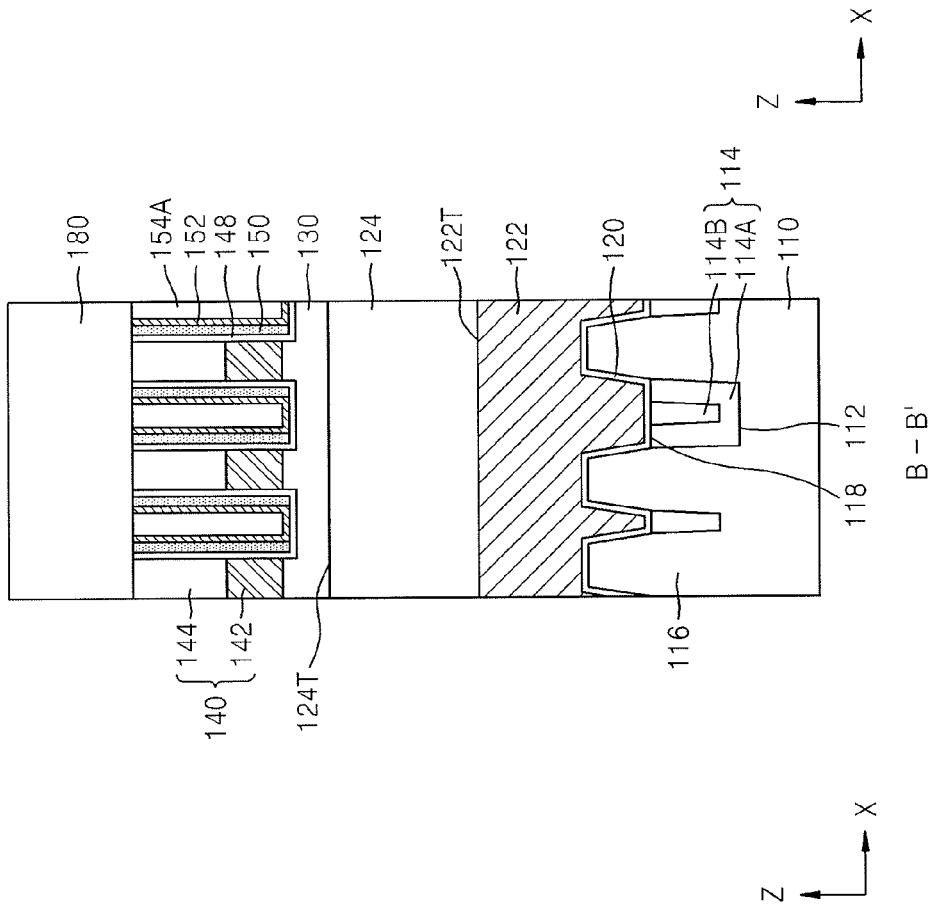
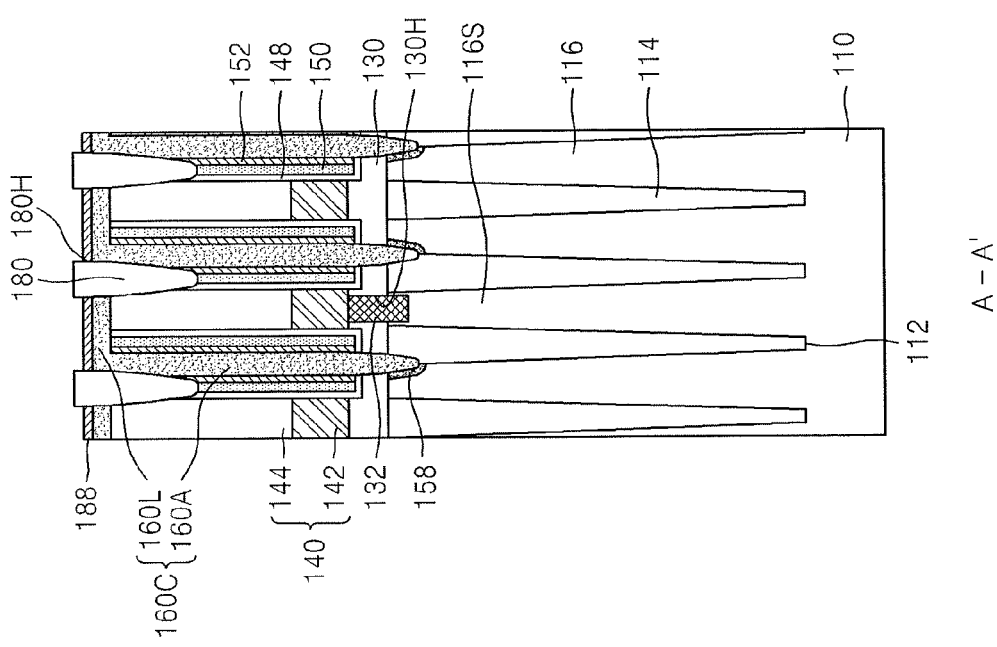

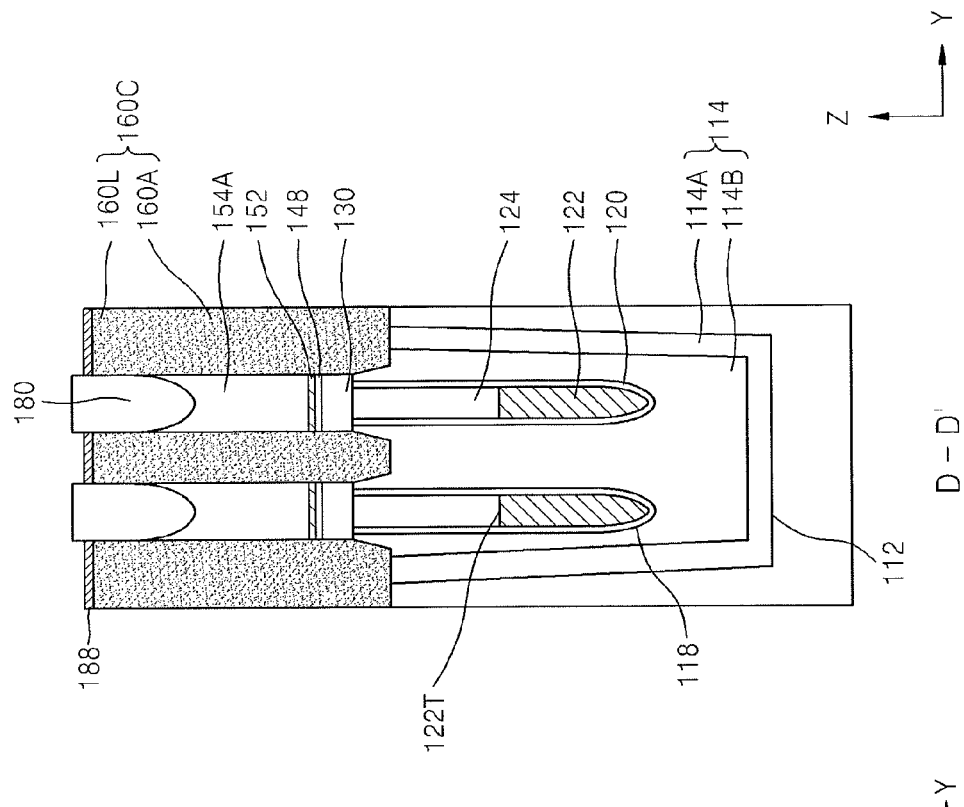
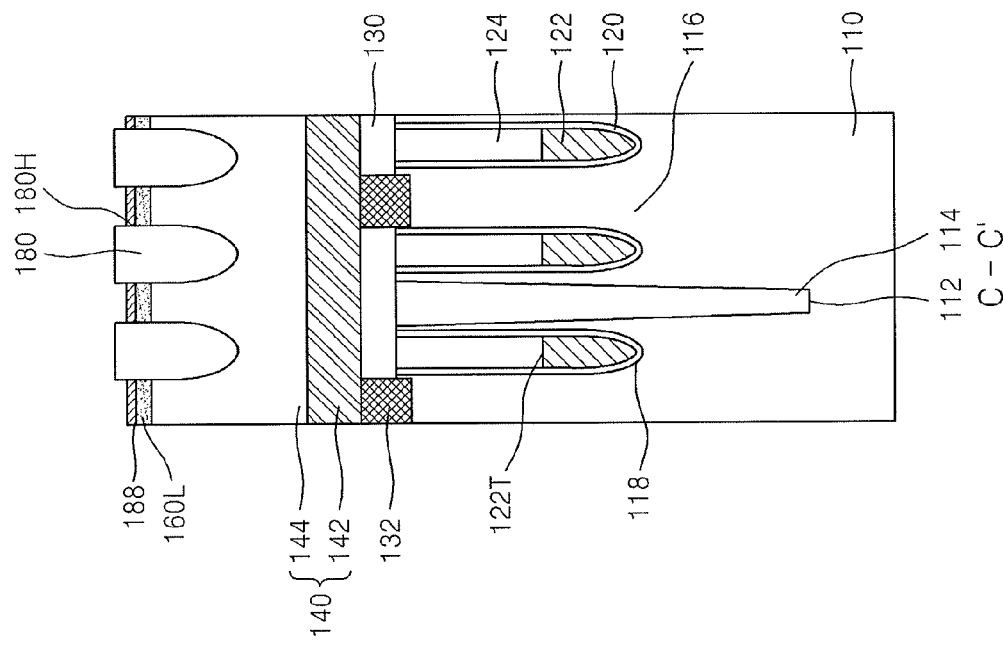

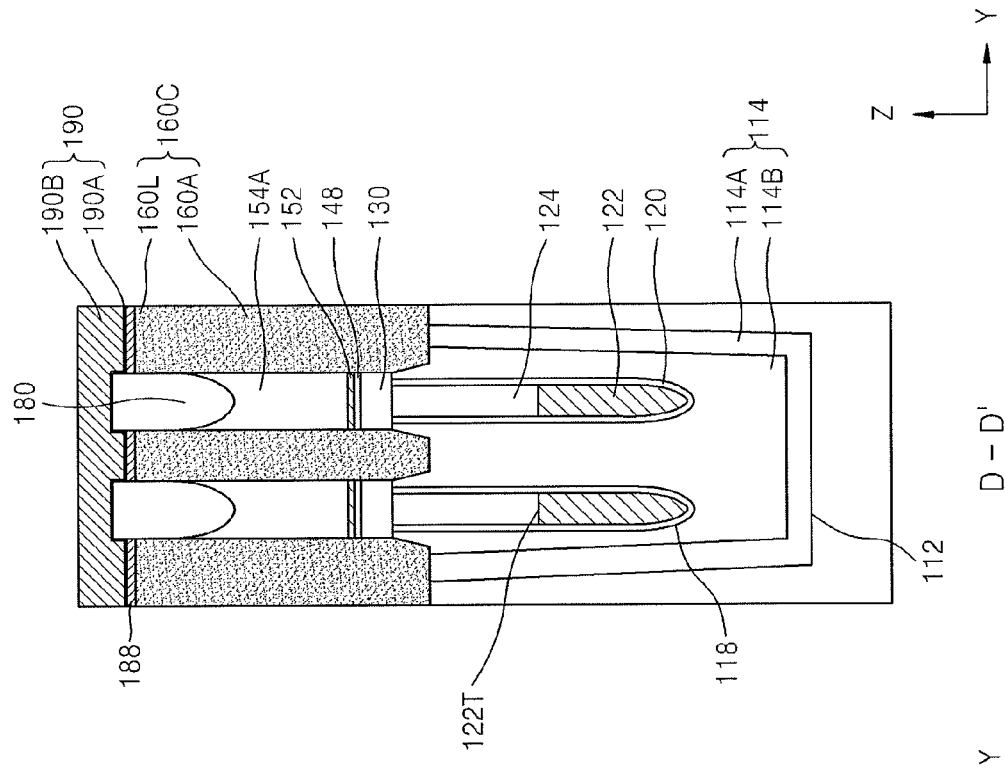
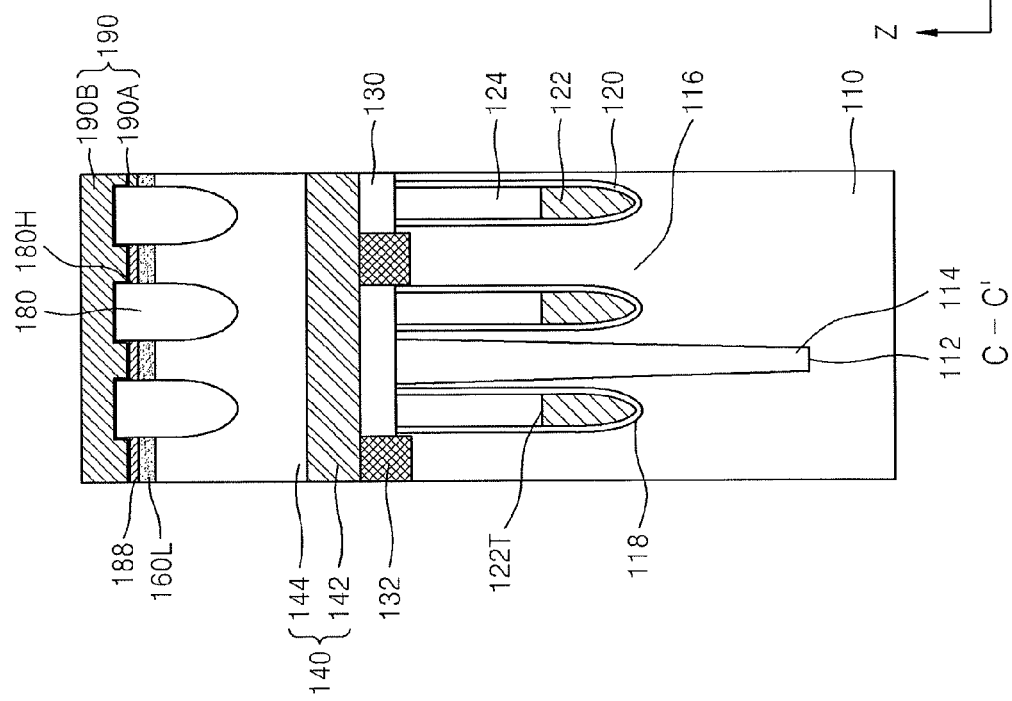

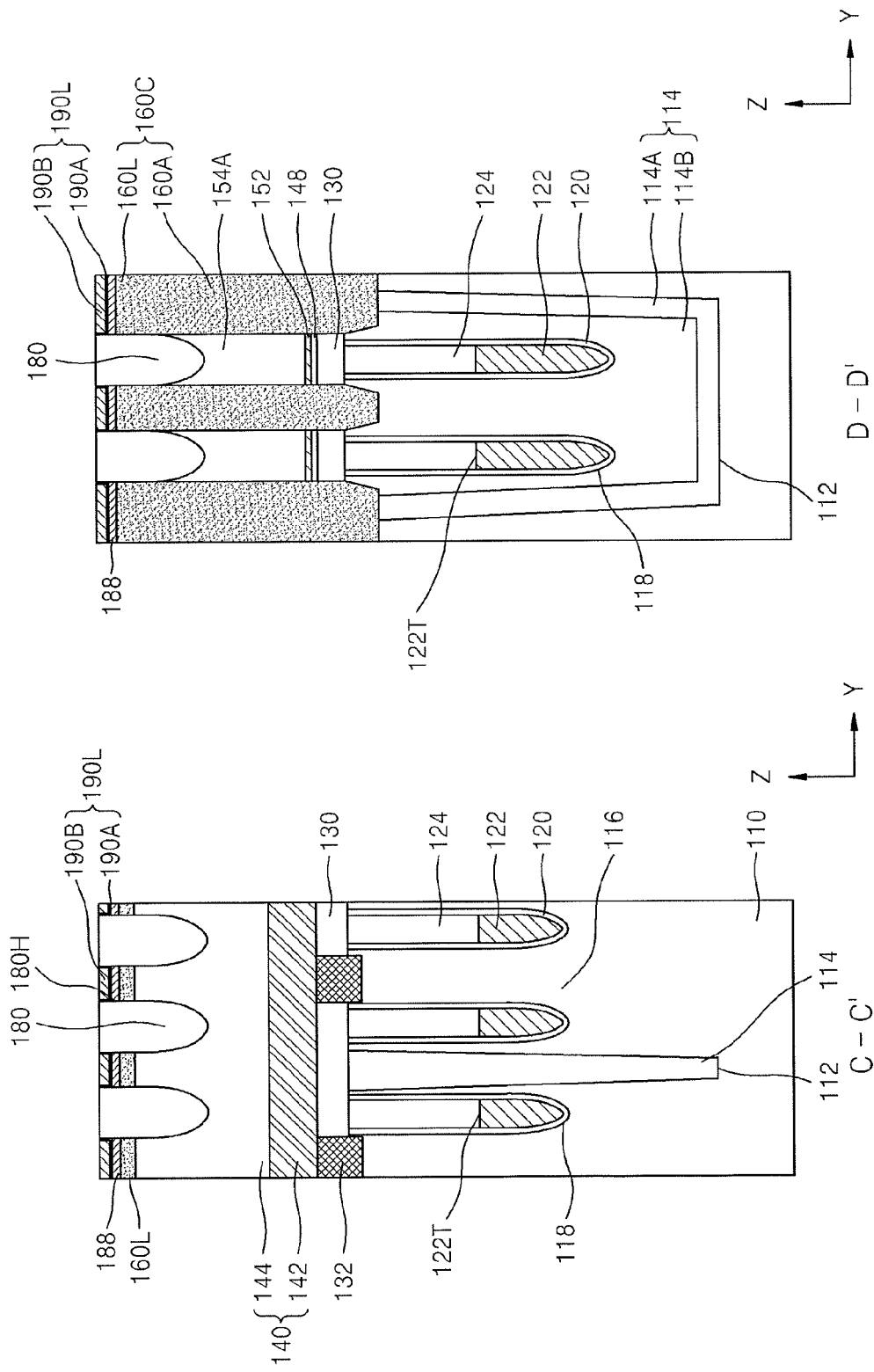

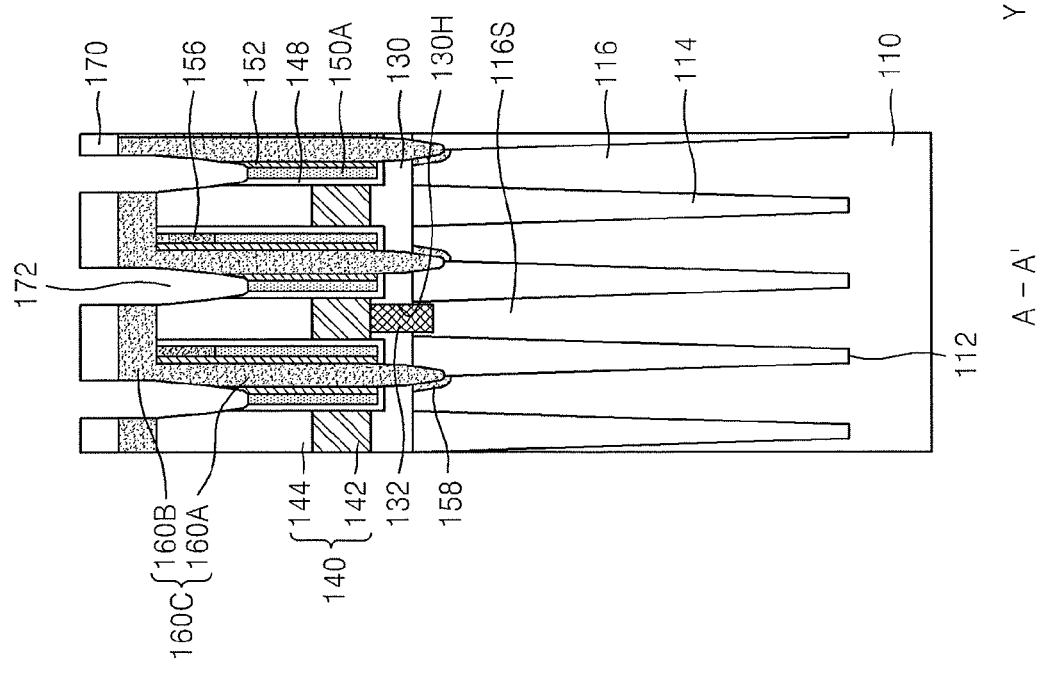
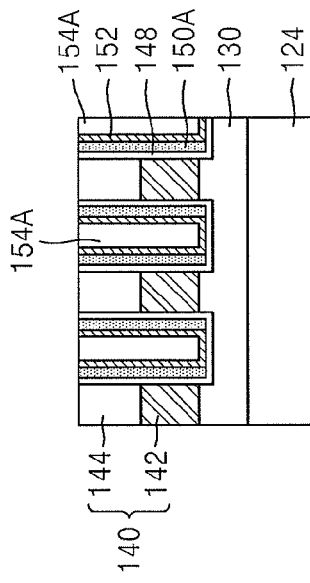
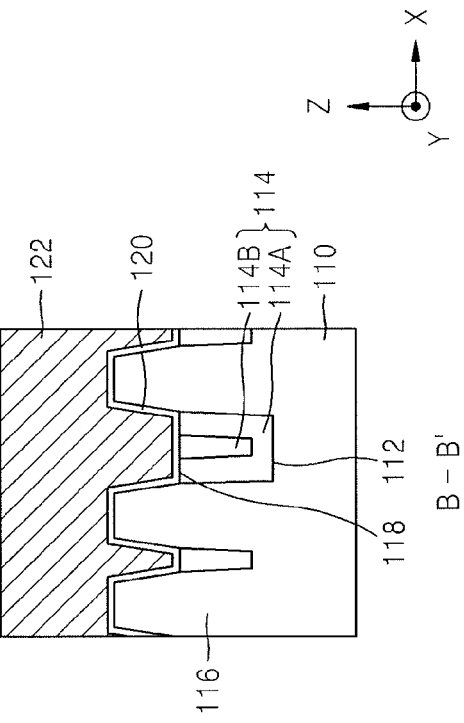
FIG. 20A
FIG. 20B

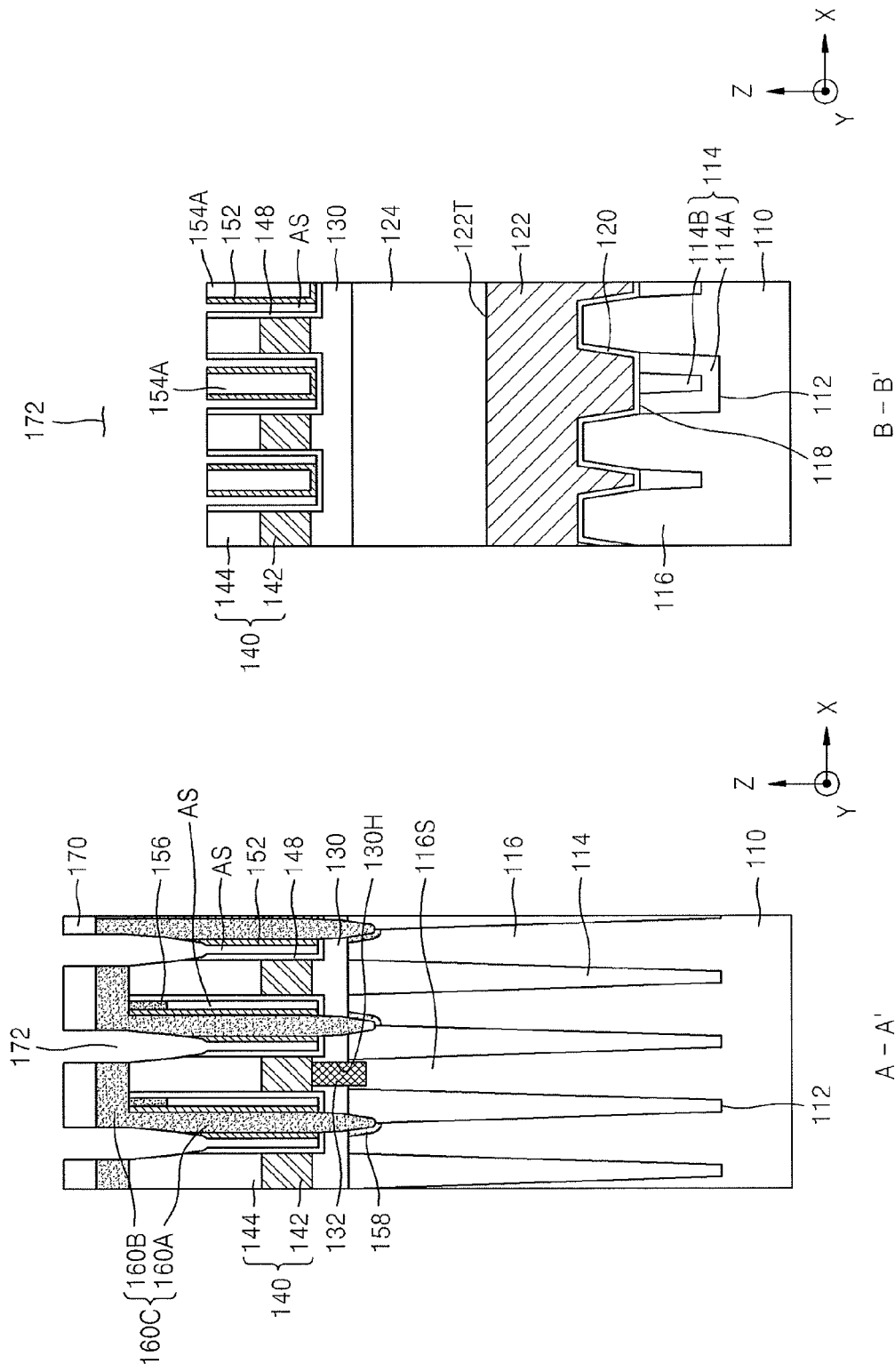

SEMICONDUCTOR DEVICE HAVING LANDING PADS

CROSS-REFERENCE TO RELATED APPLICATION

Korean Patent Application No. 10-2013-0050808, filed on May 6, 2013, in the Korean Intellectual Property Office, and entitled: "Semiconductor Device Having Landing Pads," is incorporated by reference herein in its entirety.

BACKGROUND

1. Field

Embodiments relate to a semiconductor device having landing pads.

2. Description of the Related Art

As a degree of integration of semiconductor devices has increased, design rules for elements of semiconductor devices have been reduced.

SUMMARY

Embodiments are directed to a semiconductor device having landing pads.

The embodiments may be realized by providing a semiconductor device including a substrate, the substrate including active regions; a pair of conductive lines spaced apart from the substrate such that an insulating layer is between the substrate and the pair of conductive lines; insulating spacers covering side walls of each of the pair of conductive lines such that contact holes having first widths in a first direction are defined between the pair of conductive lines; upper insulating patterns on the pair of conductive lines, the upper insulating patterns defining landing pad holes connected to the contact holes such that the landing pad holes have second widths in the first direction that are greater than the first widths; contact structures including contact plugs connected to the active regions by passing through the insulating layer, and first landing pads connected to the contact plugs, the first landing pads being in the landing pads holes such that the first landing pads vertically overlap with one of the pair of conductive lines; and capacitor lower electrodes connected to the contact structures.

The contact plugs may be integrally connected to the first landing pads, and the contact plugs and the first landing pads may be formed of a same material.

The contact plugs may include a portion having a horizontal cross-sectional area having a first size, the first landing pads may include a portion having a horizontal cross-sectional area having a second size, and the second size may be greater than the first size.

The semiconductor device may further include second landing pads between the first landing pads and the capacitor lower electrodes, the second landing pads filling a part of the landing pad holes on the first landing pads.

The first landing pads and the second landing pads may include different materials.

The semiconductor device may further include metal silicide layers between the first landing pads and the second landing pads.

The contact plugs may include a portion having a horizontal cross-sectional area having a first size, the second landing pads may include a portion having a horizontal cross-sectional area having a third size, and the third size may be greater than the first size.

The semiconductor device may further include insulating capping lines covering at least one of the pair of conductive lines, wherein a perpendicular distance from a top surface of the substrate to top surfaces of the first landing pads is greater than a perpendicular distance from the top surface of the substrate to top surfaces of the insulating capping lines.

The insulating spacers may include air spacers.

The semiconductor device may further include second landing pads between the first landing pads and the capacitor lower electrodes; and insulating capping lines covering at least one of the pair of conductive lines, wherein the first landing pads and the second landing pads include different materials, and a perpendicular distance from a top surface of the substrate to top surfaces of the contact plugs is smaller than a perpendicular distance from the top surface of the substrate to top surfaces of the insulating capping lines.

The contact plugs may extend into the substrate to a level lower than that of a top surface of the substrate, and the contact plugs may be connected to the active regions at the lower level.

The semiconductor device may further include metal silicide layers between the contact plugs and the active regions.

The embodiments may be realized by providing a semiconductor device, including a substrate, the substrate including a cell array region and a peripheral circuit region, the cell array region including first active regions and the peripheral circuit region including second active regions; bit line stacked structures, the bit line stacked structures including bit lines on the substrate in the cell array region, and insulating capping lines covering top surfaces of the bit lines; and contact structures, the contact structures including first contact plugs connected to the first active regions in the cell array region, the first contact plugs neighboring the bit lines with first insulating spacers between the first contact plugs and the bit lines, first landing pads connected to the first contact plugs and covering the top surfaces of the bit lines with the insulating capping lines between the first landing pads and the bit lines such that the first landing pads vertically overlap with the bit lines, and second landing pads on the first landing pads and formed of different materials from those of the first landing pads.

The semiconductor device may further include a gate electrode on the substrate in the peripheral circuit region; second contact plugs connected to the second active regions in the peripheral circuit region, the second contact plugs being adjacent to the gate electrode; second insulating spacers between the second contact plugs and the gate electrode, wherein the second contact plugs include the same material as the second landing pads.

The semiconductor device may further include first metal silicide layers between the first landing pads and the second landing pads in the cell array region; and second metal silicide layers between the second active regions and the second contact plugs in the peripheral circuit region, wherein the first metal silicide layers include the same material as the second metal silicide layers.

The embodiments may be realized by providing a semiconductor device including a substrate, the substrate including active regions; an insulating layer on the substrate; a pair of conductive lines on the insulating layer such that the insulating layer is between the substrate and the pair of conductive lines; insulating spacers on side walls of each of the pair of conductive lines, the insulating spacers including contact holes therethrough, the contact holes being between the pair of conductive lines; upper insulating patterns on the pair of conductive lines, the upper insulating patterns including landing pad holes therethrough, the landing pad holes being connected to the contact holes; contact structures in the contact holes and in the landing pad holes, the contact structures including contact plugs connected to the active regions and passing through the insulating layer, the contact plugs including a portion having a horizontal cross-sectional area having a first size, and first landing pads connected to the contact plugs, the first landing pads being in the landing pads holes, the first landing pads vertically overlapping with one of the pair of conductive lines, and the first landing pads including a portion having a horizontal cross-sectional area having a second size such that the second size is greater than the first size; and capacitor lower electrodes connected to the contact structures.

The semiconductor device may further include second landing pads between the first landing pads and the capacitor lower electrodes, the second landing pads filling a part of the landing pad holes on the first landing pads.

The first landing pads and the second landing pads may include different materials.

The second landing pads may include a portion having a horizontal cross-sectional area having a third size, and the third size may be greater than the first size.

The semiconductor device may further include insulating capping lines covering at least one of the pair of conductive lines, wherein a perpendicular distance from a top surface of the substrate to top surfaces of the first landing pads is greater than a perpendicular distance from the top surface of the substrate to top surfaces of the insulating capping lines.

BRIEF DESCRIPTION OF THE DRAWINGS

Features will be apparent to those of skill in the art by describing in detail exemplary embodiments with reference to the attached drawings in which:

FIGS. 17A through 23B illustrate cross-sectional views of stages in a method of manufacturing a semiconductor device according to another embodiment;

DETAILED DESCRIPTION

Figure 1A:
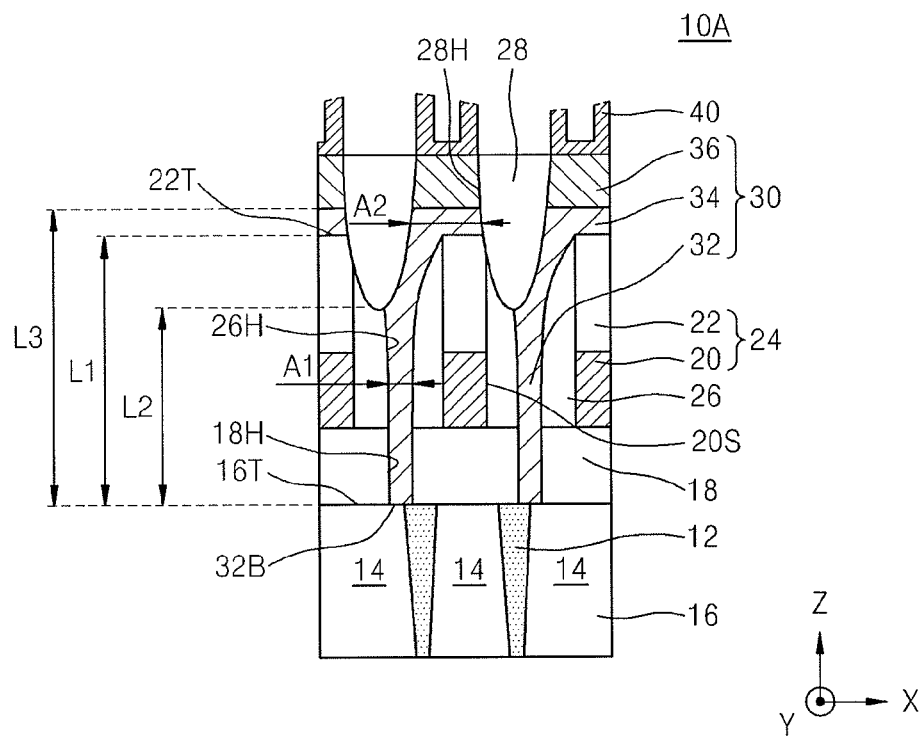
FIG. 1A illustrates a cross-sectional view of a main part of a semiconductor device according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of exemplary embodiments. For example, a first element may be referred to as a second element, and likewise, a second element may be referred to as a first element without departing from the scope of the embodiments.

All terms including technical and scientific terms used herein have meanings which can be generally understood by those of ordinary skill in the art, if the terms are not particularly defined. General terms defined by dictionaries should be understood to have meanings which can be contextually understood in the art and should not have ideally or excessively formal meanings, if the terms are not defined particularly herein by the embodiments.

A specific process order may be changed in another embodiment. For example, two processes that are described as being continuously performed may be simultaneously performed or may be performed in a reverse order.

As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing.

As used herein, the term "and/or" includes any and all combinations of one or more of the associated listed items. Expressions such as "at least one of," when preceding a list of elements, modify the entire list of elements and do not modify the individual elements of the list.

FIG. 1A illustrates a cross-sectional view of a main part of a semiconductor device 10A according to an embodiment.

The semiconductor device 10A includes a substrate 16 including active regions 14 defined by isolating layers 12.

The substrate 16 may include silicon (Si), e.g., crystalline Si, polycrystalline Si, or amorphous Si. In an implementation, the substrate 16 may include a semiconductor material, e.g., germanium (Ge), silicon germanium (SiGe), silicon carbide (SiC), gallium arsenide (GaAs), indium arsenide (InAs), or indium phosphide (InP). In an implementation, the substrate 16 may include a conductive region, e.g., a well doped with impurities or a structure doped with impurities.

A plurality of conductive lines 20 may be formed on the substrate 16 and may be spaced apart from the substrate 16 with first insulating patterns 18 therebetween. The plurality of conductive lines 20 may extend in parallel to each other in one direction.

In an implementation, the plurality of conductive lines 20 may include a plurality of bit lines.

The plurality of conductive lines 20 may be covered by insulating capping lines 22. One conductive line 20 and one insulating capping line 22 covering the one conductive line 20 may form one conductive line structure 24. Insulating spacers 26 may cover both side walls of the conductive line structure 24.

A plurality of first contact holes 18H (exposing the active regions 14) may be formed in the first insulating pattern 18.

Second contact holes 26H may be defined by the insulating spacers 26 covering side walls of two neighboring conductive lines 20, e.g., the second contact holes 26H may be between the two neighboring or adjacent conductive lines 20. Widths of the second contact holes 26H in a Y direction may be defined by a plurality of contact isolation insulating patterns (not shown) between the plurality of conductive line structures 24.

A second insulating pattern 28 (including a plurality of landing pad holes 28H that are connected to the first contact holes 18H and the second contact holes 26H) may be on the plurality of conductive lines 20.

The second contact holes 26H may have first size horizontal cross-sectional areas (e.g., horizontal cross-sectional areas having a first size) in a plane extending in parallel with a direction in which the substrate 16 extends. The plurality of landing pad holes 28H may have second size horizontal cross-sectional areas (e.g., horizontal cross-sectional areas having a second size) in the plane extending in parallel with the direction in which the substrate 16 extends.

Contact structures 30 (connected to the substrate 16 and filling the first contact holes 18H, the second contact hole 26H, and the landing pad holes 28H) may be between the plurality of conductive lines 20. Capacitor lower electrodes 40 may be on the contact structures 30.

The contact structures 30 may include a plurality of contact plugs 32 (filling the first contact holes 18H and the second contact holes 26H), and first landing pads 34 and second landing pads 36 (on the plurality of conductive line structures 24 and filling the landing pad holes 28H).

The plurality of contact plugs 32 may be respectively connected to the active regions 14, and may extend in a direction (a Z direction of FIG. 1A) perpendicular to a direction in which a main surface of the substrate 16 extends, e.g., into the first contact holes 18H and the second contact holes 26H.

The first landing pads 34 may be integrally connected to the contact plugs 32 to fill a part of lower sides of the landing pad holes 28H and may extend on top surfaces 22T of the insulating capping lines 22 so that the first landing pads 34 may vertically overlap with one conductive line 20 selected from the plurality of conductive lines 20.

The second landing pads 36 may fill a part of upper sides of the landing pad holes 28H and may be on the first landing pads 34 so that the second landing pads 36 may also vertically overlap with the conductive line 20 selected from the plurality of conductive lines 20. The capacitor lower electrodes 40 may directly contact the second landing pads 36 of the contact structures 30.

In an X direction, the contact plugs 32 may have first widths A1, and the first landing pads 34 and the second landing pads 36 may have second widths A2. The second widths A2 may be greater than the first widths A1. The contact plugs 32 may have first size horizontal cross-sectional areas (e.g., horizontal cross-sectional areas having a first size) corresponding to horizontal cross-sectional areas of the second contact holes 26H between the plurality of conductive lines 20. The first landing pads 34 and the second landing pads 36 may have second size horizontal cross-sectional areas (e.g., horizontal cross-sectional areas having a second size) corresponding to horizontal cross-sectional areas of the landing pad holes 28H, and may be larger than the first widths A1.

FIG. 1A illustrates bottom surfaces 32B of the contact plugs 32 on the same levels as that of a top surface 16T of the substrate 16 and contacting the top surface 16T. In an implementation, the contact plugs 32 may extend into the substrate 16 to a lower level than that of the top surface 16T of the substrate 16 and may be connected to the active regions 14 at the lower level (not illustrated). In an implementation, metal silicide layers (not illustrated) may be disposed between the contact plugs 32 and the active regions 14.

The plurality of conductive lines 20 may have side walls 20S respectively facing the contact plugs 32. The side walls 20S may be spaced apart from the contact plugs 32 with the insulating spacers 26 therebetween. In an implementation, the insulating spacers 26 may partially include air spacers (not shown) including, e.g., air spaces.

In the contact structures 30, the contact plugs 32 and the first landing pads 34 may be integrally connected to each other and may be formed of the same material. The first landing pads 34 and the second landing pads 36 may be formed of different materials. In an implementation, the contact plugs 32 and the first landing pads 34 may include, e.g., doped polysilicon, and the second landing pads 36 may include, e.g., a metal.

In an implementation, a first perpendicular distance L1 from the top surface 16T of the substrate 16 to top surfaces 22T of the insulating capping lines 22 may be greater than a second perpendicular distance L2 from the top surface 16T of the substrate 16 to a bottom surface of the second insulating pattern 28, e.g., a part of the second insulating pattern 28 that is the closest to the substrate 16.

A third perpendicular distance L3 from the top surface 16T of the substrate 16 to top surfaces of the first landing pads 34 may be greater than the first perpendicular distance L1 from the top surface 16T of the substrate 16 to the top surfaces 22T of the insulating capping lines 22.

In the semiconductor device 10A according to the embodiment described with reference to FIG. 1A, the contact structures 30 for electrically connecting the active regions 14 of the substrate 16 and the capacitor lower electrodes 40 may include the contact plugs 32 (connected to the active regions 14), the first landing pads 34 (integrally connected to the contact plugs 32 and covering the conductive line structures 24 so that the first landing pads 34 vertically overlap with the conductive lines 20), and the second landing pads 36 (on the conductive line structures and on the first landing pads 34). The capacitor lower electrodes 40 may be connected to the second landing pads 36. As such, the first landing pads 34 and the second landing pads 36 may not contact each other in a relatively small space between the two neighboring conductive line structures 24 but may contact each other on or over the plurality of conductive line structures 24, thereby increasing contact areas between the first landing pads 34 and the second landing pads 36. Furthermore, the second insulating pattern 28 may be between two neighboring or adjacent contact structures 30 to help provide a sufficient insulating space, thereby reducing the likelihood of and/or preventing a short from occurring between the two neighboring contact structures 30.

Figure 1B:
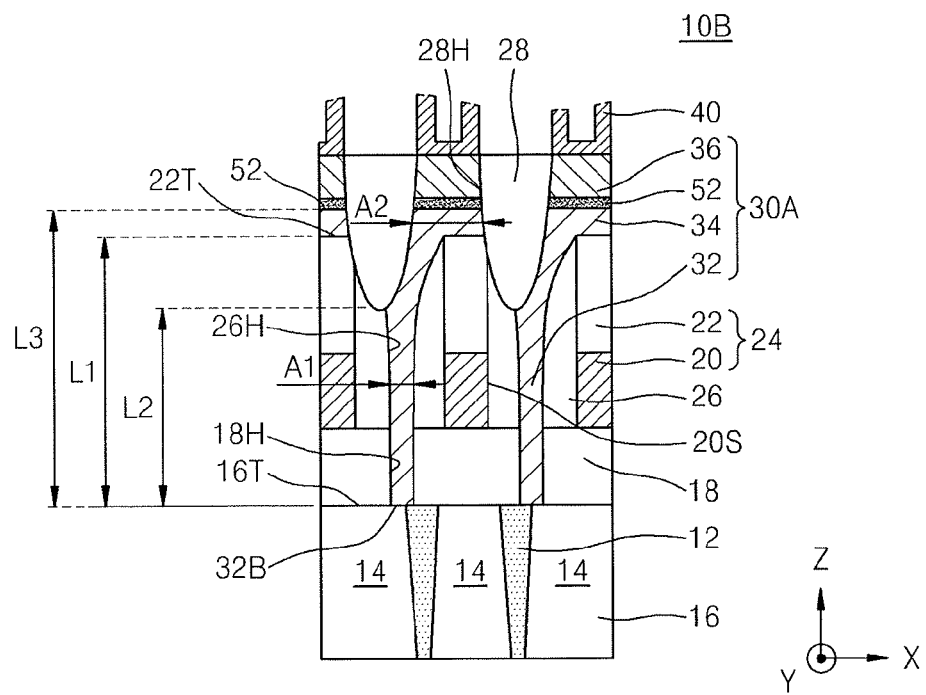
FIG. 1B illustrates a cross-sectional view of a main part of a modification of the semiconductor device of FIG. 1A.

FIG. 1B illustrates a cross-sectional view of a main part of a semiconductor device 10B according to an embodiment. Referring to FIG. 1B, the semiconductor device 10B according to a modification of the semiconductor device 10A of FIG. 1A will now be described. The same reference numerals between FIGS. 1A and 1B denote the same elements, and repeated detailed descriptions thereof may not be given for the sake of brevity.

The semiconductor device 10B may include a contact structure 30A for electrically connecting the active regions 14 of the substrate 16 and the capacitor lower electrodes 40. The contact structure 30A may have the same construction as that of the contact structure 30 described with reference to FIG. 1A, except that the contact structure 30A may further include metal silicide layers 52 between the first landing pads 34 and the second landing pads 36.

In an implementation, the metal silicide layers 52 may be formed of, e.g., cobalt silicide.

Figure 2A:
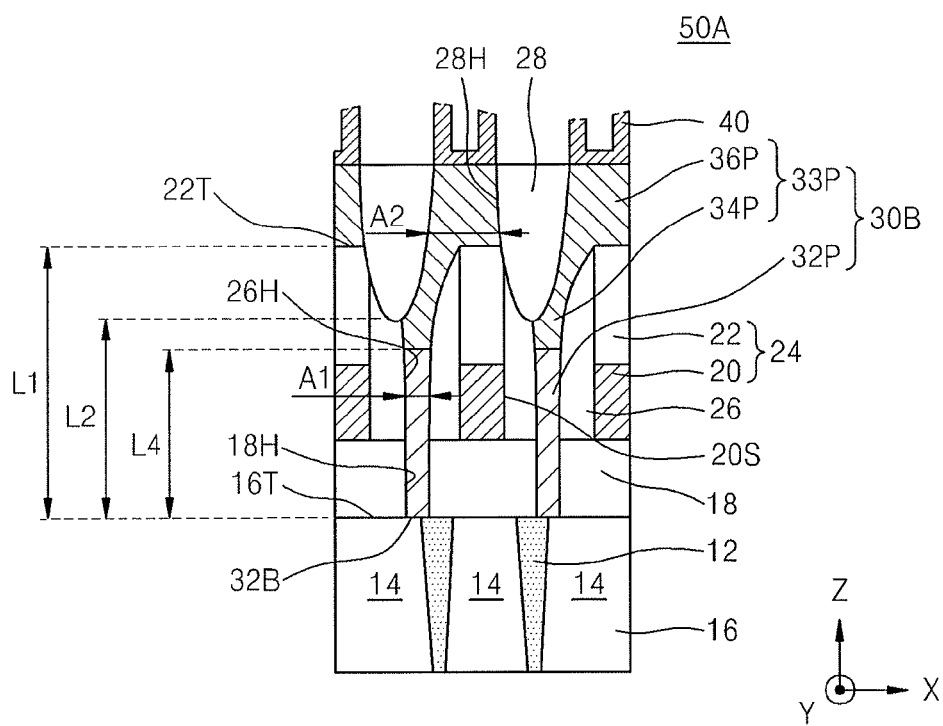
FIG. 2A illustrates a cross-sectional view of a main part of a semiconductor device according to an embodiment.

FIG. 2A illustrates a cross-sectional view of a main part of a semiconductor device 50A according to an embodiment. The same reference numerals between FIGS. 1A and 2A denote the same elements, and repeated detailed descriptions thereof may not be given for the sake of brevity.

The semiconductor device 50A may include a contact structure 30B for electrically connecting the active regions 14 of the substrate 16 and the capacitor lower electrodes 40. The contact structure 30B may include contact plugs 32P filling the first contact holes 18H and a part of the second contact holes 26H, and landing pads 33P on and connected to the contact plugs 32P. The landing pads 33P may include plug portions 34P filling the remaining part of the second contact holes 26H and landing pad portions 36P integrally connected to the plug portions 34P, filling the landing pad holes 28H, and extending on the top surfaces 22T of the insulating capping lines 22. The landing pad portions 36P may vertically overlap with one conductive line 20 selected from the plurality of conductive lines 20.

The contact plugs 32P and the landing pads 33P may include different materials. In an implementation, the contact plugs 32P may include doped polysilicon, and the landing pads 33P may include metal.

The landing pads 33P and/or the landing pad portions 36P may have, e.g., a single layer structure or a multilayer structure including a plurality of material layers.

In the semiconductor device 50A of FIG. 2A, a fourth perpendicular distance L4 from the top surface 16T of the substrate 16 to top surfaces of the contact plugs 32P may be smaller than the first perpendicular distance L1 from the top surface 16T of the substrate 16 to the top surfaces 22T of the insulating capping lines 22.

Figure 2B:
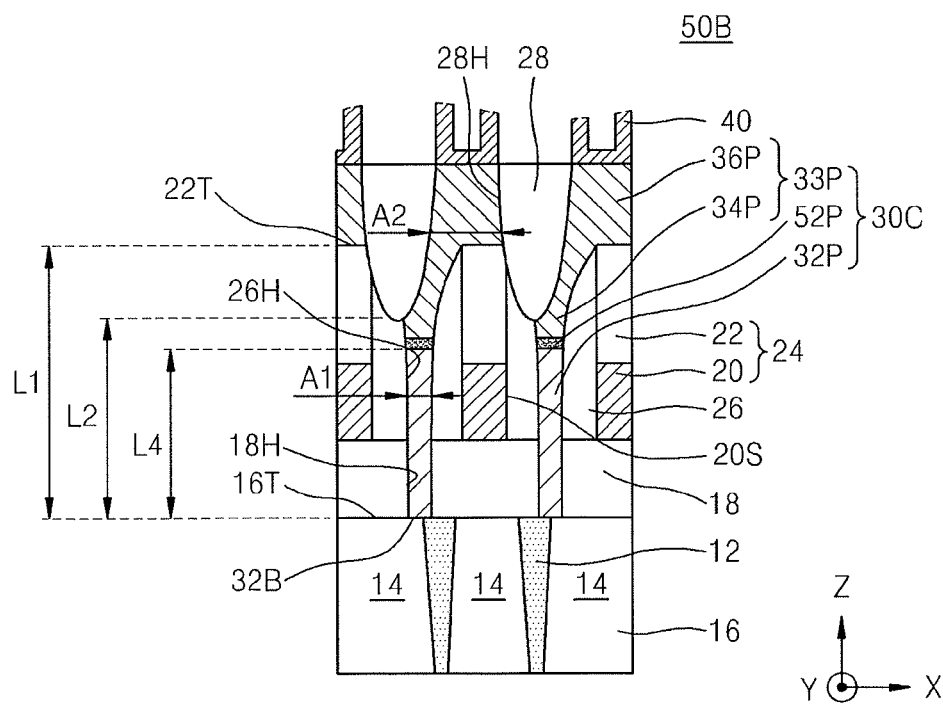
FIG. 2B illustrates a cross-sectional view of a main part of a modification of the semiconductor device of FIG. 2A.

FIG. 2B illustrates a cross-sectional view of a main part of a semiconductor device 50B according to an embodiment. Referring to FIG. 2B, the semiconductor device 50B according to a modification of the semiconductor device 50A of FIG. 2A will now be described. The same reference numerals between FIGS. 1A, 2A, and 2B denote the same elements, and repeated detailed descriptions thereof may not be given for the sake of brevity.

The semiconductor device 50B may include a contact structure 30C for electrically connecting the active regions 14 of the substrate 16 and the capacitor lower electrodes 40. The contact structure 30C may have the same construction as that of the contact structure 30B described with reference to FIG. 2A, except that the contact structure 30C may further include metal silicide layers 52P between the contact plugs 32P and the landing pads 33P.

In an implementation, the metal silicide layers 52P may be formed of, e.g., cobalt silicide.

Figure 3:
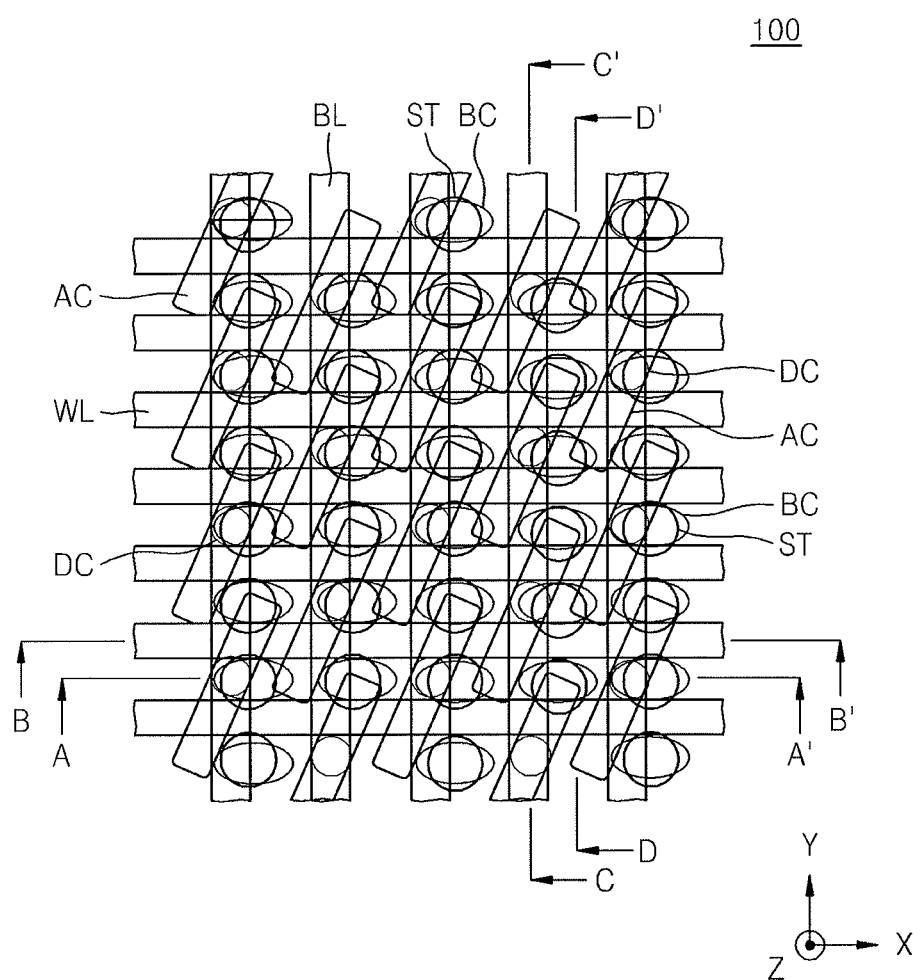
FIG. 3 illustrates a planar layout illustrating a cell array region of a semiconductor device according to an embodiment.

FIG. 3 illustrates a planar layout of a cell array region of a semiconductor device 100 according to an embodiment. The layout of FIG. 3 may be applied to a memory cell having a unit cell size of 6F2, e.g., in a semiconductor memory device. In this regard, F denotes a minimum lithographic feature size.

Referring to FIG. 3, the semiconductor device 100 may include a plurality of active regions AC. A plurality of word lines WL may extend in parallel to each other in a first direction (an X direction) across the plurality of active regions AC. The plurality of word lines WL may be arranged at equal or regular intervals. A plurality of bit lines BL may be on the plurality of word lines WL and may extend in parallel to each other in a second direction (a Y direction) orthogonal to the first direction.

The plurality of bit lines BL may be connected to the plurality of active regions AC through a plurality of direct contacts DC.

In an implementation, the plurality of bit lines BL may each have a pitch of 3F and may be disposed in parallel to each other. In an implementation, the plurality of word lines WL may each have a pitch of 2F and may be disposed in parallel to each other.

A plurality of buried contacts BC may be configured as a contact structure extending from a region between two neighboring bit lines BL among the plurality of bit lines BL to an upper portion of one of the two neighboring bit lines BL. In an implementation, the plurality of buried contacts BC may be arranged in a line in first and second directions. In an implementation, the plurality of buried contacts BC may be arranged at equal intervals in the second direction. The plurality of buried contacts BC may electrically connect capacitor lower electrodes ST to the active regions AC.

FIGS. 4A through 16E illustrate cross-sectional views of stages in a method of manufacturing a semiconductor device 100A (see FIGS. 16A through 16E) according to an embodiment.

Figure 4E:
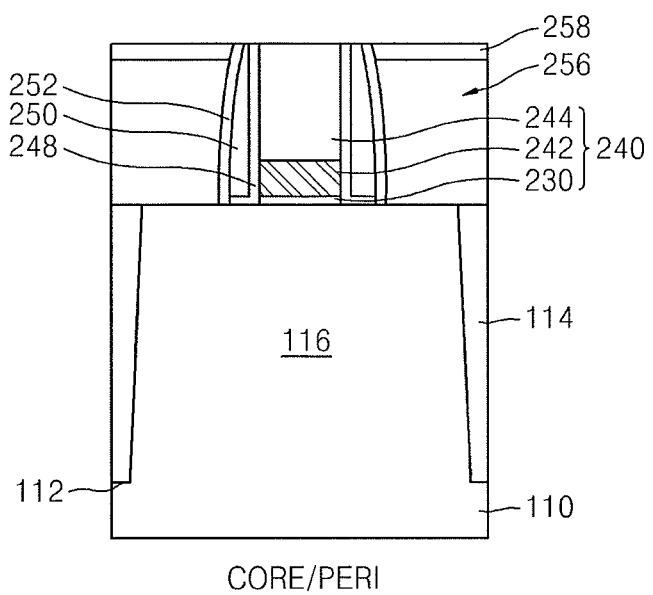
FIGS. 4A through 16E illustrate cross-sectional views of stages in a method of manufacturing a semiconductor device according to an embodiment.
Figure 5B:
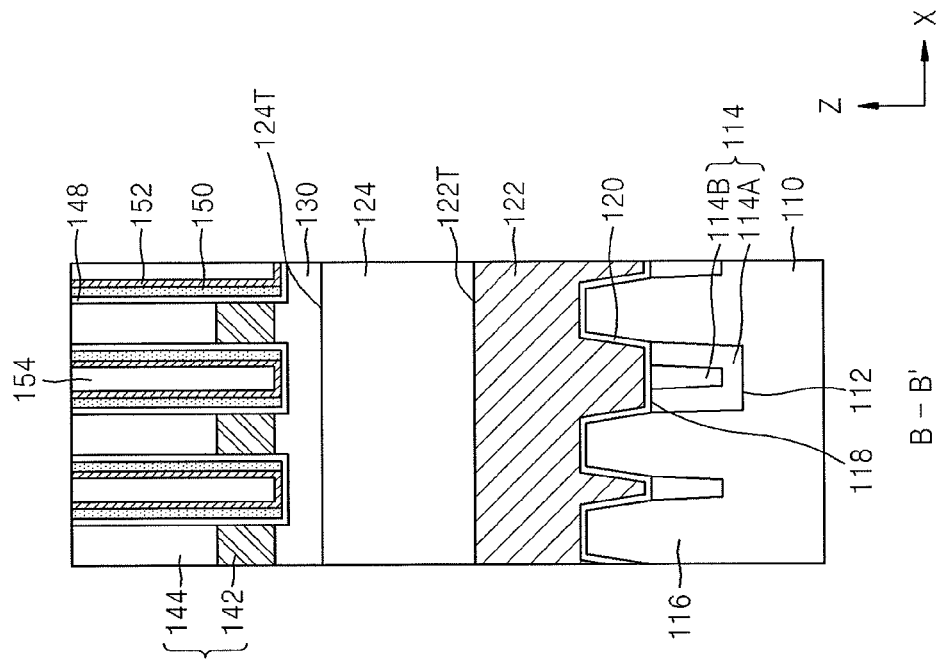
Figure 5A:
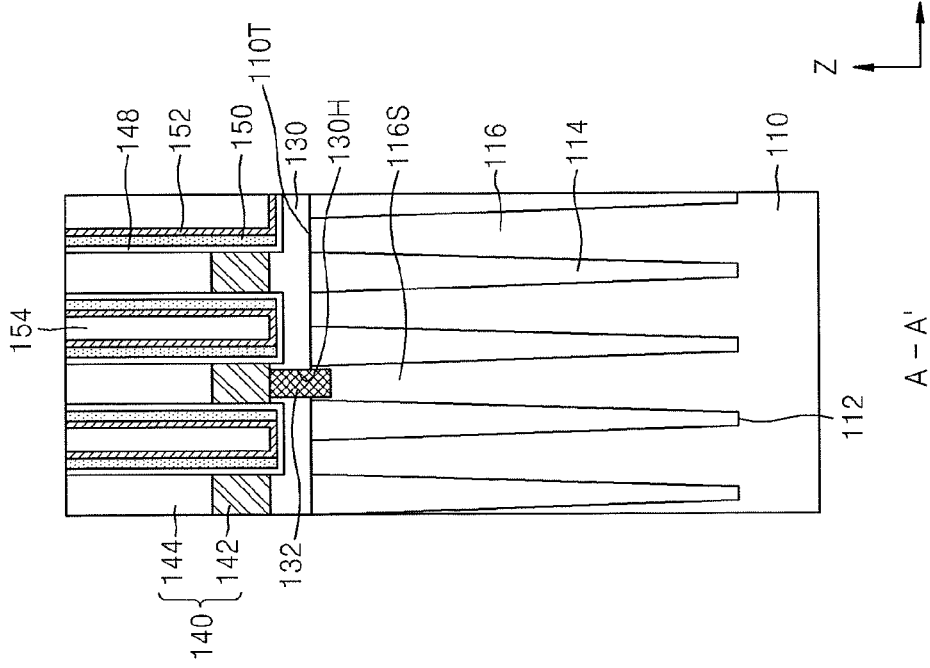
Figure 5E:
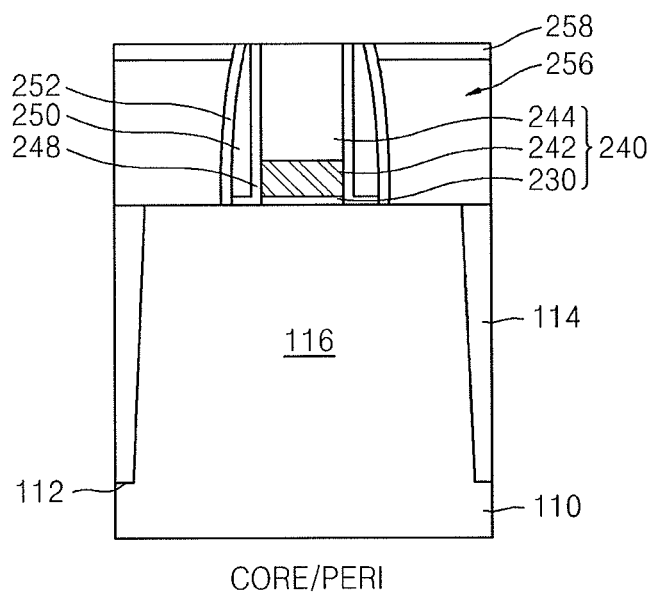
Figure 6E:
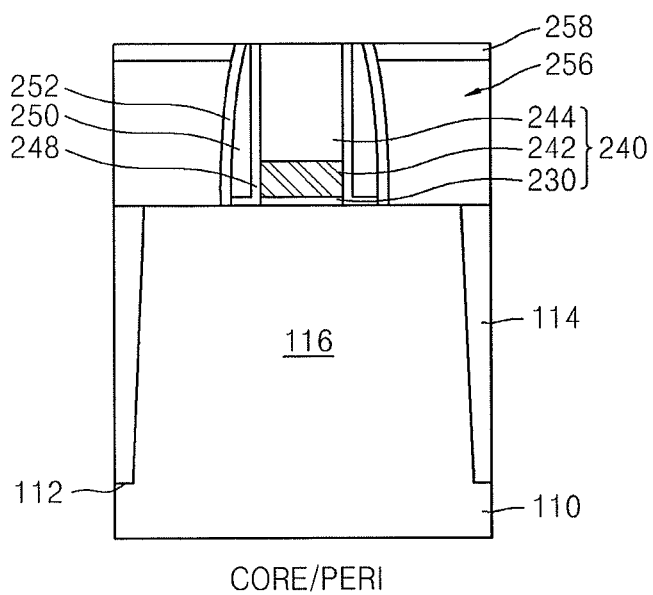

A cell array region of the semiconductor device 100A may have the layout of FIG. 3. FIGS. 4A, 5A, . . . , and 16A illustrate cross-sectional views of some elements corresponding to a cross-section taken along a line A-A' of FIG. 3. FIGS. 4B, 5B, . . . , and 16B illustrate cross-sectional views of some elements corresponding to a cross-section taken along a line B-B' of FIG. 3. FIGS. 4C, 5C, . . . , and 16C illustrate cross-sectional views of some elements corresponding to a cross-section taken along a line C-C' of FIG. 3. FIGS. 4D, 5D, . . . , and 16D illustrate cross-sectional views of some elements corresponding to a cross-section taken along a line D-D' of FIG. 3. FIGS. 4E, 5E, . . . , and 16E illustrate cross-sectional views of some elements of a core region and a peripheral circuit region CORE/PERI (hereinafter, referred to as a "peripheral circuit region") around the cell array region of the semiconductor device 100A. The elements shown in FIGS. 4E, 5E, . . . , and 16E may correspond to some elements of a core region of the semiconductor device 100A or a peripheral circuit region.

Referring to FIGS. 4A through 4E, isolating trenches 112 may be formed in a substrate 110, and then isolating layers 114 may be formed in the isolating trenches 112. A plurality of active regions 116 may be defined on the substrate 110 by the isolating layers 114. The plurality of active regions 116 may have relatively long island shapes having short axes and long axes, like the active regions AC of FIG. 3. A more detailed description of the substrate 110 is the same as that provided with respect to the substrate 16 in relation to FIG. 1A.

The isolating layer 114 may include a first insulating layer 114A and a second insulating layer 114B. The first insulating layer 114A and the second insulating layer 114B may be formed of different materials. For example, the first insulating layer 114A may be an oxide layer, and the second insulating layer 114B may be a nitride layer. In an implementation, the isolating layer 114 may have a single layer structure including one type of insulating layer, or a multilayer structure including a combination of three types of insulating layers.

A plurality of word line trenches 118 may be formed on the substrate 110. The plurality of word line trenches 118 may extend in parallel to each other and may have line shapes respectively across the plurality of active regions 16.

As shown in FIG. 4B, the plurality of word line trenches 118 having stepped bottom surfaces may be formed by etching the isolating layer 114 and the substrate 110 through separate etching processes to make an etching depth of the isolating layer 114 and an etching depth of the substrate 110 different from each other.

After a resultant structure including the plurality of word line trenches 118 is cleansed, a plurality of gate dielectric layers 120, a plurality of world lines 122, and a plurality of buried insulating layers 124 may be sequentially formed in the plurality of word line trenches 118.

In an implementation, after the plurality of world lines 122 are formed, source/drain regions may be formed on top surfaces of the plurality of active regions 116 by injecting impurity ions into the substrate 110 from both sides of the plurality of world lines 122. In an implementation, before the plurality of world lines 122 are formed, a process of injecting impurity ions may be performed to form the source/drain regions.

Top surfaces 122T of the plurality of world lines 122 may be provided at lower levels than those of a top surface 110T of the substrate 110. Bottom surfaces of the plurality of world lines 122 may have uneven shapes, and a saddle fin type field-effect transistor (FinFET) may be formed on each of the plurality of active regions 116. In an implementation, the plurality of world lines 122 may be formed of at least one material selected from, e.g., titanium (Ti), titanium nitride (TiN), tantalum (Ta), tantalum nitride (TaN), tungsten (W), tungsten nitride (WN), titanium silicon nitride (TiSiN), and tungsten silicon nitride (WSiN).

The gate dielectric layers 120 may be formed of at least one selected from, e.g., a silicon oxide, a silicon nitride, a silicon oxynitride, oxide/nitride/oxide (ONO), and a high-k dielectric film having a dielectric constant higher than that of the silicon oxide. For example, the gate dielectric layers 120 may have a dielectric constant of about 10 to about 25. In an implementation, the gate dielectric layers 120 may be formed of at least one material selected from, e.g., hafnium oxide (HfO), hafnium silicate (HfSiO), hafnium oxynitride (HfON), hafnium silicon oxynitride (HfSiON), lanthanum oxide (LaO), lanthanum aluminum oxide (LaAlO), zirconium oxide (ZrO), zirconium silicate (ZrSiO), zirconium oxynitride (ZrON), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide ($AlO_x$), and lead scandium tantalum oxide (PbScTaO). For example, the gate dielectric layers 120 may be formed of $HfO_2$, $Al_2O_3$, $HfAlO_3$, $Ta_2O_3$, or $TiO_2$.

Top surfaces 124T of the plurality of buried insulating layers 124 may be provided at the approximately same level as the top surface 11T of the substrate 110. The buried insulating layers 124 may be formed of, e.g., a silicon oxide, a silicon nitride, a silicon oxynitride, or a combination thereof.

An insulating film pattern 130 may be formed on the substrate 110. The insulating film pattern 130 may have a thickness of about 200 to about 400 Å. The insulating film pattern 130 may include a silicon oxide. For example, the insulating film pattern 130 may be formed of tetraethylorthosilicate (TEOS), high density plasma (HDP), or boro-phospho silicate glass (BPSG).

The insulating film pattern 130 may include a plurality of openings 130H exposing a plurality of source regions 116S among the plurality of active regions 116.

Thereafter, a plurality of direct contacts 132 electrically connectable to the source regions 116S of the plurality of active regions 116 may be formed by filling conductive materials into the plurality of openings 130H formed in the insulating film pattern 130.

A plurality of bit line stacked structures 140 (extending in parallel to each other) may be formed on the insulating film pattern 130 and the plurality of direct contacts 132. The plurality of bit line stacked structures 140 may include a plurality of bit lines 142, and a plurality of insulating capping layers 144 covering top surfaces of the plurality of bit lines 142. The plurality of bit lines 142 may be electrically connected to the plurality of direct contacts 132.

In an implementation, the plurality of bit lines 142 may be formed of at least one material selected from, e.g., a semiconductor doped with impurities, a metal, a conductive metal nitride, and metal silicide. In an implementation, the plurality of bit lines 142 may have a multilayer structure in which a first metal silicide layer, a conductive barrier layer, a second metal silicide layer, and an electrode layer formed of metal or a metal nitride are sequentially stacked. For example, the plurality of bit lines 142 may have a stacked structure in which doped polysilicon, TiN, and tungsten are sequentially stacked.

In an implementation, the plurality of insulating capping layers 144 may be formed of, e.g., a silicon nitride. Thicknesses of the plurality of insulating capping layers 144 may be greater than thicknesses of the plurality of bit lines 142.

In an implementation, in order to form the plurality of bit line stacked structures 140, a bit line forming conductive layer, and an insulating layer that covers the bit line forming conductive layer are formed on the insulating film pattern 130. A thickness of the insulating layer may be greater than a thickness of the bit line forming conductive layer. The plurality of insulating capping layers 144 may be formed by patterning the insulating layer, and then the plurality of bit lines 142 may be formed by etching the bit line forming conductive layer by using the plurality of insulating capping layers 144 as an etching mask. In an implementation, a stepped portion 130A may be formed on a top surface of the insulating film pattern 130 by etching a part of the insulating film pattern 130 through excessive etching performed on the bit line forming conductive layer.

In an implementation, the bit line forming conductive layer may have, e.g., a multilayer structure. For example, the bit line forming conductive layer may have a multilayer structure in which a first metal silicide layer, a conductive barrier layer, a second metal silicide layer, and an electrode layer formed of a metal or a conductive metal nitride are sequentially stacked.

Insulating spacers 148, 150, and 152 may cover both side walls of the plurality of bit line stacked structures 140. The insulating spacers 148, 150, and 152 may be formed of a silicon oxide, a silicon nitride, or a combination thereof. In an implementation, the insulating spacers 148, 150, and 152 may have, e.g., a three layer structure. In an implementation, the insulating spacers 148, 150, and 152 may have a single layer structure or a double layer structure.

Spaces 146 (having widths in an X direction limited by the insulating spacers 148, 150, and 152) may remain between the plurality of bit line stacked structures 140. The spaces 146 may have line shapes.

As shown in FIG. 4E, a gate structure 240 (having a stacked structure formed of the same material as those of the plurality of bit line stacked structures 140) may be formed in the peripheral circuit region CORE/PERI. The gate structure 240 may include a gate insulating layer 230, a gate electrode 242, and an insulating capping layer 244 covering a top surface of the gate electrode 242. The material of the gate electrode 242 may be the same as those of the plurality of bit lines 142.

Insulating spacers 248, 250, and 252 may cover both side walls of the gate structure 240. The insulating spacers 248, 250, and 252 may be formed of an insulating material including a silicon oxide, a silicon nitride, or a combination thereof. In an implementation, the insulating spacers 248, 250, and 252 may have, e.g., a three layer structure. In an implementation, the insulating spacers 248, 250, and 252 may have, e.g., a single layer structure or a double layer structure.

An interlayer insulating layer 256 may be formed around the gate structure 240. The interlayer insulating layer 256 may be formed of an oxide, a nitride, silicon oxynitride, or a combination thereof. In an implementation, the interlayer insulating layer 256 may include an etching prevention layer 258 exposed from a top surface thereof. The etching prevention layer 258 may be used as, e.g., an etching stop layer along with the insulating spacers 248, 250, and 252 and the insulating capping layer 244 during an etching process for forming an insulating space 172 that will be described below with reference to FIGS. 8A through 8E. In an implementation, the etching prevention layer 258 may be formed of a silicon nitride. In an implementation, the etching prevention layer 258 may be omitted.

Referring to FIGS. 5A through 5E, a plurality of insulating patterns 154 (filling the spaces 146 (see FIGS. 4A, 4B, and 4D) of the plurality of bit line stacked structures 140) may be formed in a cell array region.

In an implementation, to form the plurality of insulating patterns 154, insulating layers filling the spaces 146 of the plurality of bit line stacked structures 140 may be formed and then etched back by using chemical mechanical polishing (CMP) to expose top surfaces of the plurality of bit line stacked structures 140. Thus, the plurality of insulating patterns 154 may remain in the spaces 146. In an implementation, the plurality of insulating patterns 154 may be formed of a nitride, an oxide, or a combination thereof.

Referring to FIGS. 6A through 6E, after a mask pattern (not shown) in a predetermined shape is formed on a resultant of the plurality of insulating patterns 154, a part of the plurality of insulating patterns 154 may be removed by using the mask pattern as an etching mask, and a plurality of lower insulating patterns 154A for defining a plurality of contact holes 154H may be formed. Thereafter, the mask pattern may be removed.

After the plurality of lower insulating patterns 154A are formed, the insulating spacers 148 and 152 exposed through bottom surfaces of the plurality of contact holes 154H may be sequentially etched from upper portions thereof, the insulating layer pattern 130 exposed as a result of etching the insulating spacers 148 and 152 and a part of the substrate 110 below the exposed insulating layer pattern 130 may be sequentially etched, and the substrate 110 may be exposed through the bottom surfaces of the plurality of contact holes 154H.

First metal silicide layers 158 may be formed on a surface of the substrate 110 that is exposed through the bottom surfaces of the plurality of contact holes 154H. For example, the first metal silicide layers 158 may be formed of cobalt silicide. In an implementation, the first metal silicide layers 158 may be formed of a material selected from various types of metal silicides.

In an implementation, the following processes of forming the first metal silicide layers 158 may be performed. After metal layers are deposited on the surface of the substrate 110 that is exposed through the bottom surfaces of the plurality of contact holes 154H, first rapid thermal silicidating (RTS) may be performed. The first RTS may be performed at a temperature of about 450 to about 550° C. After a metal layer that does not react with Si atoms during the first RTS is removed, second RTS may be performed to form the first metal silicide layers 158. In an implementation, the first metal silicide layers 158 formed of cobalt silicide may be formed by forming Co layers as the metal layers. In an implementation, the processes of forming the first metal silicide layers 158 may be skipped.

Referring to FIGS. 7A through 7E, a contact forming conductive layer 160 (that fills the plurality of contact holes 154H (see FIGS. 6A and 6D) and covers the plurality of bit line stacked structures 150) may be formed.

Figure 7E:
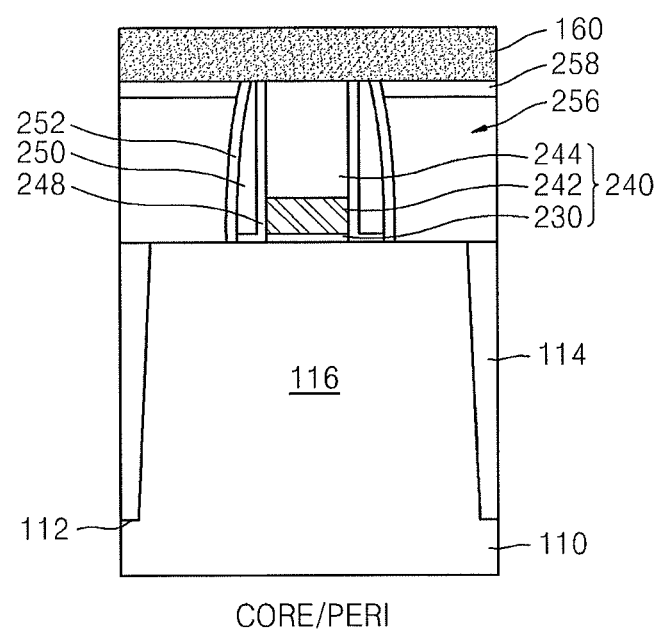

In an implementation, the contact forming conductive layer 160 may cover the gate structure 240 and the interlayer insulating layer 256 that are formed in the peripheral circuit region CORE/PERI in FIG. 7E.

In an implementation, the contact forming conductive layer 160 may be formed of doped polysilicon. In an implementation, the contact forming conductive layer 160 may include a barrier layer (not shown) covering inner walls of the plurality of contact holes 154H and a conductive layer (not shown) on the barrier layer and filling the plurality of contact holes 154H. In this regard, the barrier layer may be formed of a Ti/TiN stacked structure. The conductive layer may be formed of doped polysilicon, metal, metal silicide, a conductive metal nitride, or a combination thereof.

Referring to FIGS. 8A through 8E, after a mask pattern 170 is formed on the contact forming conductive layer 160 in the cell array region, a plurality of buried contacts 160C may be formed by etching the contact forming conductive layer 160 by using the mask pattern 170 as an etching mask.

Similar to the plurality of buried contacts BC of FIG. 3, the mask pattern 170 may include a plurality of island type mask patterns disposed corresponding to a location in which the plurality of buried contacts 160C are formed and spaced part from each other. The plurality of island type mask patterns may be disposed only in the cell array region, and may not be formed in the peripheral circuit region CORE/PERI. In an implementation, the mask pattern 170 may be formed of a silicon nitride.

The plurality of buried contacts 160C may include contact plugs 160A filling the plurality of contact holes 154H and preparatory landing pads 160B integrally connected to the contact plugs 160A, extending from the contact pugs 160A to upper portions of the bit line stacked structures 140, and covering top surfaces of the bit line stacked structures 140 so that the preparatory landing pads 160B may vertically overlap with the bit lines 142.

The contact plugs 160A may extend in a perpendicular direction, e.g., a direction (a Z direction) perpendicular to a direction in which a main surface of the substrate 110 extends in the plurality of contact holes 154H (see FIGS. 6A and 6D). The contact plugs 160A may have first size horizontal cross-sectional areas (e.g., horizontal cross-sectional areas having a first size) that are limited by sizes of the contact holes 154H. The preparatory landing pads 160B may extend from upper portions of the contact plugs 160A in a horizontal direction, e.g., a direction parallel to the direction in which the main surface of the substrate 110 extends. The preparatory landing pads 160B may have second size horizontal cross-sectional areas (e.g., horizontal cross-sectional areas having a second size) larger than the first size horizontal cross-sectional areas. For example, the second size may be larger or greater than the first size.

In a direction (X direction) parallel to a direction in which the word lines 122 extend, second widths W2 of the preparatory landing pads 160B may be greater than first widths W1 of the contact plugs 160A.

Figure 8C:
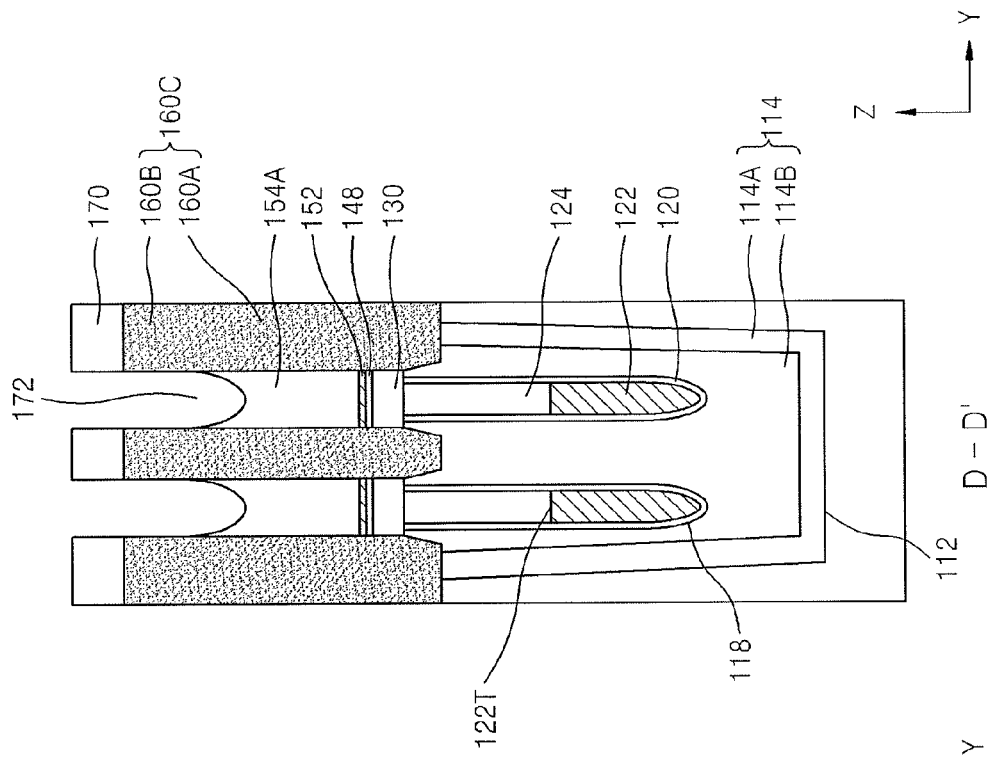
Figure 8D:
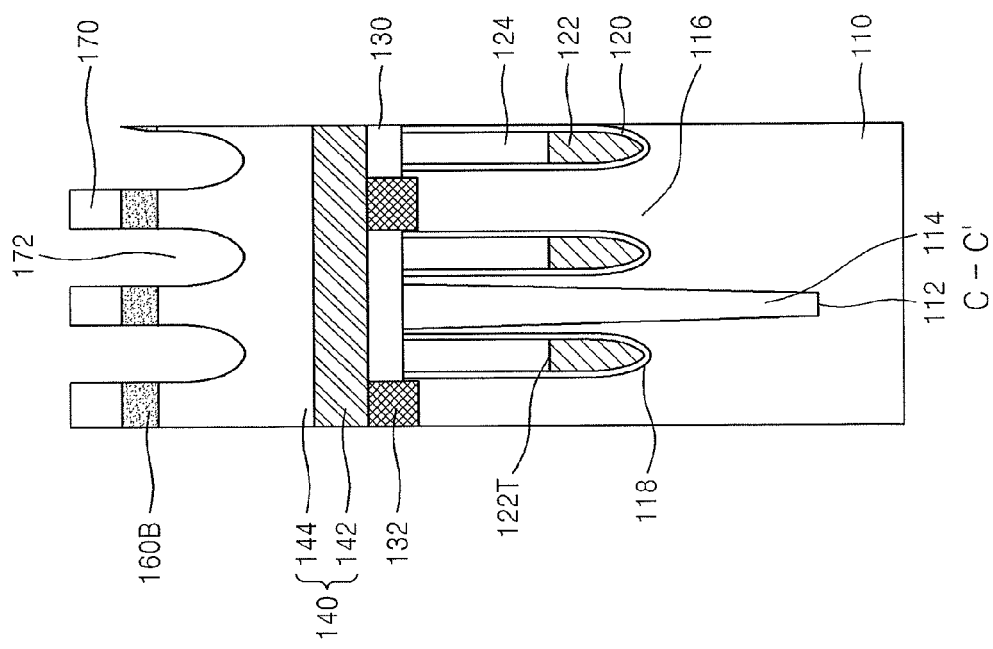
Figure 8E:
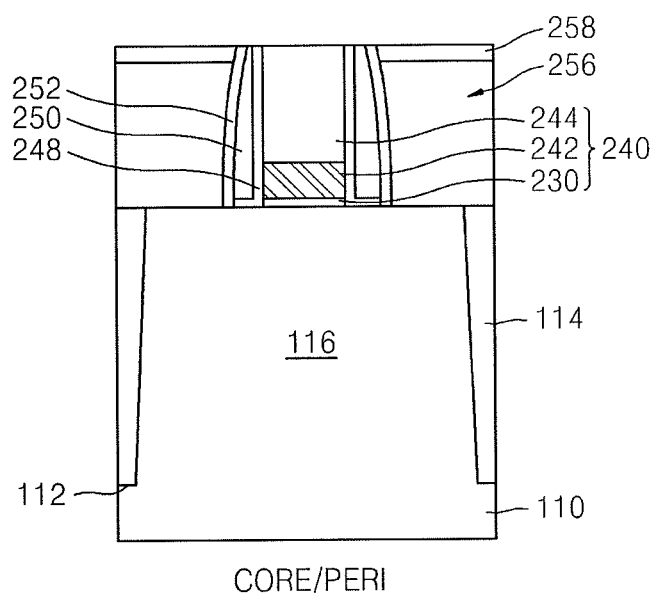
Figure 9B:
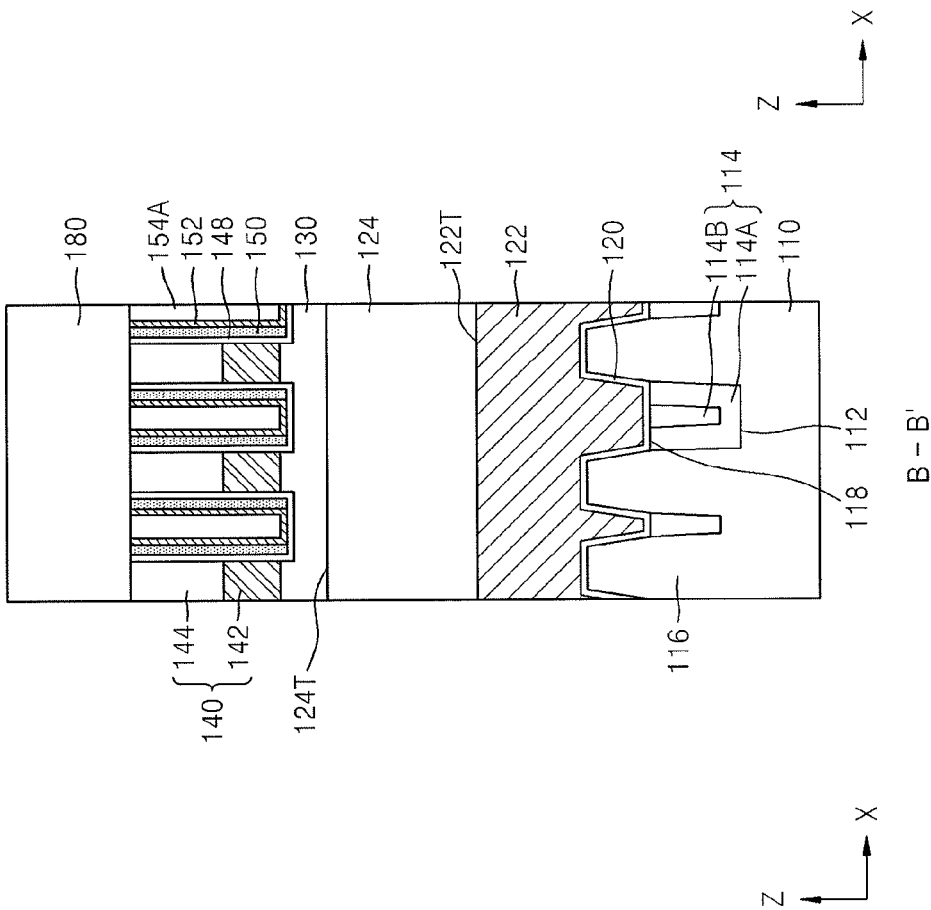
Figure 9A:
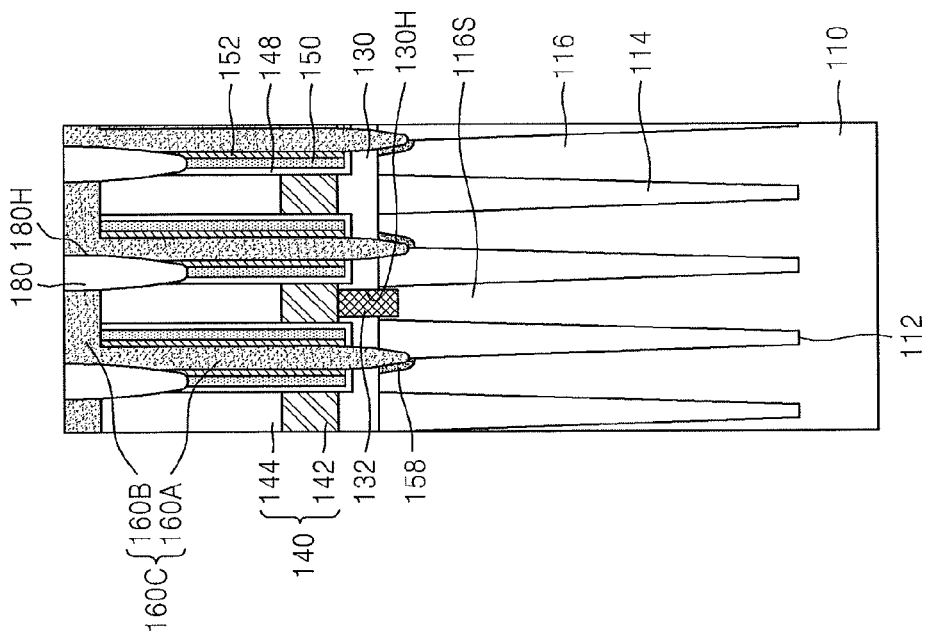
Figure 9E:
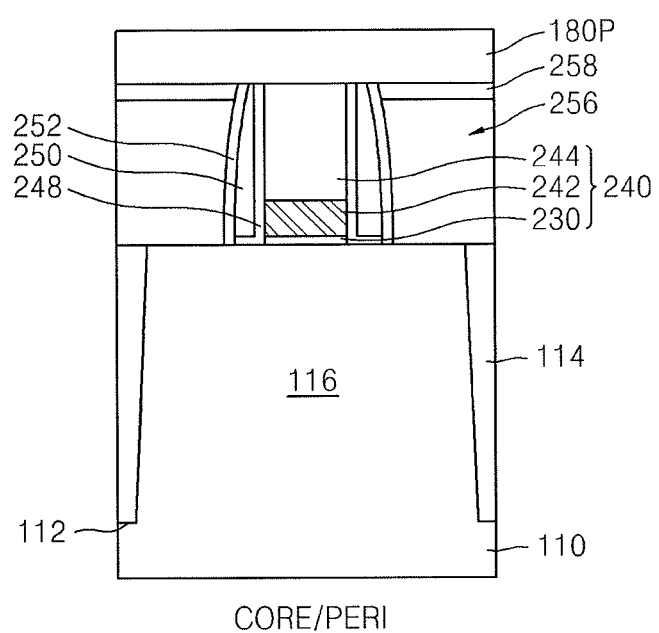
Figure 10E:
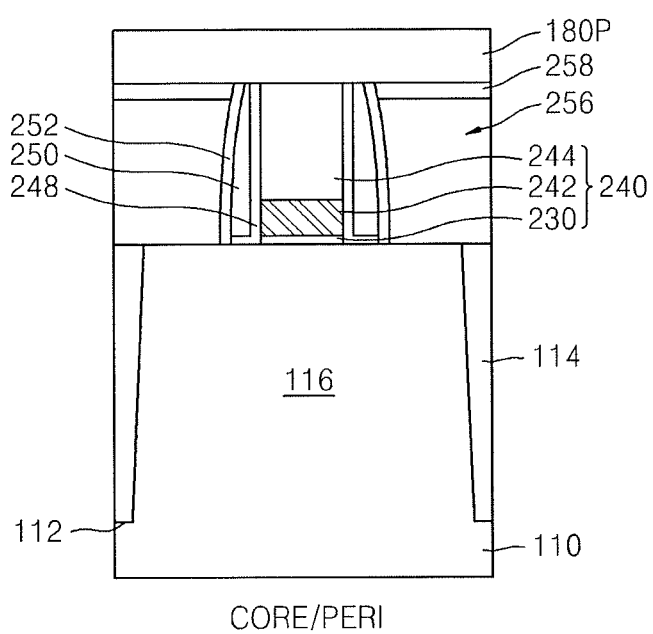
Figure 11E:
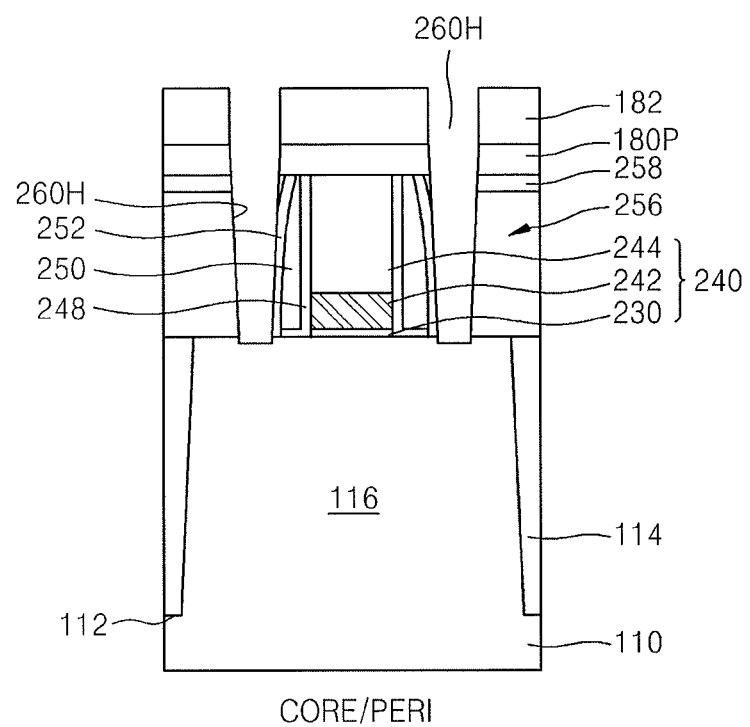
Figure 12E:
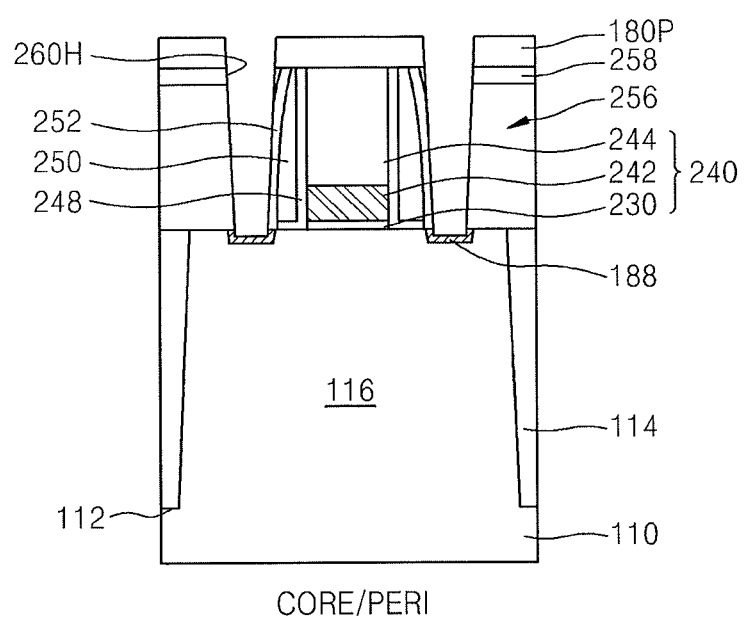
Figure 13A:
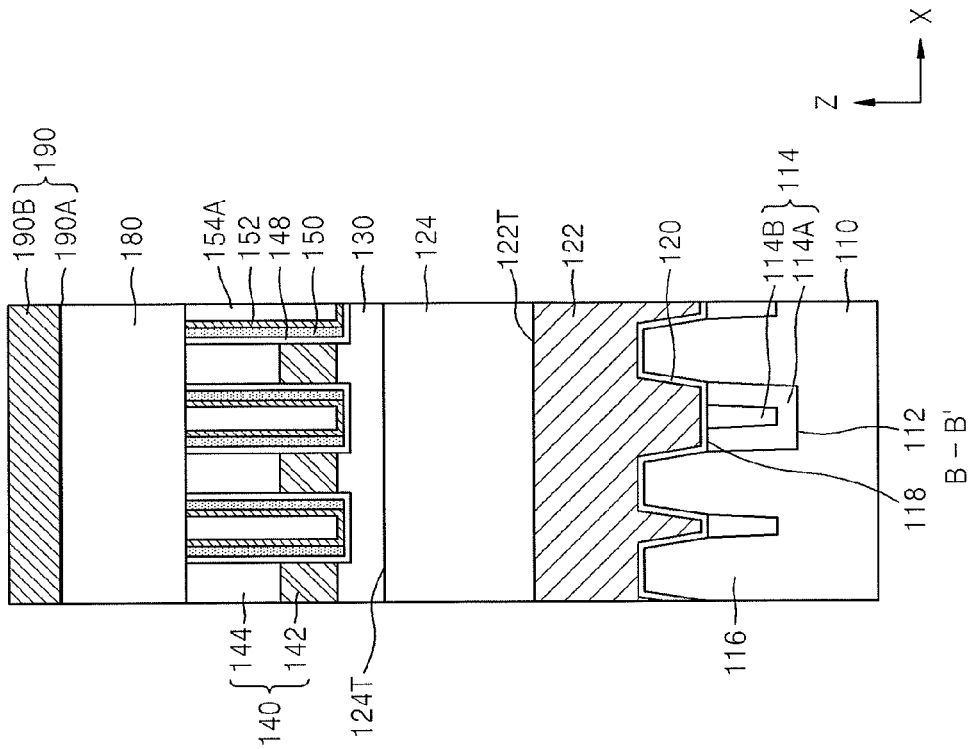
Figure 13B:
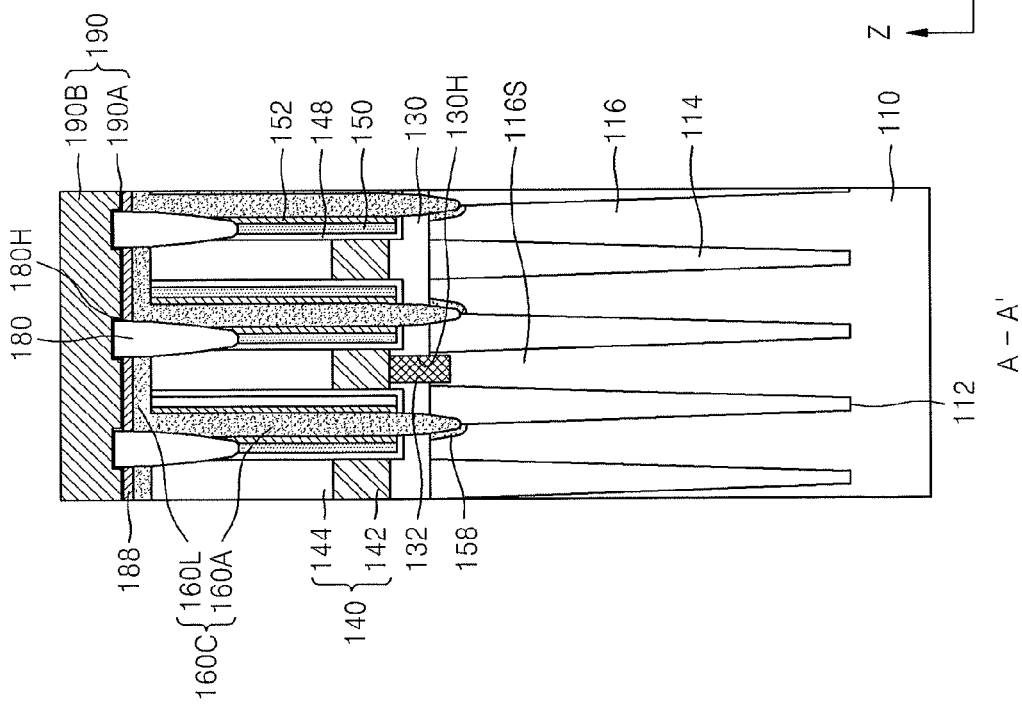
Figure 13E:
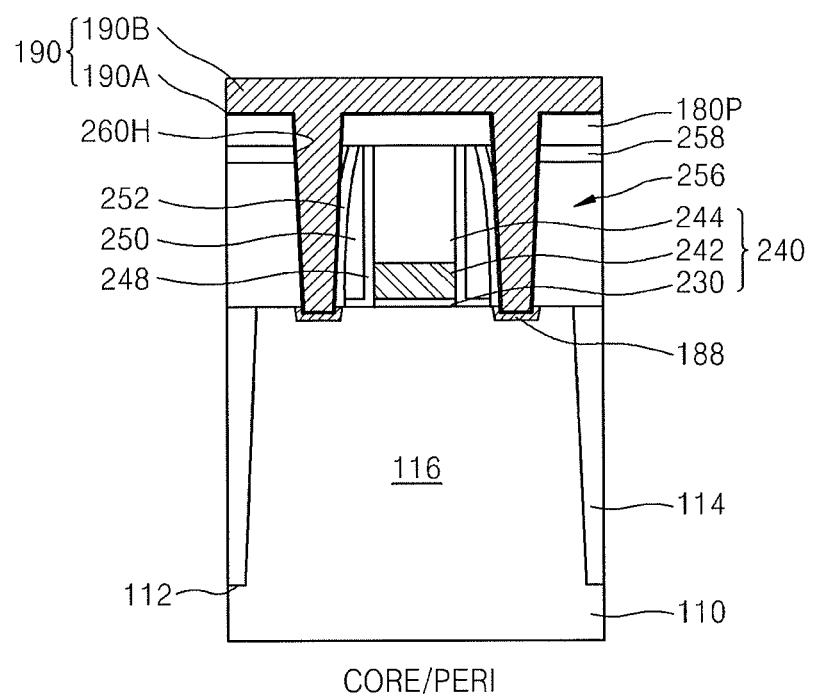
Figure 14B:
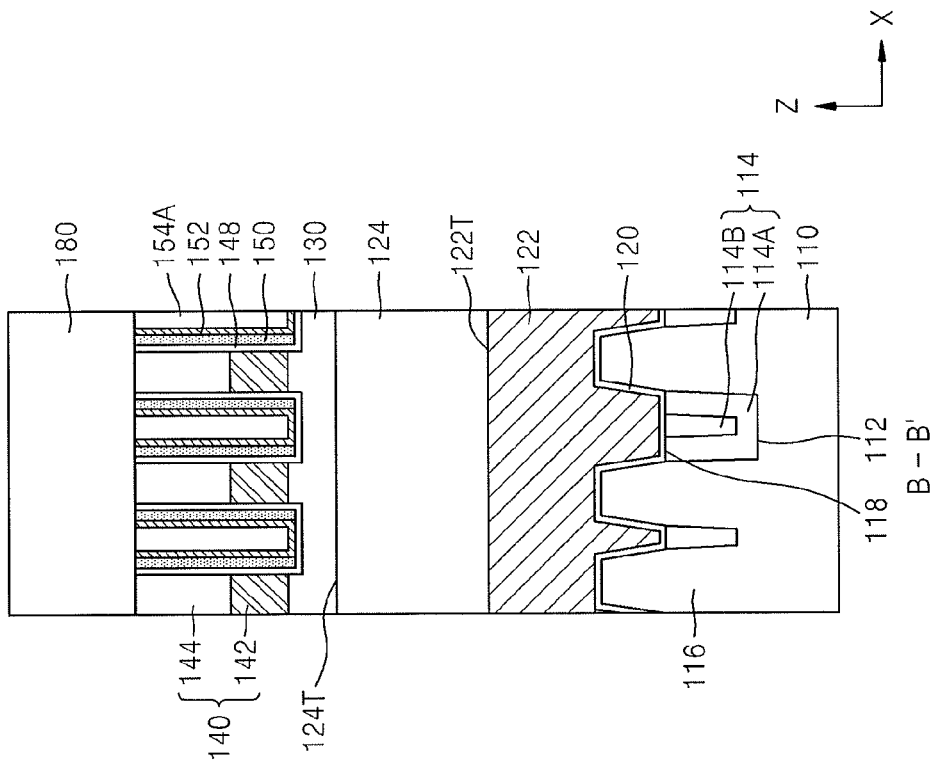
Figure 14A:
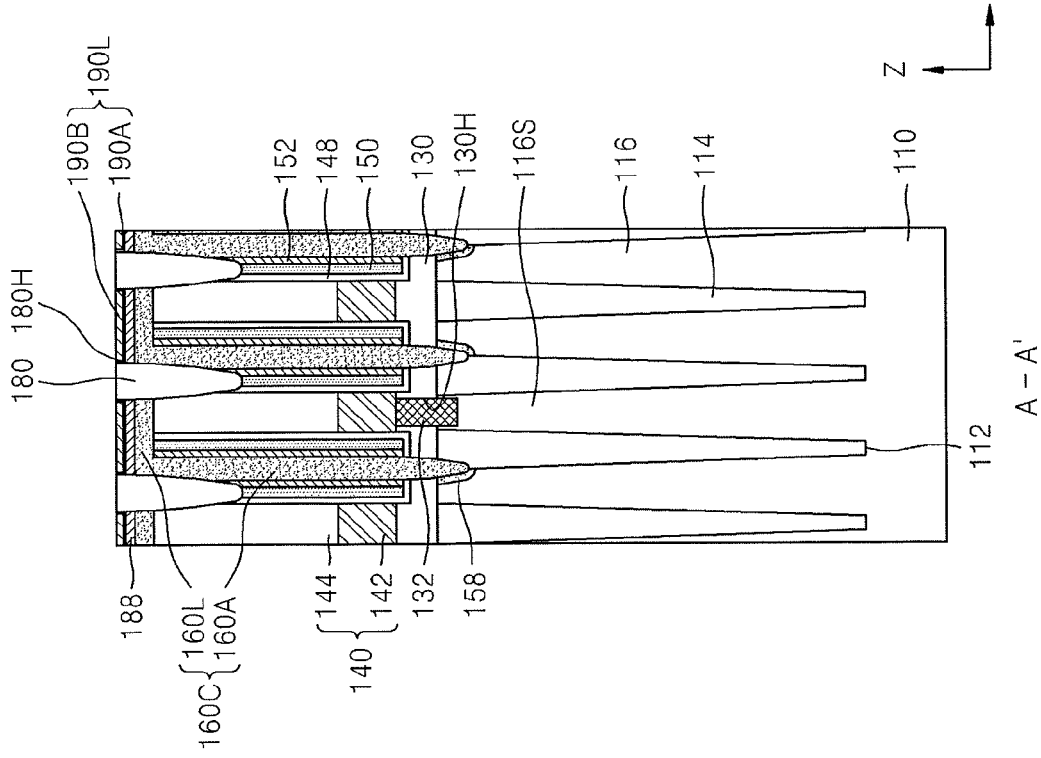
Figure 14E:
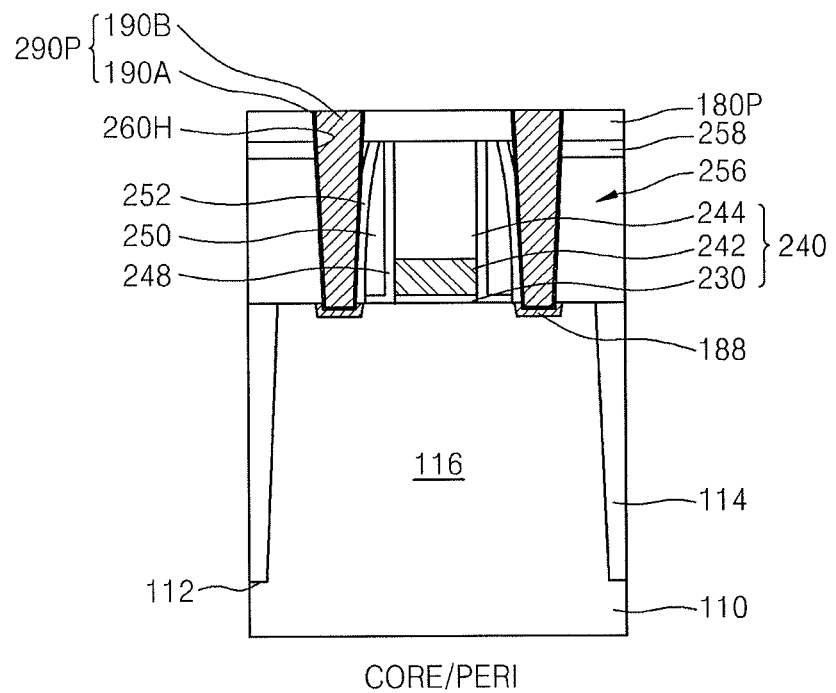
Figure 15B:
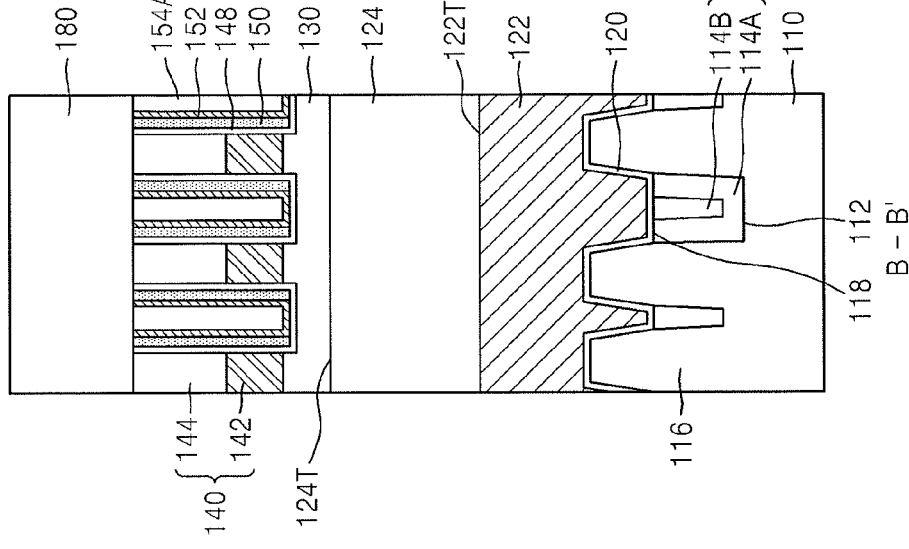
Figure 15A:
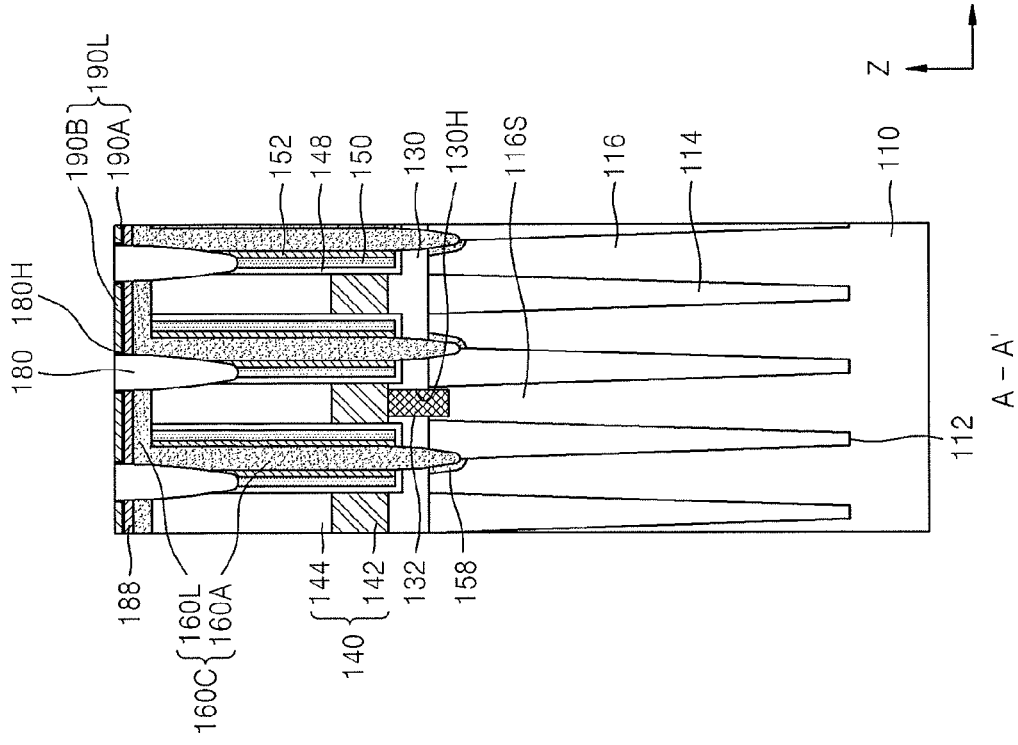
Figure 15C:
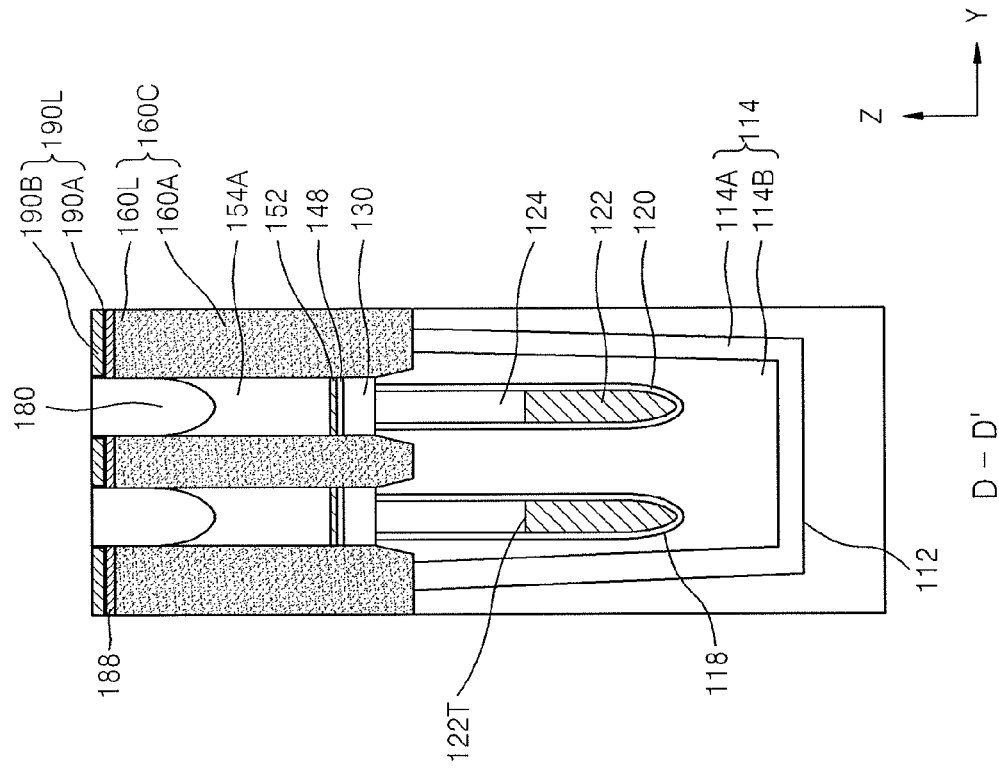
Figure 15D:
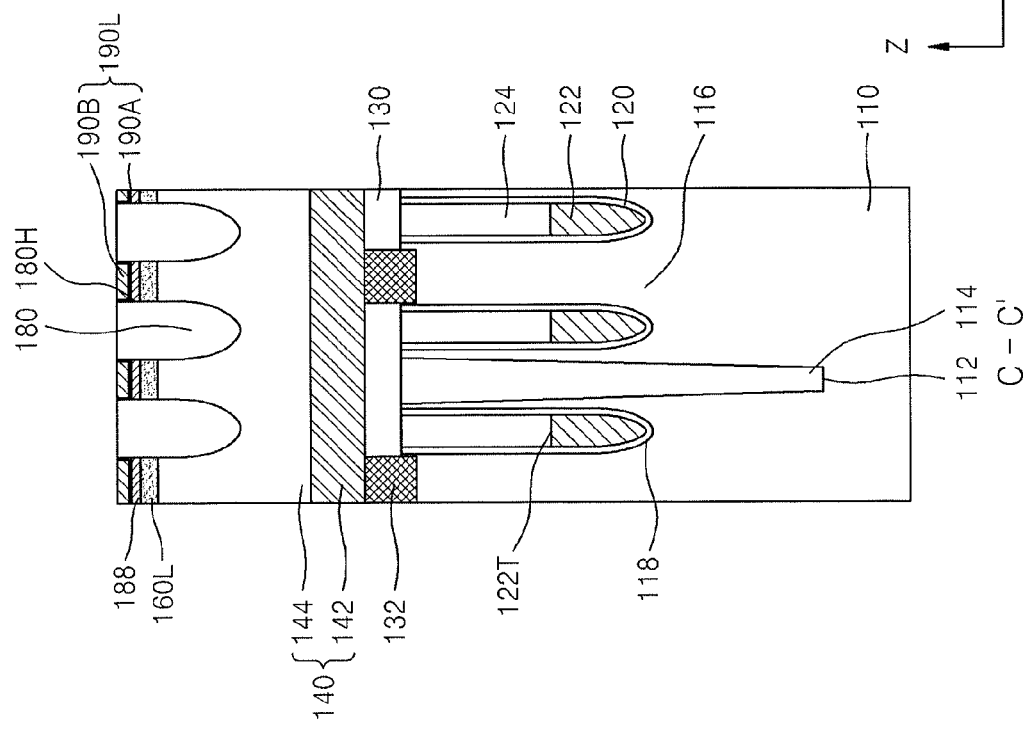
Figure 15E:
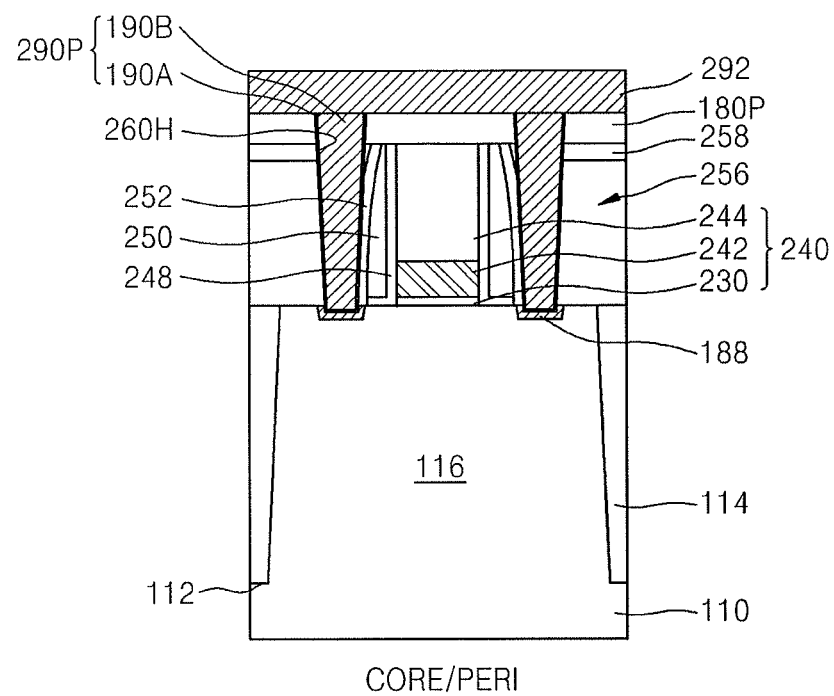

While the contact forming conductive layer 160 is etched by using the mask pattern 170 as the etching mask in the cell array region, insulating spaces 172 may be formed around the plurality of buried contacts 160C by removing a part of the plurality of insulating capping lines 144 and a part of the insulating spacers 148, 150, and 152 around the plurality of buried contacts 160C. A part of the insulating capping lines 144 and a part of the insulating spacers 148, 150, and 152 may be exposed through the insulating spaces 172. The contact forming conductive layer 160 may be removed from the peripheral circuit region CORE/PERI as shown in FIG. 8E.

Referring to FIGS. 9A through 9E, after the mask pattern 170 may be removed from a resultant of FIGS. 8A through 8E, upper insulating patterns 180 filling the insulating spaces 172 may be formed.

In an implementation, to form the upper insulating patterns 180, after insulating materials are deposited on a resultant exposing the insulating spaces 172 in the cell array region and the peripheral circuit region CORE/PERI, and an insulating layer (not shown) having sufficient thicknesses to fill the insulating spaces 172 is formed, CMP or etching back may be performed on the insulating layer until the plurality of buried contacts 160C are exposed. Thus, the upper insulating patterns 180 may remain in the insulating spaces 172 in the cell array region, and an insulating layer 180P (covering the gate structure 240 and the interlayer insulating layer 256) may remain in the peripheral circuit region CORE/PERI.

The upper insulating patterns 180 may include a plurality of landing pad holes 180H surrounding side walls of the plurality of preparatory landing pads 160B. For example, the plurality of preparatory landing pads 160B may be disposed in a landing pad region defined by the plurality of landing pad holes 180H respectively formed in the upper insulating patterns 180.

The upper insulating patterns 180 may insulate the plurality of preparatory landing pads 160B from each other and may be between the plurality of preparatory landing pads 160B. In an implementation, the upper insulating patterns 180 may be formed of a silicon nitride.

Referring to FIGS. 10A through 10C, a plurality of first landing pads 160L (having top surfaces lower than those of the upper insulating patterns 180) may be formed by etching back top surfaces of the preparatory landing pads 160B (see FIGS. 9A, 9B, and 9D) of the plurality of buried contacts 160C by a predetermined thickness in the cell array region. The plurality of first landing pads 160L may fill a part of bottom sides of the corresponding landing pad holes 180H.

The plurality of first landing pads 160L may be integrally connected to the contact plugs 160A and may extend from the contact plugs 160A onto the bit line stacked structures 140 so that the plurality of first landing pads 160L may vertically overlap with the bit lines 142. In a direction parallel to a direction in which the word lines 122 extend, third widths W3 of the first landing pads 160L may be greater than the first widths W1 of the contact plugs 160A.

In an implementation, the preparatory landing pads 160b may be etched back to be deeper, such that the plurality of first landing pads 160L of FIGS. 10A through 10D may not remain. Thus, a device including the contact plugs 32P of FIGS. 2A and 2B may be formed.

Referring to FIGS. 11A through 11E, after a mask pattern 182 (covering the cell array region and the peripheral circuit region CORE/PERI excluding a portion in which a plurality of contact holes 260H are to be formed) is formed on the cell array region and the peripheral circuit region CORE/PERI of the substrate 110, a part of the insulating layer 180P and a part of the interlayer insulating layer 256 including the etching prevention layer 258 may be etched in the peripheral circuit region CORE/PERI by using the mask pattern 182 as an etching mask. Then, the plurality of contact holes 260H exposing the active regions 116 of the substrate 110 in both sides of the gate structure 250 may be formed.

Referring to FIGS. 12A through 12E, the mask pattern 182 may be removed from a resultant of FIGS. 11A through 11E, and second metal silicide layers 188 may be formed on a surface of the substrate 110 exposed through top surfaces of the plurality of first landing pads 160L in the cell array region and bottom surfaces of the plurality of contact holes 260H in the peripheral circuit region CORE/PERI. For example, the second metal silicide layers 188 may be formed of cobalt silicide. In an implementation, the second metal silicide layers 188 may be formed of a material selected from various types of metal silicides.

In an implementation, the second metal silicide layers 188 may be performed by using a method similar to the method of forming the first metal silicide layers 158 described above with reference to FIGS. 6A through 6E. In an implementation, processes of forming the second metal silicide layers 188 may be skipped.

In an implementation, when the contact plugs 32P of FIGS. 2A and 2B are formed by etching back the preparatory landing pads 160B to be deeper during the process described with reference to FIGS. 10A through 10E, the second metal silicide layers 188 may be formed on the contact plugs 32P.

Referring to FIGS. 13A through 13E, a conductive layer 190 (contacting the second metal silicide layers 188) may be formed on a resultant including the second metal silicide layers 188 in the cell array region and the peripheral circuit region CORE/PERI.

The conductive layer 190 may include a conductive barrier layer 190A and a metal layer 190B covering the conductive barrier layer 190A. The conductive barrier layer 190A of the conductive layer 190 may cover exposed surfaces of the second metal silicide layers 188 and exposed surfaces of the upper insulating patterns 180 in the cell array region, and may cover exposed surfaces of the second metal silicide layers 188 and exposed inner walls of the plurality of contact holes 260H in the peripheral circuit region CORE/PERI. The metal layer 190B of the conductive layer 190 may be on the conductive barrier layer 190A in the cell array region to fill a part of top sides of the landing pad holes 180H in the upper insulating patterns 180 and may fill the plurality of contact holes 260H in the peripheral circuit region CORE/PERI.

In an implementation, the conductive barrier layer 190A may have a Ti/TiN stacked structure. The metal layer 190B may be formed of tungsten.

Referring to FIGS. 14A through 14E, top surfaces of the upper insulating patterns 180 may be exposed by polishing the conductive layer 190 through CMP.

As a result, a plurality of second landing pads 190L (including portions of the conductive layer 190 remaining in the plurality of landing pad holes 180H in the upper insulating patterns 180) may be formed in the cell array region. The plurality of second landing pads 190L may fill a part of top sides of the corresponding landing pad holes 180H. As such, a plurality of contact structures (including the plurality of contact plugs 160A, the plurality of first landing pads 160L, the plurality of second metal silicide layers 188, and the plurality of second landing pads 190L) may be manufactured in the cell array region. The plurality of contact structures may correspond to the buried contacts BC of FIG. 3.

A plurality of contact plugs 290P (including the portions of the conductive layer 190 remaining in the contact holes 190H) may be formed in the peripheral circuit region CORE/PERI.

In an implementation, when the contact plugs 32P of FIGS. 2A and 2B are formed by etching back the preparatory landing pads 160B to be deeper during the process described with reference to FIGS. 10A through 10E, the landing pads 33P of FIGS. 2A and 2B may be formed on the contact plugs 32P by etching back the conductive layer 190.

Referring to FIGS. 15A through 15E, a wiring layer 292 contacting the plurality of contact plugs 290P may be formed on the upper insulating patterns 180 in the peripheral circuit region CORE/PERI.

In an implementation, to form the wiring layer 292, after a preparatory wiring layer (not shown) covering the upper insulating patterns 180 is formed on an entire surface of the substrate 110 including the cell array region and the peripheral circuit region CORE/PERI, the wiring layer 292 may remain in the peripheral circuit region CORE/PERI by selectively removing a portion of the preparatory wiring layer disposed in the cell array region by an etching-back process. In an implementation, to form the wiring layer 292, after a mask pattern is formed to expose the peripheral circuit region CORE/PERI and cover the cell array region, and the wiring layer 292 is selectively formed only in the peripheral circuit region CORE/PERI exposed through the mask pattern, the plurality of second landing pads 190L may be exposed in the cell array region by removing the mask pattern.

In an implementation, the wiring layer 292 may have a single metal layer structure or a multiple metal layer structure. In an implementation, the wiring layer 292 may include a semiconductor doped with impurities, a metal nitride, or metal silicide. For example, the wiring layer 292 may be formed of tungsten.

In an implementation, the wiring layer 292 may be formed of the same material as that of the metal layer 190B constituting the second landing pads 190L in the cell array region or the metal layer 190B constituting the contact plugs 290P in the peripheral circuit region CORE/PERI. In an implementation, the wiring layer 292 may be formed of a different material from that of the metal layer 190B constituting the second landing pads 190L in the cell array region or the metal layer 190B constituting the contact plugs 290P in the peripheral circuit region CORE/PERI.

Referring to FIGS. 16A through 16E, a plurality of wiring patterns 292P may be formed in the peripheral circuit region CORE/PERI by removing a part of the wiring layer (see FIG. 15E) in the peripheral circuit region CORE/PERI.

Figure 16A:
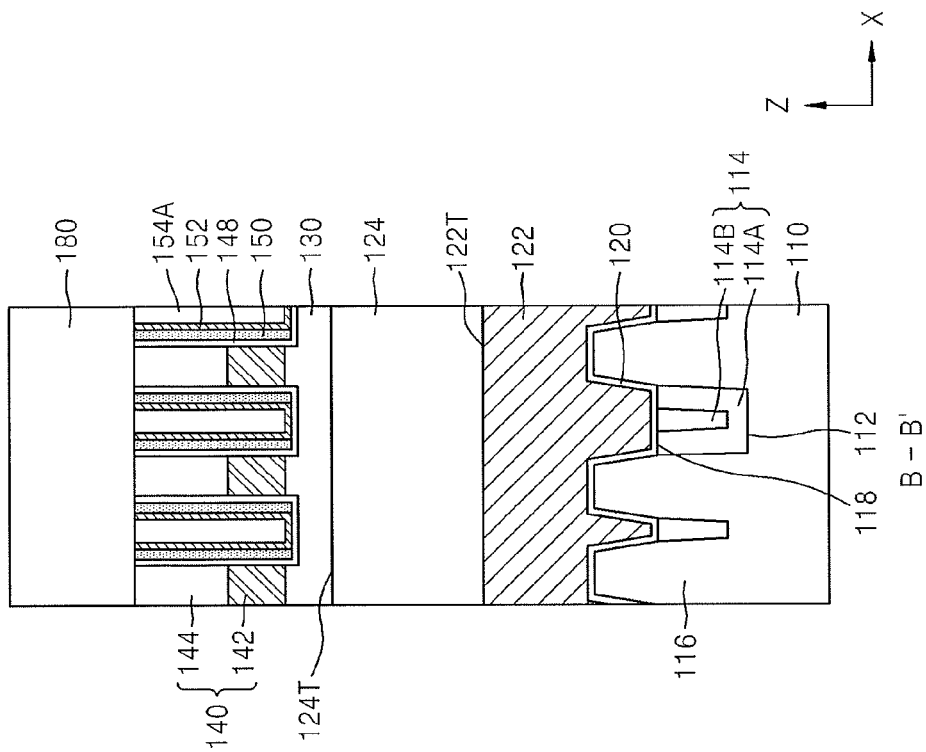
Figure 16B:
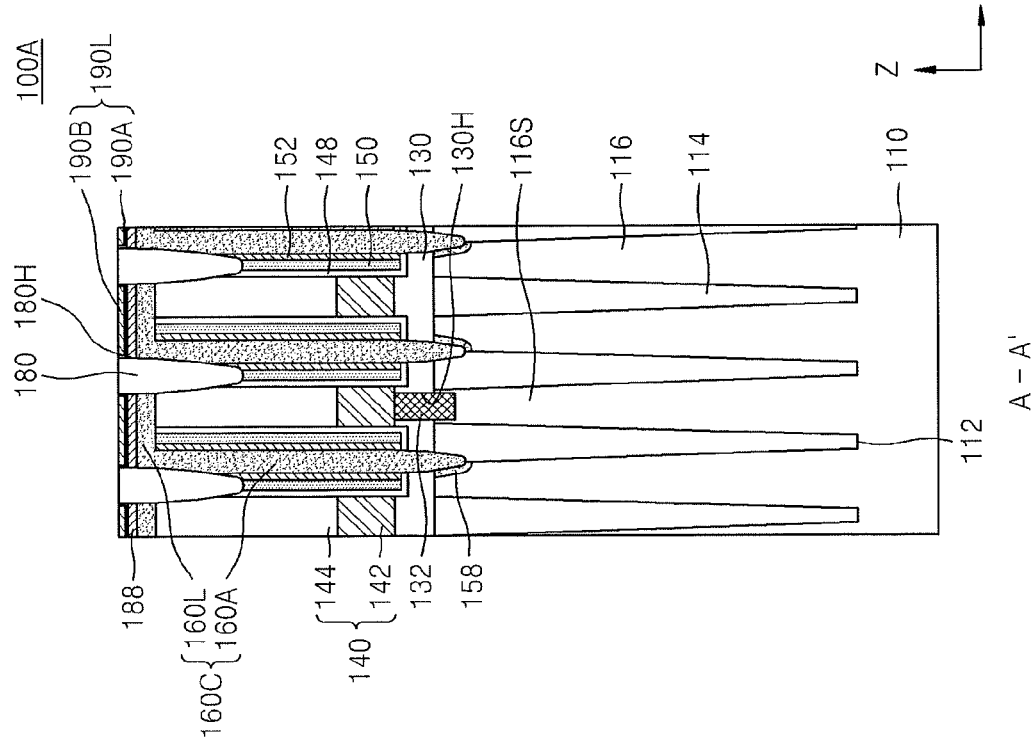
Figure 16C:
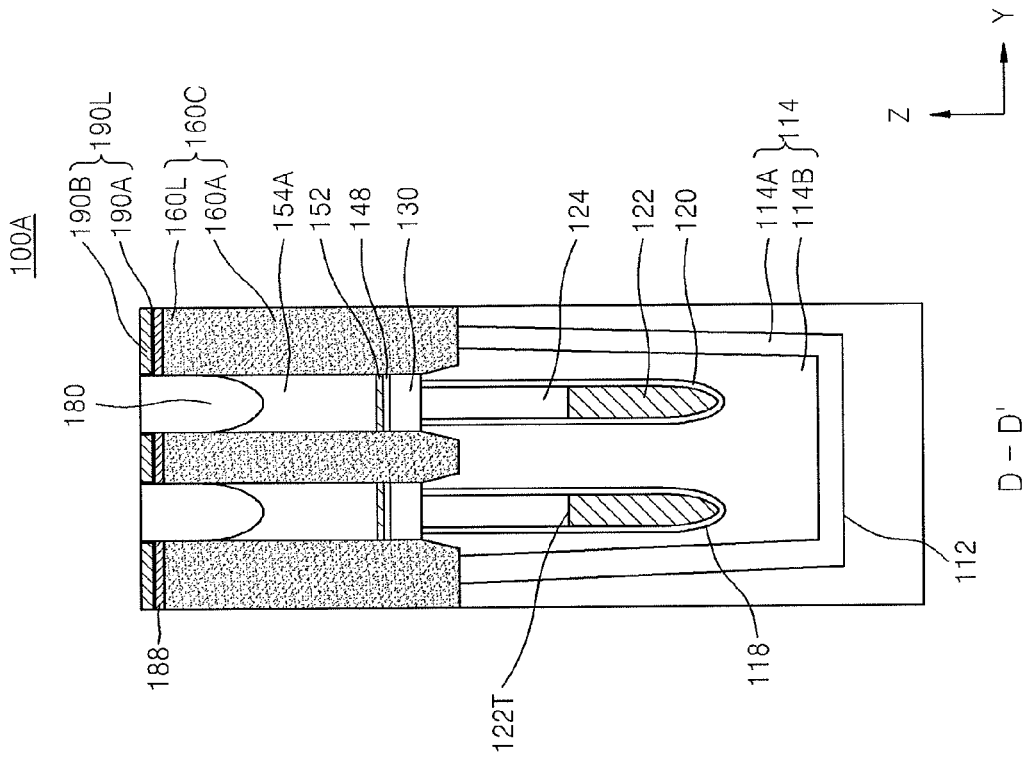
Figure 16D:
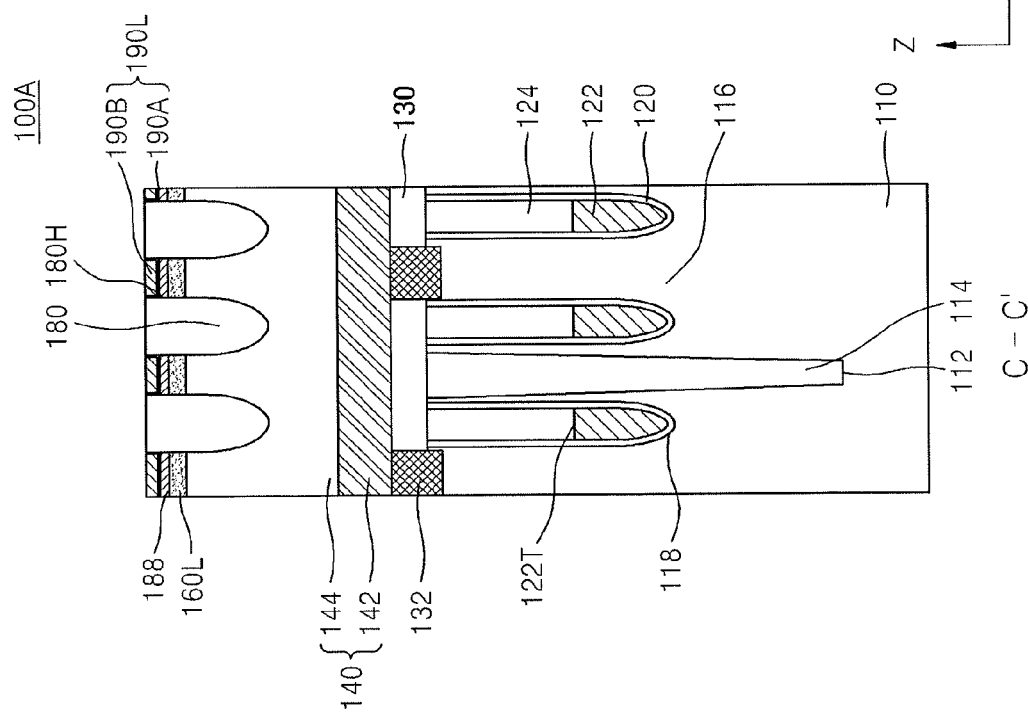
Figure 16E:
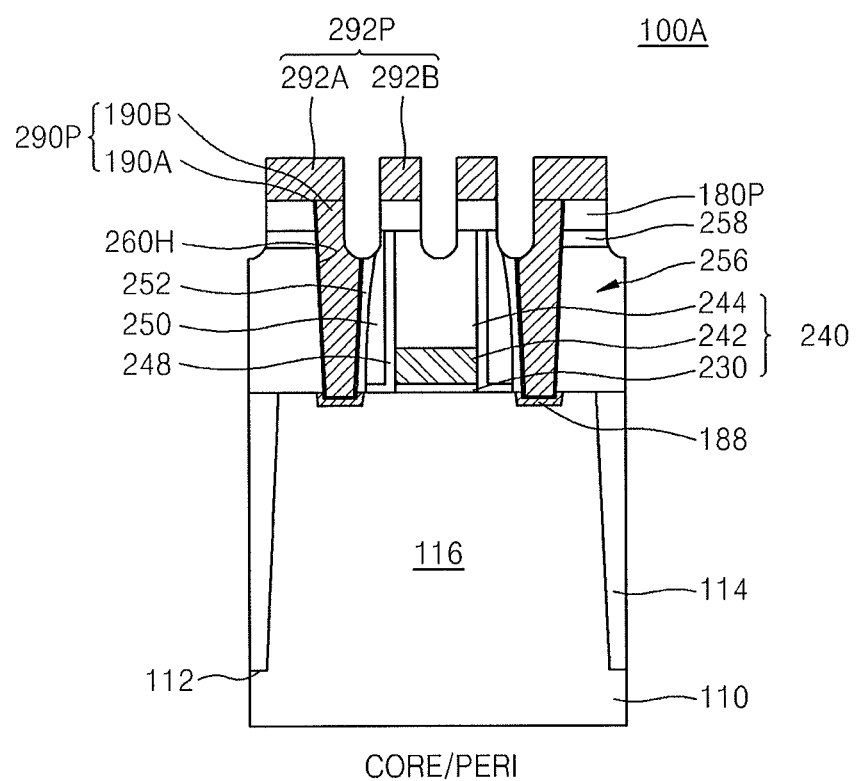

As shown in FIG. 16E, when the part of the wiring layer 292 is removed, at least a part of the upper insulating patterns 180, the interlayer insulating layer 256, the contact plugs 290P, and the insulating spacers 248, 250, and 252 (that are disposed in lower portions of the wiring layer 292) may be removed.

The plurality of wiring patterns 292P may include a plurality of first wiring patterns 292A (connected to the plurality of contact plugs 290P) and at least one second wiring pattern 292B (that is not connected to the plurality of wiring patterns 292P).

Thereafter, a plurality of capacitor lower electrodes (not shown) that are electrically connectable to the second landing pads 190L may be formed in the cell array region. The plurality of capacitor lower electrodes may correspond to the plurality of lower electrodes ST of FIG. 3.

In the semiconductor device 100A according to the embodiments described with reference to FIGS. 4A through 16E, contact structures for electrically connecting the active regions 116 of the substrate 110 and capacitor lower electrodes may include the contact plugs 160A (connected to the active regions 116), the first landing pads 160L (integrally connected to the contact plugs 160A and covering the bit line stacked structures 140 so that the first landing pads 160L may vertically overlap with the bit lines 142), and the second landing pads 190L (on the bit line stacked structures 140 and formed on the first landing pads 160L with the second metal silicide layers 188 therebetween). The capacitor lower electrodes may be connected to the second landing pads 190L. The first landing pads 160L and the second landing pads 190L may contact each other through the second metal silicide layers 188 not in relatively narrow spaces between the two neighboring bit lines stacked structures 140, but rather in upper portions of the plurality of bit line stacked structures 140, thereby increasing contact areas between the first landing pads 160L and the second landing pads 190L through the second metal silicide layers 188. Furthermore, the upper insulating patterns 180 (for providing sufficient insulating spaces between neighboring contact structures) may be provided and may help reduce the likelihood of and/or prevent the neighboring contact structures from being shorted.

FIGS. 17A through 23B illustrate cross-sectional views of stages in a method of manufacturing a semiconductor device 100B (see FIGS. 23A and 23B) according to another embodiment.

Figure 17B:
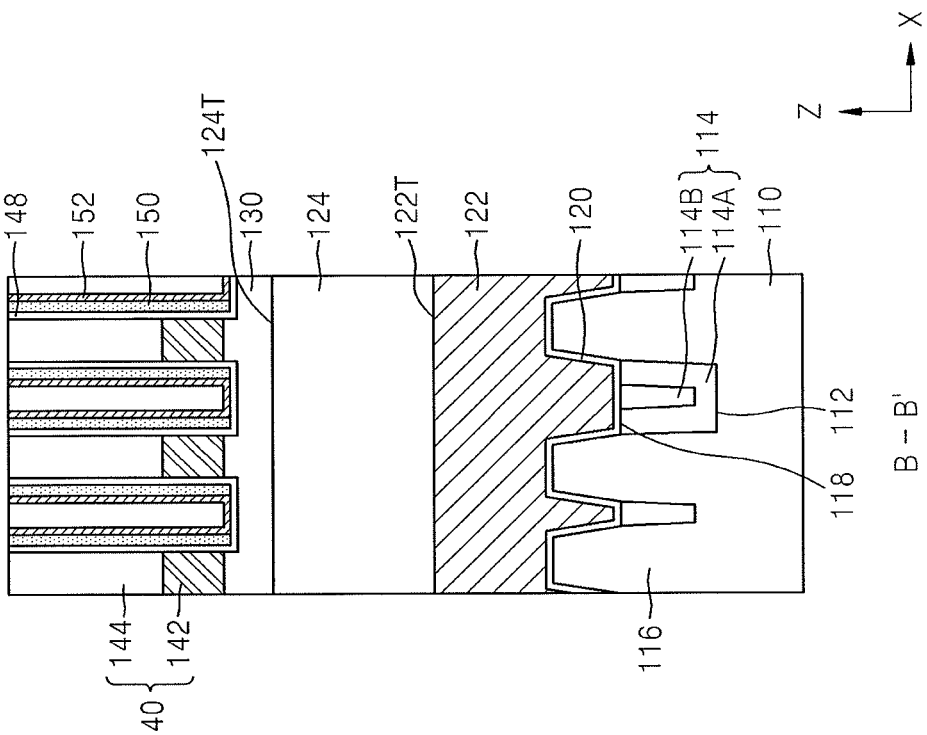
Figure 17A:
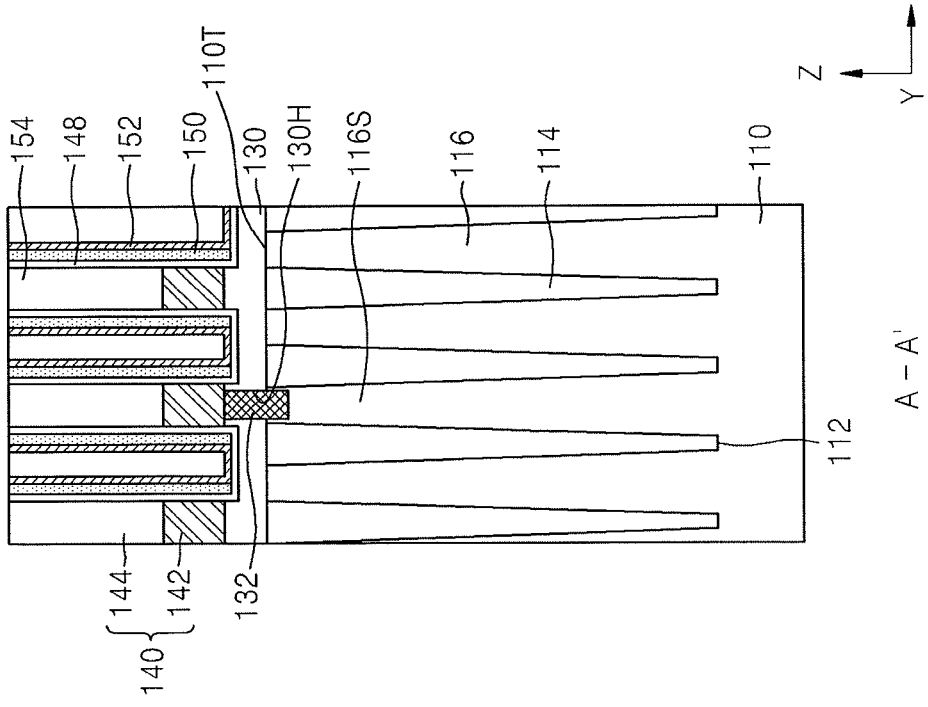
Figure 18A:
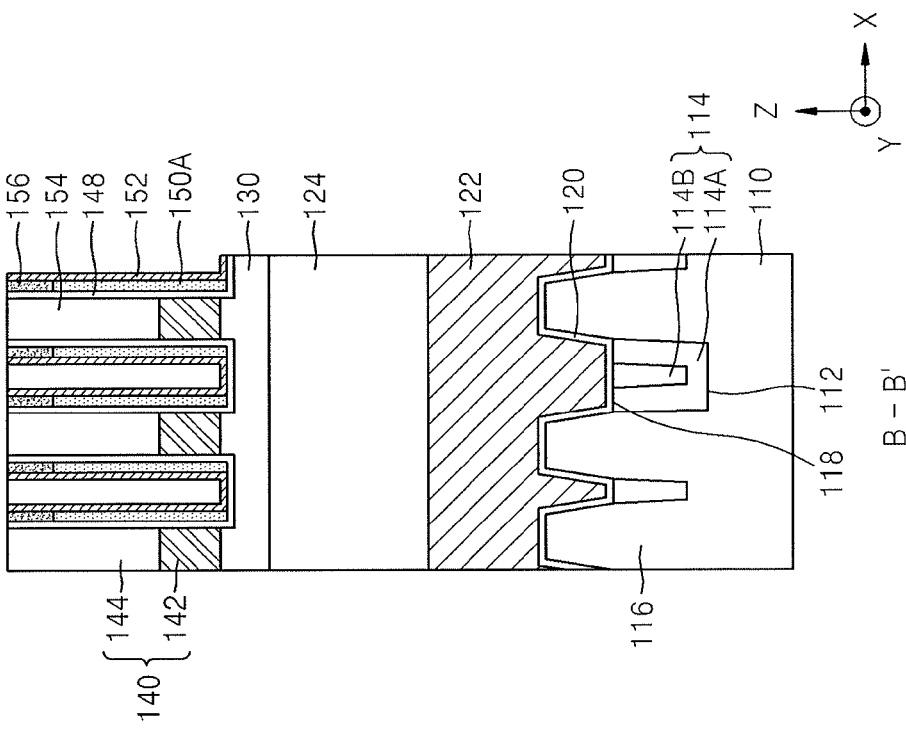
Figure 18B:
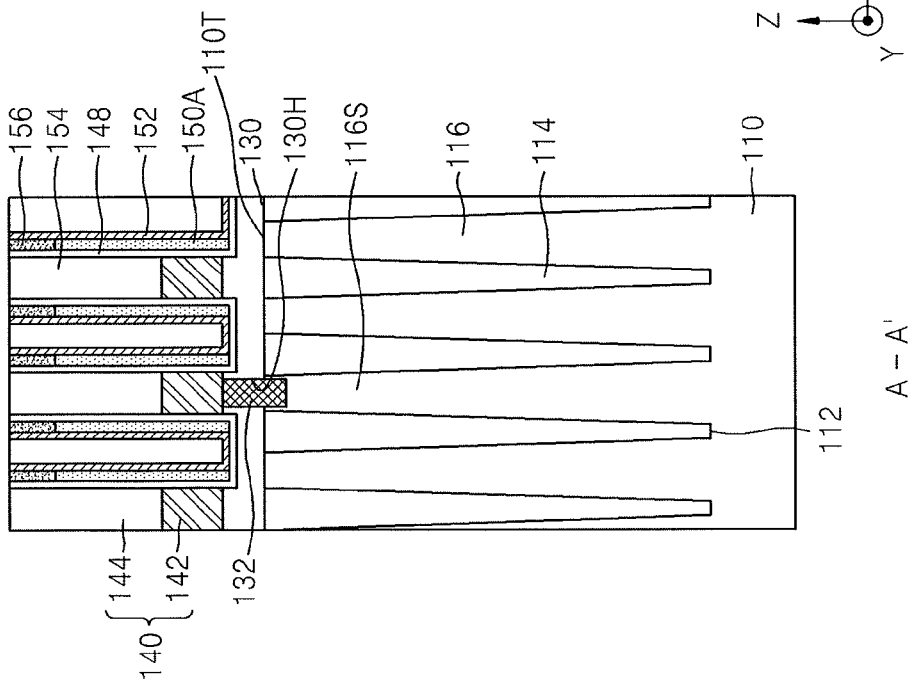

A cell array region of the semiconductor device 100B may have the layout of FIG. 3. FIGS. 17A, 18A, . . . , and 23A illustrate cross-sectional views of some elements corresponding to a cross-section taken along a line A-A' of FIG. 3. FIGS. 17B, 18B, . . . , and 23B illustrate cross-sectional views of some elements corresponding to a cross-section taken along a line B-B' of FIG. 3. The same reference numerals between FIGS. 17A through 23B and FIGS. 4A through 15E denote the same elements, and repeated detailed descriptions thereof may not be given for the sake of brevity.

Referring to FIGS. 17A and 17B, the plurality of bit line stacked structures 140 and the plurality of insulating spacers 148, 150, and 152 (covering both side walls of the plurality of bit line stacked structures 140) may be formed on the substrate 110 as described with reference to FIGS. 4A through 4E. However, in the present embodiment, the plurality of insulating spacers 148, 150, and 152 may include the insulating lines 148, the sacrifice layers 150, and the outer spacers 152 that are sequentially stacked. In an implementation, the outer spacers 152 may be omitted.

In an implementation, the insulating liners 148 may be formed of a silicon nitride, the sacrifice layers 150 may be formed of a silicon oxide, a silicon germanium (SiGe) compound, or a polymer, and the outer spacers 152 may be formed of an oxide, a nitride, or a silicon oxynitride.

Thereafter, insulating patterns 154 may be formed in the plurality of spaces 146 remaining between the plurality of bit line stacked structures 140 by using the method described with reference to FIGS. 5A through 5E.

Referring to FIGS. 18A and 18B, a plurality of sacrifice patterns 150A (having lower heights than those of the sacrifice layers 150) may be formed by etching a part of the sacrifice layers 150 (see FIGS. 17A and 17B) from top surfaces thereof by a predetermined depth. Top surfaces of the plurality of sacrifice patterns 150A may be disposed at higher levels than those of top surfaces of the plurality of bit lines 142. In an implementation, the top surfaces of the plurality of sacrifice patterns 150A may be disposed at the same levels as or lower levels than those of the top surfaces of the plurality of bit lines 142. To form the plurality of sacrifice patterns 150A, the sacrifice layers 150 may be dry or wet etched.

Thereafter, after a support material layer (not shown) is formed on a resultant including the plurality of sacrifice patterns 150A, a plurality of support layers 156 (covering the plurality of sacrifice patterns 150A) may be formed by removing a part of the support material layer through etching back or CMP until top surfaces of the insulating patterns 154 are exposed.

The plurality of support layers 156 may have line shapes extending along a length direction (Y direction) of the bit line stacked structures 140. In an implementation, the plurality of support layers 156 may be formed of insulating materials. For example, the plurality of support layers 156 may be formed of at least one material selected from SiN, SiCN, SiOC, SiON, SiOCN, TiO, TaO, TaTiO, TaSiO, and AlO$_x$.

Figure 19B:
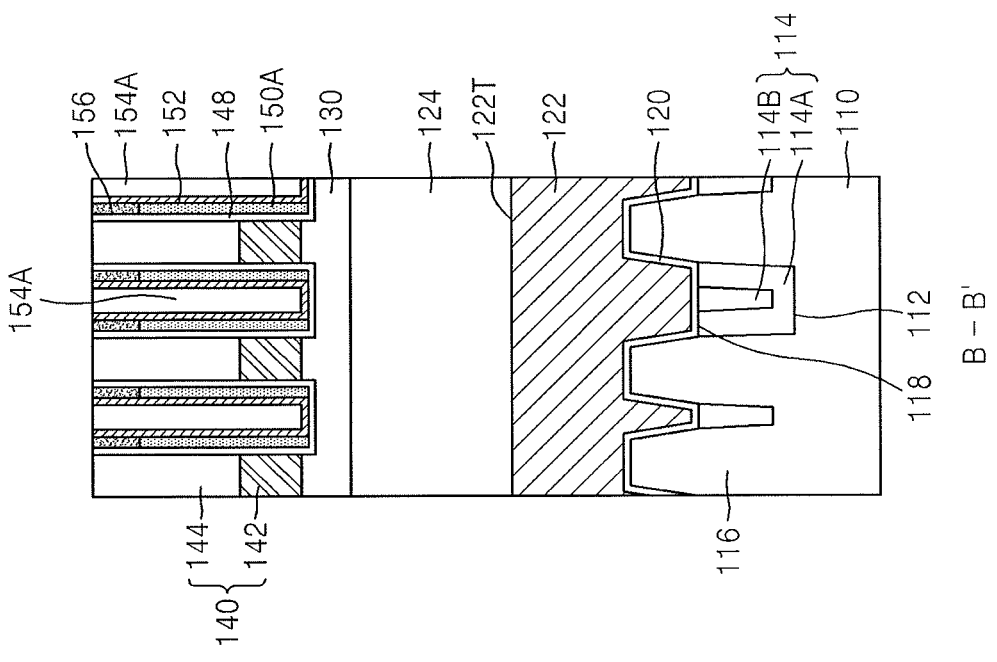
Figure 19A:
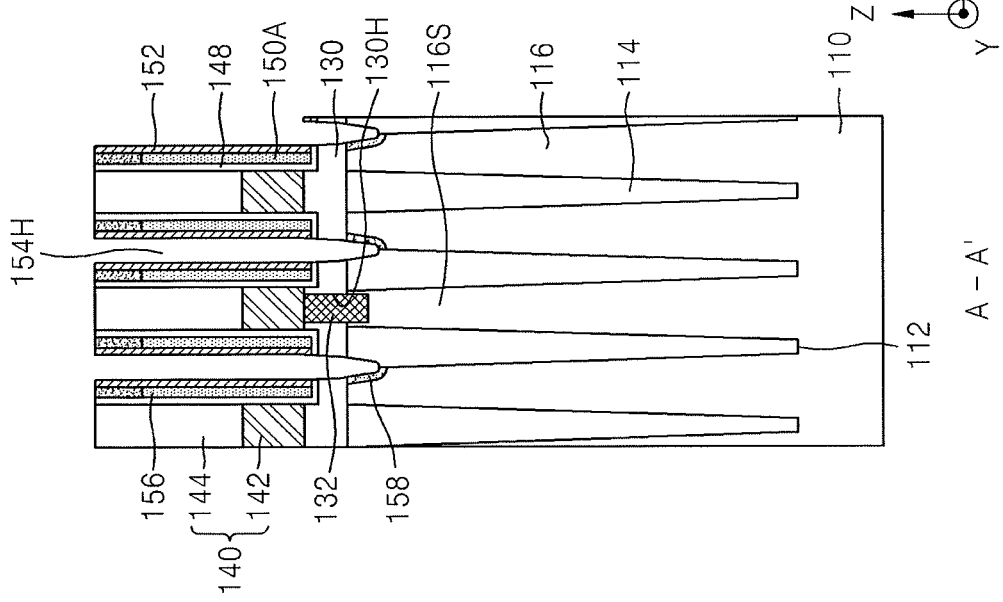

Referring to FIGS. 19A and 19B, a plurality of lower insulating patterns 154A limiting the plurality of contact holes 154H are formed by removing a part of the insulating patterns 154 by using the method described with reference to FIGS. 6A through 6E.

The insulating liners 148 and the outer spacers 152 (that are exposed through bottom surfaces of the plurality of contact holes 154H) may be sequentially etched from top portions thereof. The insulating patterns 130 exposed as a result of etching the insulating liners 148 and the outer spacers 152 and a part of the substrate 110 below the exposed insulating patterns 130 may be sequentially etched, and the substrate 110 may be exposed through the bottom surfaces of the plurality of contact holes 154H. The first metal silicide layers 158 may be formed on a surface of the substrate 110 exposed through the bottom surfaces of the plurality of contact holes 154H.

Referring to FIGS. 20A and 20B, after the contact forming conductive layer 160 (filling the plurality of contact holes 154H and covering the plurality of bit line stacked structures 140) is formed by using the method described with reference to FIGS. 7A through 7E, the plurality of buried contacts 160C may be formed by etching the contact forming conductive layer 160 by using the mask pattern 170 as an etching mask by using the method described with reference to FIGS. 8A through 8E.

The plurality of buried contacts 160C may include the contact plugs 160A (filling the plurality of contact holes 154H) and the preparatory landing pads 160B (integrally connected to the contact plugs 160A and extending from the contact plugs 160A onto the bit line stacked structures 140 so that the preparatory landing pads 160B vertically overlap with the bit lines 142).

While the contact forming conductive layer 160 is etched by using the mask pattern 170 as the etching mask, the insulating spaces 172 may be formed around the plurality of buried contacts 160C by removing a part of the plurality of insulating capping lines 144, a part of the insulating liners 148, a part of the support layers 150, and a part of the insulating capping lines 152 (which are neighboring or adjacent to the plurality of insulating capping lines 144) from around the plurality of buried contacts 160C. The part of the insulating capping lines 144, the part of the insulating liners 148, the part of the support layers 150, and the part of the insulating capping lines 152 may be exposed through the insulating spaces 172.

Referring to FIGS. 21A and 21B, a plurality of air spacers AS may be formed between the plurality of bit line stacked structures 140 and the plurality of contact plugs 160A by removing the plurality of sacrifice patterns 150A from portions of the plurality of sacrifice patterns 150A exposed through the insulating spaces 172.

The plurality of air spacers AS may be connected to the insulating spaces 172. A wet etching process or a dry etching process may be used to remove the plurality of sacrifice patterns 150A.

Figure 22B:
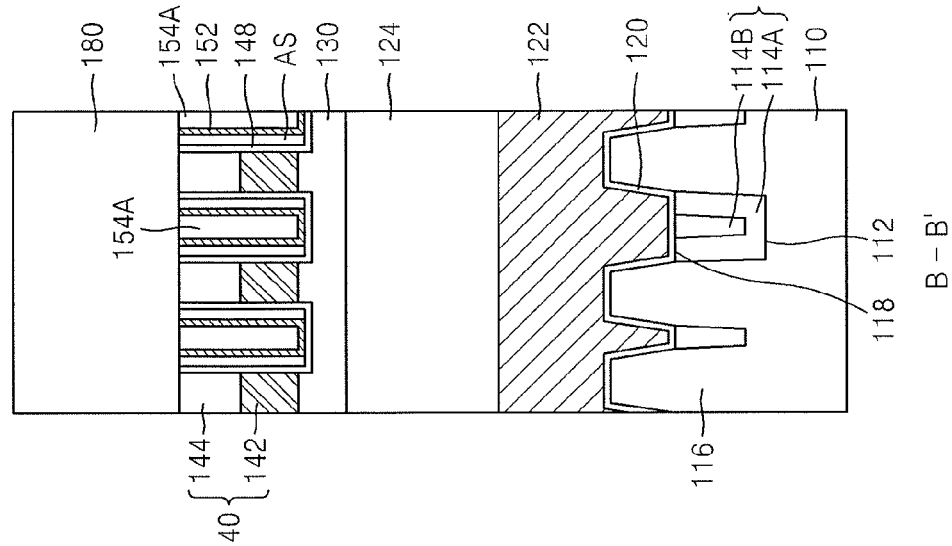
Figure 22A:
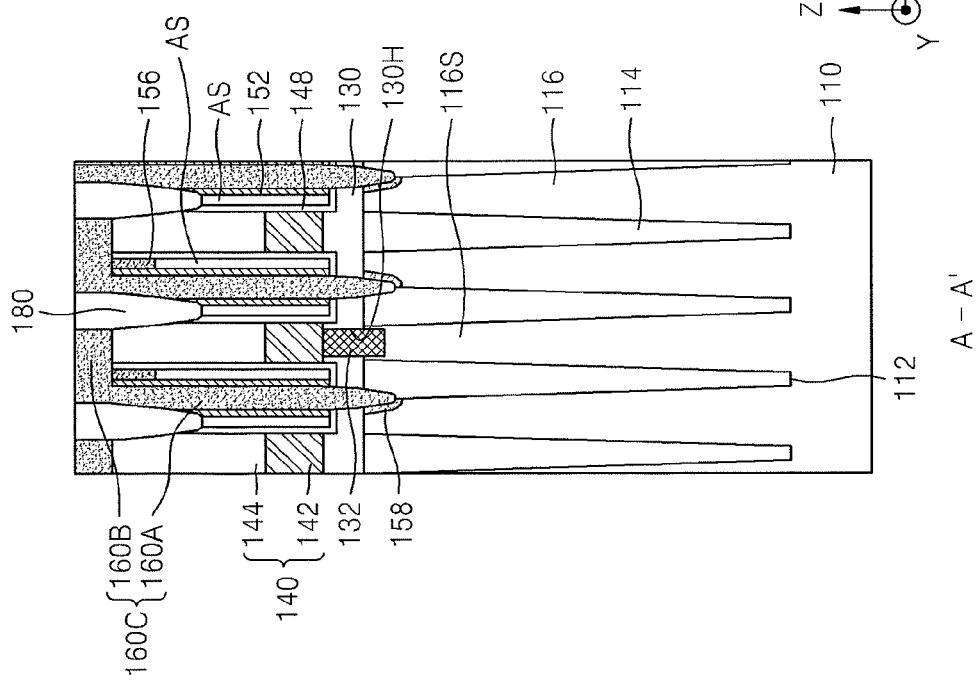

Referring to FIGS. 22A and 22B, after the mask pattern 170 is removed, the upper insulating patterns 180 (filling the insulating spaces 172 (see FIGS. 21A and 21B)) may be formed by using a method similar to the method described with reference to FIGS. 9A through 9E.

Insulating materials may be deposited in a part of the plurality of air spacers AS from the insulating spaces 172 while the upper insulating patterns 180 are formed. As a result, insulating liners (not shown) (formed of the same materials as those of the upper insulating patterns 180) may be formed in inner walls of the plurality of air spacers AS excluding a portion covered by the plurality of preparatory landing pads 160B. In an implementation, the insulating liners are not necessarily formed. For example, at least a part of the inner walls of the plurality of air spacers AS may not be covered by the insulating liners.

Figures 23A, 23B:
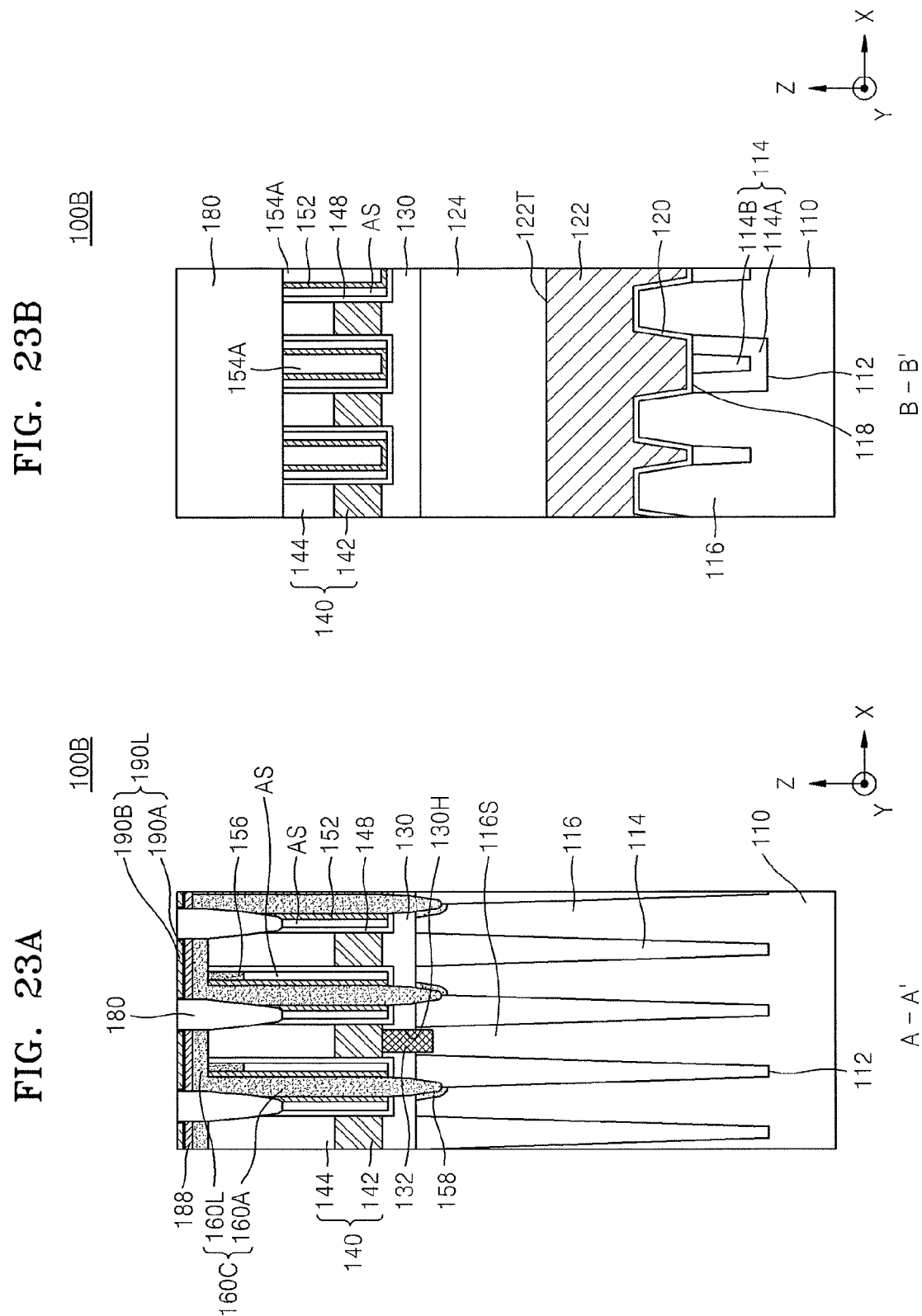

Referring to FIGS. 23A and 23B, a series of processes described with reference to FIGS. 10A through 16E may be performed to completely manufacture contact structures by forming the plurality of first landing pads 160L (integrally connected to the contact plugs 160A, filling the plurality of contact holes 154H and extending onto the bit line stacked structures 140 defined by the plurality of landing pad holes 180H in the upper insulating patterns 180 so that the plurality of first landing pads 160L may vertically overlap with the bit lines 142), by forming the second metal silicide layers 188 and the second landing pads 190L (that are sequentially formed on the first landing pads 160L in the plurality of landing pad holes 180H), and to form a plurality of capacitor lower electrodes (not shown) electrically connectable to the second landing pads 190L.

In the semiconductor device 100B according to the embodiments described with reference to FIGS. 17A through 23B, contact structures for electrically connecting the active regions 116 of the substrate 110 and the capacitor lower electrodes may include the contact plugs 160A (connected to the active regions 116), the first landing pads 160L (integrally connected to the contact plugs 160A and covering the bit line stacked structures 140 so that the first landing pads 160L may vertically overlap with the bit lines 142), and the second landing pads 190L (on the bit line stacked structures 140 and on the first landing pads 160L with the second metal silicide layers 188 therebetween). The capacitor lower electrodes may be connected to the second landing pads 190L. The first landing pads 160L and the second landing pads 190L may contact each other through the second metal silicide layers 188 that are not in relatively narrow spaces between the two neighboring bit lines stacked structures 140, but rather in upper portions of the plurality of bit line stacked structures 140, thereby advantageously increasing contact areas between the first landing pads 160L and the second landing pads 190L through the second metal silicide layers 188. Furthermore, the upper insulating patterns 180 (for providing sufficient insulating spaces between neighboring contact structures) may be provided, thereby helping to reduce the likelihood of and/or preventing the neighboring contact structures from being shorted.

In the semiconductor device 100B according to the embodiments described with reference to FIGS. 17A through 23B, the plurality of air spacers AS may be formed between the plurality of bit lines 142 and the plurality of contact plugs 160A. The plurality of air spacers AS may extend along the length direction of the plurality of bit lines stacked structures 140. The plurality of air spacers AS may be formed between the plurality of bit lines 142 and the plurality of contact plugs 160A in limited spaces of a highly scaled and integrated semiconductor device, in which relative permittivity between the plurality of bit lines 142 and the plurality of contact plugs 160A is reduced, thereby reducing capacitance between neighboring conductive lines.

Figure 24:
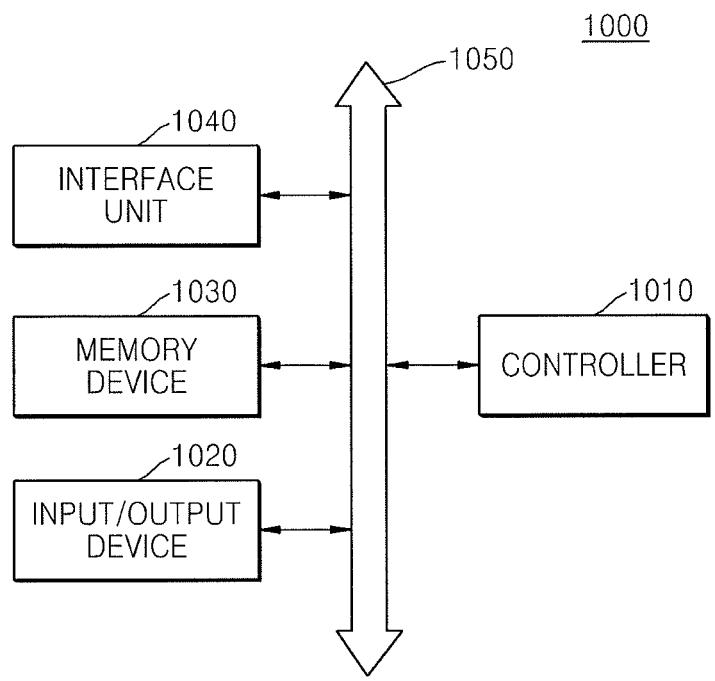
FIG. 24 illustrates a block diagram of a system including a semiconductor device, according to an embodiment.

FIG. 24 illustrates a block diagram illustrating a system 1000 including a semiconductor device, according to an embodiment.

The system 1000 may include a controller 1010, an input/output device 1020, a memory device 1030, and an interface unit 1040. The system 1000 may be a mobile system or a system that transmits or receives information. In an implementation, the mobile system may be a personal digital assistant (PDA), a portable computer, a web tablet, a wireless phone, a mobile phone, a digital music player, or a memory card. The controller 1010 for controlling an execution program of the system 1000 may be a microprocessor, a digital signal processor, a microcontroller, or a similar device. The input/output device 1020 may be used to input or output data of the system 1000. The system 1000 may be connected to an external device, e.g., a personal computer (PC) or a network, and may exchange data with the external device, by using the input/output device 1020. The input/output device 1020 may be, e.g., a keypad, a keyboard, or a display device.

The memory device 1030 may store codes and/or data for operating the controller 1010, or store data processed by the controller 1010. The memory device 1030 may include a semiconductor device including a FinFET according to an embodiment. For example, the memory device 1030 may include at least one of the semiconductor devices 10A, 10B, 50A, 50B, 100, 100A, and 100B of FIGS. 1A through 23B.

The interface unit 1040 may be a data transmission path between the system 1000 and an external device. The controller 1010, the input/output device 1020, the memory device 1630, and the interface unit 1040 may communicate with one another via a bus 1050. The system 1000 may be a mobile phone, an MP3 player, a navigation system, a portable multimedia player (PMP), a solid-state disk (SSD), or a household appliance.

Figure 25:
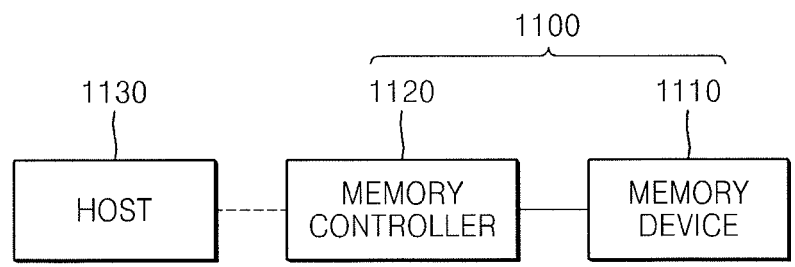
FIG. 25 illustrates a block diagram of a memory card including a semiconductor device, according to an embodiment.

FIG. 25 illustrates a block diagram illustrating a memory card 1100 including a semiconductor device, according to an embodiment.

The memory card 1100 may include a memory device 1110 and a memory controller 1120.

The memory device 1110 may store data. In an implementation, the memory device 1110 may have nonvolatile characteristics that may retain stored data even when power supply is cut off. The memory device 1110 may include a semiconductor device according to an embodiment. For example, the memory device 1110 may include at least one of the semiconductor devices 10A, 10B, 50A, 50B, 100, 100A, and 100B of FIGS. 1A through 23B.

The memory controller 1120 may read data from the memory device 1110 or write data to the memory device 1110 in response to a read/write request of a host 1130. The memory controller 1120 may include at least one of the semiconductor devices 10A, 10B, 50A, 50B, 100, 100A, and 100B of FIGS. 1A through 23B.

By way of summation and review, in highly scaled semiconductor devices, cross-sectional areas of a plurality of wiring lines and contact plugs disposed between the wiring lines may be reduced. Thus, when lower electrodes of a capacitor formed on the contact plugs having reduced cross-sectional areas are connected to active regions of a substrate through the contact plugs, contact areas may be limited, and there may be concerns regarding reducing contact resistance.

Buried contacts and metal pads may contact each other in narrow spaces between bit line stacked structures in connecting capacitor lower electrodes that are connected to active regions of a substrate. However, according to an embodiment, buried contacts and metal pads may contact each other in relatively broad spaces of upper portions of bit lines stacked structures, which provides relatively large contact areas, thereby minimizing contact resistance.

When capacitor lower electrodes are connected to active regions of a substrate through contact plugs having reduced cross-sectional areas, a semiconductor device according to an embodiment may include a conductive layer for forming buried contacts in spaces between a plurality of bit lines, may include a plurality of landing pads by patterning the conductive layer, may fill spaces between the plurality of landing pads with insulating layers, may recess the land pads, and may include metal pads in recessed spaces.

The embodiments may provide a semiconductor device including landing pads capable of minimizing contact resistance by providing a relatively large contact when a lower electrode of a capacitor is connected to an active region of a substrate through the contact plug in the semiconductor device having a miniaturized unit cell size due to integration.

The embodiments may provide a semiconductor device including landing pads for connecting an active region of a substrate and a lower electrode of a capacitor.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
   a substrate, the substrate including active regions;
   a pair of conductive lines spaced apart from the substrate such that an insulating layer is between the substrate and the pair of conductive lines;
   insulating spacers covering side walls of each of the pair of conductive lines such that contact holes having first widths in a first direction are defined between the pair of conductive lines;
   upper insulating patterns on the pair of conductive lines, the upper insulating patterns defining landing pad holes connected to the contact holes such that the landing pad holes have second widths in the first direction that are greater than the first widths;
   contact structures including:
      contact plugs connected to the active regions by passing through the insulating layer, and
      first landing pads connected to the contact plugs, the first landing pads being in the landing pads holes such that the first landing pads vertically overlap with one of the pair of conductive lines; and capacitor lower electrodes connected to the contact structures.

2. The semiconductor device as claimed in claim 1, wherein:
the contact plugs are integrally connected to the first landing pads, and
the contact plugs and the first landing pads are formed of a same material.

3. The semiconductor device as claimed in claim 2 wherein:
the contact plugs include a portion having a horizontal cross-sectional area having a first size,
the first landing pads include a portion having a horizontal cross-sectional area having a second size, and
the second size is greater than the first size.

4. The semiconductor device as claimed in claim 2, further comprising second landing pads between the first landing pads and the capacitor lower electrodes, the second landing pads filling a part of the landing pad holes on the first landing pads.

5. The semiconductor device as claimed in claim 4, wherein the first landing pads and the second landing pads include different materials.

6. The semiconductor device as claimed in claim 4, further comprising metal silicide layers between the first landing pads and the second landing pads.

7. The semiconductor device as claimed in claim 4, wherein:
the contact plugs include a portion having a horizontal cross-sectional area having a first size,
the second landing pads include a portion having a horizontal cross-sectional area having a third size, and
the third size is greater than the first size.

8. The semiconductor device as claimed in claim 2, further comprising insulating capping lines covering at least one of the pair of conductive lines,
wherein a perpendicular distance from a top surface of the substrate to top surfaces of the first landing pads is greater than a perpendicular distance from the top surface of the substrate to top surfaces of the insulating capping lines.

9. The semiconductor device as claimed in claim 1, wherein the insulating spacers include air spacers.

10. The semiconductor device as claimed in claim 1, further comprising:
second landing pads between the first landing pads and the capacitor lower electrodes; and
insulating capping lines covering at least one of the pair of conductive lines, wherein:
the first landing pads and the second landing pads include different materials, and
a perpendicular distance from a top surface of the substrate to top surfaces of the contact plugs is smaller than a perpendicular distance from the top surface of the substrate to top surfaces of the insulating capping lines.

11. The semiconductor device as claimed in claim 1, wherein:
the contact plugs extend into the substrate to a level lower than that of a top surface of the substrate, and
the contact plugs are connected to the active regions at the lower level.

12. The semiconductor device as claimed in claim 11, further comprising metal silicide layers between the contact plugs and the active regions.

13. A semiconductor device, comprising:
a substrate, the substrate including a cell array region and a peripheral circuit region, the cell array region including first active regions and the peripheral circuit region including second active regions;
bit line stacked structures, the bit line stacked structures including:
bit lines on the substrate in the cell array region, and
insulating capping lines covering top surfaces of the bit lines; and
contact structures, the contact structures including:
first contact plugs connected to the first active regions in the cell array region, the first contact plugs neighboring the bit lines with first insulating spacers between the first contact plugs and the bit lines,
first landing pads connected to the first contact plugs and covering the top surfaces of the bit lines with the insulating capping lines between the first landing pads and the bit lines such that the first landing pads vertically overlap with the bit lines, and
second landing pads on the first landing pads and formed of different materials from those of the first landing pads.

14. The semiconductor device as claimed in claim 13, further comprising:
a gate electrode on the substrate in the peripheral circuit region;
second contact plugs connected to the second active regions in the peripheral circuit region, the second contact plugs being adjacent to the gate electrode;
second insulating spacers between the second contact plugs and the gate electrode,
wherein the second contact plugs include a same material as the second landing pads.

15. The semiconductor device as claimed in claim 14, further comprising:
first metal silicide layers between the first landing pads and the second landing pads in the cell array region; and
second metal silicide layers between the second active regions and the second contact plugs in the peripheral circuit region,
wherein the first metal silicide layers include a same material as the second metal silicide layers.

16. A semiconductor device, comprising:
a substrate, the substrate including active regions;
an insulating layer on the substrate;
a pair of conductive lines on the insulating layer such that the insulating layer is between the substrate and the pair of conductive lines;
insulating spacers on side walls of each of the pair of conductive lines, the insulating spacers including contact holes therethrough, the contact holes being between the pair of conductive lines;
upper insulating patterns on the pair of conductive lines, the upper insulating patterns including landing pad holes therethrough, the landing pad holes being connected to the contact holes;
contact structures in the contact holes and in the landing pad holes, the contact structures including:
contact plugs connected to the active regions and passing through the insulating layer, the contact plugs including a portion having a horizontal cross-sectional area having a first size, and
first landing pads connected to the contact plugs, the first landing pads being in the landing pads holes, the first landing pads vertically overlapping with one of the pair of conductive lines, and the first landing pads including a portion having a horizontal cross-sectional area having a second size such that the second size is greater than the first size; and capacitor lower electrodes connected to the contact structures.

17. The semiconductor device as claimed in claim 16, further comprising second landing pads between the first landing pads and the capacitor lower electrodes, the second landing pads filling a part of the landing pad holes on the first landing pads.

18. The semiconductor device as claimed in claim 17, wherein the first landing pads and the second landing pads include different materials.

19. The semiconductor device as claimed in claim 17, wherein:
- the second landing pads include a portion having a horizontal cross-sectional area having a third size, and
- the third size is greater than the first size.

20. The semiconductor device as claimed in claim 16, further comprising insulating capping lines covering at least one of the pair of conductive lines,
- wherein a perpendicular distance from a top surface of the substrate to top surfaces of the first landing pads is greater than a perpendicular distance from the top surface of the substrate to top surfaces of the insulating capping lines.

* * * * *